United States Patent
Agrawal et al.

[11] Patent Number: 6,150,841
[45] Date of Patent: Nov. 21, 2000

[54] ENHANCED MACROCELL MODULE FOR HIGH DENSITY CPLD ARCHITECTURES

[75] Inventors: Om P. Agrawal, Los Altos, Calif.; Claudia A. Stanley; Xiaojie (Warren) He, both of Austin, Tex.; Chong M. Lee; Robert M. Balzli, Jr., both of Colorado Springs, Colo.; Larry R. Metzger; Kerry A. Ilgenstein, both of Austin, Tex.

[73] Assignee: Lattice Semiconductor Corporation, Hillsboro, Oreg.

[21] Appl. No.: 09/326,140

[22] Filed: Jun. 6, 1999

[51] Int. Cl.[7] .............................................. H03K 19/177
[52] U.S. Cl. ................................................ 326/41; 326/39
[58] Field of Search .................................. 326/37, 38, 39, 326/40, 41

[56] References Cited

U.S. PATENT DOCUMENTS

| | | | |
|---|---|---|---|
| 5,883,525 | 3/1999 | Tavana et al. | 326/39 |
| 5,894,565 | 4/1999 | Furtek et al. | 395/500 |
| 5,952,846 | 9/1999 | Silver | 326/41 |
| 5,966,027 | 10/1999 | Kapusta et al. | 326/39 |

OTHER PUBLICATIONS

Product information sheet: ispLSI 8000 Family Overview, Lattice Semiconductor Corporation, May 6, 1999, 4 pgs.

Product information sheet: ispLSI 5000V Family Overview, Lattice Semiconductor Corporation, Mar. 19, 1999, 3 pgs.

Product specification: 960 macrocell SRAM CPLD, Philips Semiconductors, Mar. 18, 1999, 2 pgs.

Product specification: 128 macrocell CPLD, Philips Semiconductors, Jul. 23, 1998, 1 pg.

*Primary Examiner*—David Nelms
*Assistant Examiner*—Gene N. Auduong
*Attorney, Agent, or Firm*—Fleisler, Dubb, Mayer & Lovejoy LLP

[57] ABSTRACT

An improved CPLD includes a plurality of macrocell modules (MM's) where each MM can receive a relatively large number of independent inputs (at least 80) and can generate at least 5 different product term signals (PT's) therefrom. All 5 PT's may be used for generating a local sum-of-products (SoP). Any of the 5 PT's may be stolen (steered-away) to instead provide a local control for its macrocell module. Each module includes a local SoS-producing gate that can produce a sums-of-sums signal (SoS) that represents a Boolean sum of one or more of the local SoP signal, of SoP signals of neighboring macrocell modules, and of SoS signals of neighboring macrocell modules. Simple allocation and super-allocation may be used to produce sums-of-sums signals of relatively large, one-pass function depth, such as 160PT's in one pass.

19 Claims, 10 Drawing Sheets

400
LEGEND

ENHANCED MACROCELL MODULE FOR HIGH DENSITY CPLD ARCHITECTURES

BACKGROUND

1. Field of Invention

The invention is generally directed to monolithic integrated circuits, and more specifically to a repeated macrocell module design for use within Programmable Logic Devices (PLD's). It is even more specifically directed to a macrocell module design as applied to a subclass of PLD's known as High-Density Complex Programmable Logic Devices (HCPLD's).

2a. Cross Reference to Related Applications

The following copending U.S. patent application is owned to the owner of the present application, and its disclosure is incorporated herein by reference:

(A) Ser. No. 09/326,940 filed Jun. 6, 1999 by Om P. Agrawal et al. and originally entitled, "SCALABLE ARCHITECTURE FOR HIGH DENSITY CPLD's HAVING TWO-LEVEL HIERARCHY OF ROUTING RESOURCES".

2b. Cross Reference to Related Patents

The disclosures of the following U.S. patents are incorporated herein by reference:

(A) U.S. Pat. No. 5,811,986 issued Sep. 22, 1998 to Om Agrawal et al, and entitled, FLEXIBLE SYNCHRONOUS/A SYNCHRONOUS CELL STRUCTURE FOR HIGH DENSITY PROGRAMMABLE LOGIC DEVICE;

(B) U.S. Pat. No. 5,764,078 issued Jun. 9, 1998 to Om Agrawal et al, and entitled, FAMILY OF MULTIPLE SEGMENTED PROGRAMMABLE LOGIC BLOCKS INTERCONNECTED BY A HIGH SPEED CENTRALIZED SWITCH MATRIX;

(C) U.S. Pat. No. 5,818,254 issued Oct. 6, 1998 to Om Agrawal et al, and entitled, MULTI-TIERED HIERARCHICAL HIGH SPEED SWITCH MATRIX STRUCTURE FOR VERY HIGH DENSITY COMPLEX PROGRAMMABLE LOGIC DEVICES;

(D) U.S. Pat. No. 5,789,939 issued Aug. 4, 1998 to Om Agrawal et al, and entitled, METHOD FOR PROVIDING A PLURALITY OF HIERARCHICAL SIGNAL PATHS IN A VERY HIGH DENSITY PROGRAMMABLE LOGIC DEVICE;

(E) U.S. Pat. No. 5,621,650 issued Apr. 15, 1997 to Om Agrawal et al, and entitled, PROGRAMMABLE LOGIC DEVICE WITH INTERNAL TIME-CONSTANT MULTIPLEXING OF SIGNALS FROM EXTERNAL INTERCONNECT BUSES; and (F) U.S. Pat. No. 5,185,706 issued Feb. 9, 1993 to Om Agrawal et al.

3. Description of Related Art

Field-Programmable Logic Devices (FPLD's) have continuously evolved to better serve the unique needs of different end-users. From the time of introduction of simple PLD's such as the Advanced Micro Devices 22V10™ Programmable Array Logic device (PAL), the art has branched out in several different directions.

One evolutionary branch of FPLD's has grown along a paradigm known as Field Programmable Gate Arrays or FPGA's. Examples of such devices include the XC2000™ and XC3000™ families of FPGA devices introduced by Xilinx, Inc. of San Jose, Calif. The architectures of these devices are exemplified in U.S. Pat. Nos. 4,642,487; 4,706,216; 4,713,557; and 4,758,985; each of which is originally assigned to Xilinx, Inc.

An FPGA may be generally characterized as a monolithic, integrated circuit that has an array of user-programmable, lookup tables (LUT's) that can each implement any Boolean function to the extent allowed by the address space of the LUT. User-programmable interconnect is typically provided for interconnecting primitive, LUT-implemented functions and for thereby defining more complex functions.

Because LUT-based function implementation tends to be functionally more exhaustive (broader) but speed-wise slower than gate-based (e.g., AND/OR-based) function implementation, FPGA's are generally recognized in the art as having a relatively more expansive capability of implementing a wide variety of functions (broad functionality) but at relatively slower speed. Also, because length of signal routings through the programmable interconnect of an FPGA can vary significantly, FPGA's are generally recognized as providing relatively inconsistent signal delays whose values can vary substantially depending on how partitioning, placement and routing software configures the FPGA.

A second evolutionary chain in the art has branched out along a paradigm known as Complex PLD's or CPLD's. This paradigm is characterized by devices such as the Vantis (subsidiary of Advanced Micro Devices Inc.) MACH™ family. Examples of CPLD circuitry are seen in U.S. Pat. No. 5,015,884 (issued May 14, 1991 to Om P. Agrawal et al.) and U.S. Pat. No. 5,151,623 (issued Sep. 29, 1992 to Om P. Agrawal et al.) as well as in other CPLD patents cited above, including U.S. Pat. No. 5,811,986 which will be specifically addressed herein.

A CPLD device can be characterized as a monolithic, integrated circuit (IC) that has four major features as follows.

(1) A user-accessible, configuration-defining memory means, such as EPROM, EEPROM, anti-fused, fused, SRAM, or other, is provided in the CPLD device so as to be at least once-programmable by device users for defining user-provided configuration instructions. Static Random Access Memory or SRAM is of course, a form of reprogrammable memory that can be differently programmed many times. Electrically Erasable and reprogrammable ROM or EEPROM is an example of nonvolatile reprogrammable memory. The configuration-defining memory of a CPLD device can be formed of a mixture of different kinds of memory elements if desired (e.g., SRAM and EEPROM). Typically it is of the nonvolatile, In-System reprogrammable (ISP) kind such as EEPROM.

(2) Input/Output means (IO's) are provided for interconnecting internal circuit components of the CPLD device with external circuitry. The IO's may have fixed configurations or they may include configurable features such as variable slew-output drivers whose characteristics may be fine tuned in accordance with user-provided configuration instructions stored in the configuration-defining memory means.

(3) Programmable Logic Blocks (PLB's) are provided for carrying out user-programmed logic functions as defined by user-provided configuration instructions stored in the configuration-defining memory means. Typically, each of the many PLB's of a CPLD has at least a Boolean sum-of-products generating circuit (e.g., and AND/OR array) or a Boolean product-of-sums generating circuit (e.g., and OR/AND array) that is user-configurable to define a desired Boolean function, —to the extent allowed by the number of product terms (PT's) or sum terms (ST's) that are combinable by that circuit.

Each PLB may have other resources such as input signal pre-processing resources and output signal post-processing resources. The output signal post-processing resources may include result storing and/or timing adjustment resources such as clock-synchronized registers. Although the term 'PLB' was adopted by early pioneers of CPLD technology, it is not uncommon to see other names being given to the repeated portion of the CPLD that carries out user-programmed logic functions and timing adjustments to the resultant function signals.

(4) An interconnect network is generally provided for carrying signal traffic within the CPLD between various PLB's and/or between various IO's and/or between various IO's and PLB's. At least part of the interconnect network is typically configurable so as to allow for programmably-defined routing of signals between various PLB's and/or IO's in accordance with user-defined routing instructions stored in the configuration-defining memory means.

In contrast to LUT-based FPGA's, gate-based CPLD's are generally recognized in the art as having a relatively less-expansive capability of implementing a wide variety of functions, in other words, not being able to implement all Boolean functions for a given input space, but being able to do so at relatively higher speeds. Wide functionality is sacrificed to obtain shorter, pin-to-pin signal delays. Also, because length of signal routings through the programmable interconnect of a CPLD is often arranged so it will not vary significantly despite different signal routings, CPLD's are generally recognized as being able to provide relatively consistent signal delays whose values do not vary substantially based on how partitioning, placement and routing software configures the CPLD. Many devices in the Vantis MACH™ family provide such a consistent signal delay characteristic under the Vantis trade name of SpeedLocking™. The more generic term, Speed-Consistency will be used interchangeably herein with the term, SpeedLocking™.

A newly evolving sub-branch of the growing families of CPLD devices is known as High-Density Complex Programmable Logic Devices (HCPLD's). This sub-branch may be generally characterized as monolithic IC's that have large numbers of I/O terminals (e.g., Input/Output pins) in the range of about 64 or more (e.g., 96, 128, 192, 256, 320, etc.) and/or have large numbers of result-storing macrocells in the range of about 256 or more (e.g., 320, 512, 1024, etc.). The process of concentrating large numbers of I/O pins and/or large numbers of macrocells into a single CPLD device raises new challenges for achieving relatively broad functionality, high speed, and Speed-Consistency (SpeedLocking™) in the face of wide varieties of configuration software.

A more detailed discussion is provided in the above-cited and copending U.S. application Ser. No. 09/xxx,xxx [Attorney Docket No. VANT 1021] concerning the various operations performed by CPLD configuring software. As such they will not be repeated here except to briefly note the following.

Configuration software can produce different results, good or bad, depending in part on what broadness of functionalities, what routing flexibilities and what timing flexibilities are provided by the architecture of a target CPLD. The present disclosure focuses on the broadness of functionalities and timing flexibilities that are provided by repeated structures referred to herein as macrocell modules.

When confronted with a given design problem, CPLD-configuring software typically cycles through a series of phases, referred to commonly as 'partitioning', 'placement', and 'routing'. Differently designed CPLD's can have differently designed PLB's with respectively different, logic-implementing capabilities, and/or timing capabilities. Partitioning software has to account for the maximum size and speed of circuitry that each PLB is able to implement within the specific CPLD device that has been designated to implement the original and whole circuit design.

By way of example, each PLB of a given, first CPLD architecture may be able to generate in one pass (where the one pass does not include the use of a feedback loop) a sum-of-products (SoP) function signal of the expressive form:

$$f_{SoP}=\Sigma^N(PT_i^{Ki/Kmax/L}) \qquad \{\text{Exp. A}\}.$$

In this sum-of-products expression (Exp. A), the N factor represents a maximum number of product terms (PT's) that can be generated and thereafter summed by a respective PLB for defining the one sum-of-products function signal, $f_{SoP}$. The Kmax factor represents in the same Exp. A, a maximum number of independent, PLB input signals that can be acquired from a set of L available lines. Ki is the number of actual signals that are used as a subset of Kmax for defining a corresponding, i-th product term, PTi. The acquired subset of Ki signals are ANDed together in the respective PLB to define each respective, i-th product term (PTi). If Ki=0, then PTi=0 and that PTi does not contribute to the Boolean sum.

For a more concrete example, consider a PLB of a given first CPLD architecture where each sum-of-products can have a maximum of 3 PT's, with each PT being a product of no more than 16 input terms, where the input terms are sampled from 64 nearby lines. Such a PLB may therefore be able to generate in one pass, a first SoP function of the expressive form:

$$f_{SoP1}=\Sigma^3(PT_i^{Ki/16\text{—}max/fm\text{—}64\text{—}Lines}) \qquad \{\text{Exp. A1}\}$$

Consider also, for purposes of contrast, a PLB of a given second, and differently designed, CPLD architecture where each sum-of-products can have a maximum of 5 PT's, with each PT being a product of no more than 33 input terms, where the input terms are sampled from 174 nearby lines. Such a PLB may therefore be able to generate in one pass, a second SoP function of the expressive form:

$$f_{SoP2}=\Sigma^5(PT_i^{Ki/33\text{—}max/fm\text{—}174\text{—}Lines}) \qquad \{\text{Exp. A2}\}.$$

In other words, due to architectural constraints, it is possible that the one-pass, sum-of-products result ($f_{SoP1}=PT_1+PT_2+PT_3$, see Exp. A1) of a PLB in the first CPLD architecture can be no more complex than a sum of three independent product terms (3 PT's), where each such PTi is no more complex than a product of no more than sixteen (16) independent, PLB term input signals that are sampled out of an available and larger set of sixty-four (64) independent signals.

In contrast, and again due to architectural variations, the one-pass, sum-of-products result ($f_{SoP2}=PT_1+PT_2+PT_3+PT_4+PT_5$, see Exp. A2) of a PLB in the second CPLD architecture can be as complex as a sum of five independent product terms (5 PT's) where each such PTi is as complex as a product of up to 33 independent, PLB term input signals that are sampled by multiplexing from an available and nearby set of 174 independent signals. A yet more concrete example of a CPLD architecture that can be viewed as conforming with Exp. A2 may be found in FIGS. 2A–2B of the above-cited U.S. Pat. No. 5,811,986.

CPLD architectural factors such as the above N, Kmax and L factors can play significance roles in device performance and are matters of delicate design balance. On the one hand, by choosing to use larger absolute values for N, Kmuax and L, a CPLD designer can advantageously provide greater flexibility to the number of options that CPLD configuring software will have as it performs partitioning, placement and routing. On the other hand, if the CPLD designer arbitrarily chooses to increase the values of N, Kmax and L too much, the designer may find that such modifications have led to excessive electrical capacitance or resistance on routing lines and excessive signal processing delays.

One reason why, is because Kmax times L defines a number of crosspoints that will be created for each PLB when the Kmax number of lines of each PLB cross with the L number of adjacent, signal broadcasting lines. The reciprocal of Kmax/L indicates the minimum number of PLB's that will be needed to fully sample all L of the adjacent signals. (L/Kmax times Kmax equals L.) Typically, the CPLD designer will want the CPLD to be able to process all L signals simultaneously (in parallel) so the designer will provide at least a L/Kmax number of PLB's. The same reciprocal ratio, L/Kmax also gives a rough indication of the extent to which the L signal broadcasting lines of the CPLD architecture will be loaded by PIP's (programmable interconnect points). The exact value of loading will depend on the extent to which each set of L times Kmax crosspoints is fully or partially-populated by PIP's.

U.S. Pat. No. 5,811,986 issued Sep. 22, 1998 suggests that the number of input lines per PLB (Kmax) should be kept relatively small (e.g., about 32 input lines per PLB) and that a centralized switch matrix should be employed. This approach has benefits and drawbacks. On one hand, routing decisions for CPLD configuring software are simplified. On the other hand, the complexity of functions which can be generated in each PLB in one pass is limited.

In order to fit partitioning results inside the maximal $f_{SoP}$ capabilities of each PLB, the partitioning part of CPLD configuring software has to cast its primitive sums-of-products such that they are each equal to or less than the N-defined and Kmax-defined limits of the $f_{SoP}$ results that can be produced by respective PLB's of the targeted CPLD. If the architecture of the targeted CPLD is such that each of the above-described factors, N, Kmax and L (Exp. A) is relatively large, then the maximal $f_{SoP}$ results per PLB will tend to be relatively large and the design partitioning phase will be advantageously allowed to work with larger-sized, partition chunks. However silicon resources may be wasted if the to-be-partitioned, original design calls only for small chunks.

In FIG. 9B of the above-cited U.S. Pat. No. 5,811,986, provisions are made for steering some unused product terms, on a per macrocell basis, away from some but not all inputs of the OR gate that initially generates a sum-of-products result, and towards macrocell control terminals. The latter macrocell control terminals couple to an XOR gate, to a clock selector and to the selection control of an asynchronous control selector. A certain number of configuration memory bits are consumed for providing such selective steering-away of product terms (PT's). Such consumption can reduce the effective function depth (e.g., 5 PT's each of up-to 32 input signals) of each PLB and reduce the number of partitioning, placement, and routing options that CPLD configuring software has.

If all goes well in its partitioning, placement, and routing phases, the CPLD configuring software finds a workable 'solution' comprised of a specific partitioning of the original circuit into placeable chunks, a specific set of primitive placements of the chunks into specific PLB's, and a specific set of interconnect usage decisions (routings). The software can then deem its mission to be complete and it can use the placement and routing results to generate the configuring code that will be used to correspondingly configure the designated CPLD.

In various instances, the CPLD configuring software may find that it cannot complete its mission successfully on a first try. It may find, for example that the initially-chosen placement strategy prevents the routing phase from completing successfully. This might occur because signal routing resources have been exhausted in one or more congested parts of the designated CPLD device. Some necessary interconnections may have not been completed through those congested parts. Alternatively, all necessary interconnections may have been completed, but the CPLD configuring software may find that simulation-predicted performance of the resulting circuit (the so-configured CPLD) is below an acceptable threshold. For example, signal propagation time may be too large in a speed-critical part of the CPLD-implemented circuit or a given function may use too many passes through feedback paths to generate its result.

In either case, if the initial partitioning, placement and routing phases do not provide an acceptable solution, the CPLD configuring software will try to modify its initial place and route choices so as to remedy the problem. Typically, the software will make iterative modifications to its initial choices until at least a functional place-and-route strategy is found (one where all necessary connections are completed), and more preferably until a place-and-route strategy is found that brings performance of the CPLD-implemented circuit to a near-optimum point. The latter step is at times referred to as 'optimization'. Modifications attempted by the software may include re-partitionings of the original circuit design as well as repeated iterations of the place and route phases.

CPLD device users usually do not want to deal with specifics of place-and-route problems. Instead, they simply want to see a fast turnaround time of no more than, say an hour, between the time they complete their original circuit design and the time a first-run CPLD is available to implement and physically test that design.

Beyond merely wanting to implement a specific set of Boolean functions within a given CPLD IC, users of CPLD's also usually insist that the circuit implemented by the CPLD perform according to specified timing requirements. Speed is often as important an attribute as full Boolean correctness and completeness. That is why the user chose to use a CPLD instead of an FPGA.

Aside from speed and full function implementation, users of CPLD's also usually want a certain degree of re-design agility (flexibility). Even after an initial design is successfully implemented by a CPLD, users may wish to make slight tweaks or other changes to their original design. The re-design agility of a given CPLD architecture may include the ability to re-design certain internal circuits without changing I/O timings. Re-design agility may also include the ability to re-design certain internal circuits without changing the placement of various I/O terminals (e.g., pins). Such re-design agilities are sometimes referred to respectively as re-design Speed-Locking™ and Pin-Retention (the former term is a trademark of Vantis Corp., headquartered in Sunnyvale, Calif.). The more generic terms of: 're-design Speed-Consistency' and 're-design PinOut-Consistency' will be respectively used herein interchangeably with 're-design Speed-Locking™' and 're-design Pin-Retention'.

In addition to speed, re-design agility, and full Boolean correctness, users of CPLD's typically ask for optimal emulation of an original design or a re-design in terms of good function packing density, low cost, low power usage, and so forth.

Some previous CPLD architectures meshed well with specific bus sizes of specific design problems. However, preferences tend to change over time. Industry standards may, at first, favor designs where address and data words have a size in the range of 8 to 16 bits. Industry standards may later migrate towards larger-sized organizations of signals such as address and data words having sizes in the range of 32 to 64 bits each.

A CPLD that has an architecture optimized for bus-oriented word sizes of 8 to 16 bits may not be able to efficiently accommodate designs where word sizes increase into a range of say, 32 to 64 bits. What is needed is an architecture that can efficiently accommodate dense design problems having word sizes in the range of 32 to 64 bits or more without losing speed and re-design agility. At the same time, if word sizes drop to a lower range for some supplied design problems, and workable solutions can be arrived at with use of relatively simpler circuit chunks, the flexible CPLD architecture should be able to make efficient use of resources that might otherwise go unused because of the drop to the smaller word sizes and/or to simpler partition chunks.

SUMMARY OF THE INVENTION

An improved, scalable CPLD device in accordance with the invention includes a plurality of flexible storage macrocell modules each having at least 5 product term inputs (PTi's) whose signals can be steered-away for use as per-macrocell controls if not used for generating a local sum-of-products signal (SoP). Each product term signal (PT's) can be a one-pass Boolean product of as many as 80 independent input terms. With use of simple allocation or a more complex, re-allocation of post-allocation signals (super-allocation), large sums of such large PT's may be produced in each macrocell.

Each macrocell module of one embodiment comprises:

(a) at least five product term generators (A0–A4) for producing respective and local product term signals (PT0–PT4) each representing up to 80 independent input terms or more; (b) an SoP-producing gate that can produce a Boolean sum-of-products of one or more of the respective and local product term signals (PT0–PT4);

(c) at least five PT steerers that may be programmably configured to either direct to the local SoP-producing gate or steer-away a respective one of the local product term signals (PT0–PT4); (d) an SoS-producing gate that can produce a sums-of-sums signal (SoS) that represents a Boolean sum of one or more of the local SoP signals, and/or of SoP signals of neighboring macrocell modules, and/or of SoS signals of neighboring macrocell modules;

(e) a post-SoP steerer that may be programmably configured to direct to the local SoS-producing gate or to steer-away to SoS-producing gates of neighboring macrocell modules, the local SoP signal; (f) a first XOR gate having an output coupled to an IN terminal of a local storage and/or combinatorial-pass-through element;

(g) a post-SoS steerer that may be programmably configured to direct to a first input of the first XOR gate or to steer-away to SoS-producing gates of neighboring macrocell modules, the local SoS signal; and (h) an XOR-feeding multiplexer that may be programmably configured to direct to a second input of the first XOR gate, at least an adjustable local polarity signal (LP'), where the LP' signal may be programmably defined as a constant logic '0' or as a constant logic '1'.

Each macrocell module of the one embodiment may further comprise: (i) a second XOR gate having an output that defines the LP' signal, a first input for receiving a steered-away product term signal (PT0) and a second input for receiving a configuration memory signal; (j) a clock-selecting multiplexer having an output that defines a clock (or latch enable) input signal for the local storage/pass-through element and a plurality of inputs including ones for respectively receiving a global clock signal (G_CLK), a logic-block wide clock signal (SLB_CLK), and a macrocell local clock signal, where the local clock signal may be defined by a steered-away one (PT2) of the local product terms; (k) a local SET/RST swapping unit that can be programmably configured to swap respective SET and RST signals supplied to local set and reset terminals of the storage/pass-through element; and (1) an asynchronous-controls supplying circuit for supplying asynchronous-control signals to at least one of the swapping unit and storage/pass-through element, where the asynchronous-control signals are selectable form a set including a default constant, a global reset signal (G_RST), a logic-block wide reset signal (SLB_RST), a logic-block wide set signal (SLB_SET), and macrocell local set and reset signals (PT4, PT3).

The macrocell modules of the summarized embodiment may be programmably configured to service designs which benefit from a relatively-high degree of function depth (e.g., 60PT's to 160PT's per macrocell output with up to 80 independent input terms per PT) and/or designs which benefit from a relatively-high degree of local control of register operations (e.g., local clock, local clock-enable, local set, local reset) and/or designs which benefit from a relatively-high degree of global or block-wide control of register operations (e.g., global/block clock, global/block set, global/block reset).

Plural ones of the macrocell modules of the summarized embodiment can output signals to or input signals from each given, I/O pad by way of a respective slew-controlled tristate pad driver and a pad input buffer. The output enable for each tristate pad driver is controllable by a block-wide OE signal whose polarity is controllable on a per-pad basis. The slew rate of the tristate pad driver is also controllable on a per-pad basis. Macrocell output results (MFB signals) may be routed to a desired one of plural I/O pads by using an Output Switch Matrix (OSM) and the routing may be controlled on a per-pad basis. External input signals may be routed from an associated pad of a given macrocell module and through the first XOR gate for passage through and/or storage in the storage/pass-through element of the respective macrocell module.

An efficient macrocell structure is thereby provided for implementing high density CPLD's that can process more finely-granulated implementations such as for 32 or 16-bit wide designs with need for dense amounts of local control. At the same time, the macrocell structure is also efficient for processing more coarsely-granulated implementations such as for 64-bit wide designs with up to 25% simultaneous control overhead.

Other aspects of the invention will become apparent from the below detailed description.

BRIEF DESCRIPTION OF THE DRAWINGS

The below detailed description makes reference to the accompanying drawings, in which.

DETAILED DESCRIPTION

Figure 1:
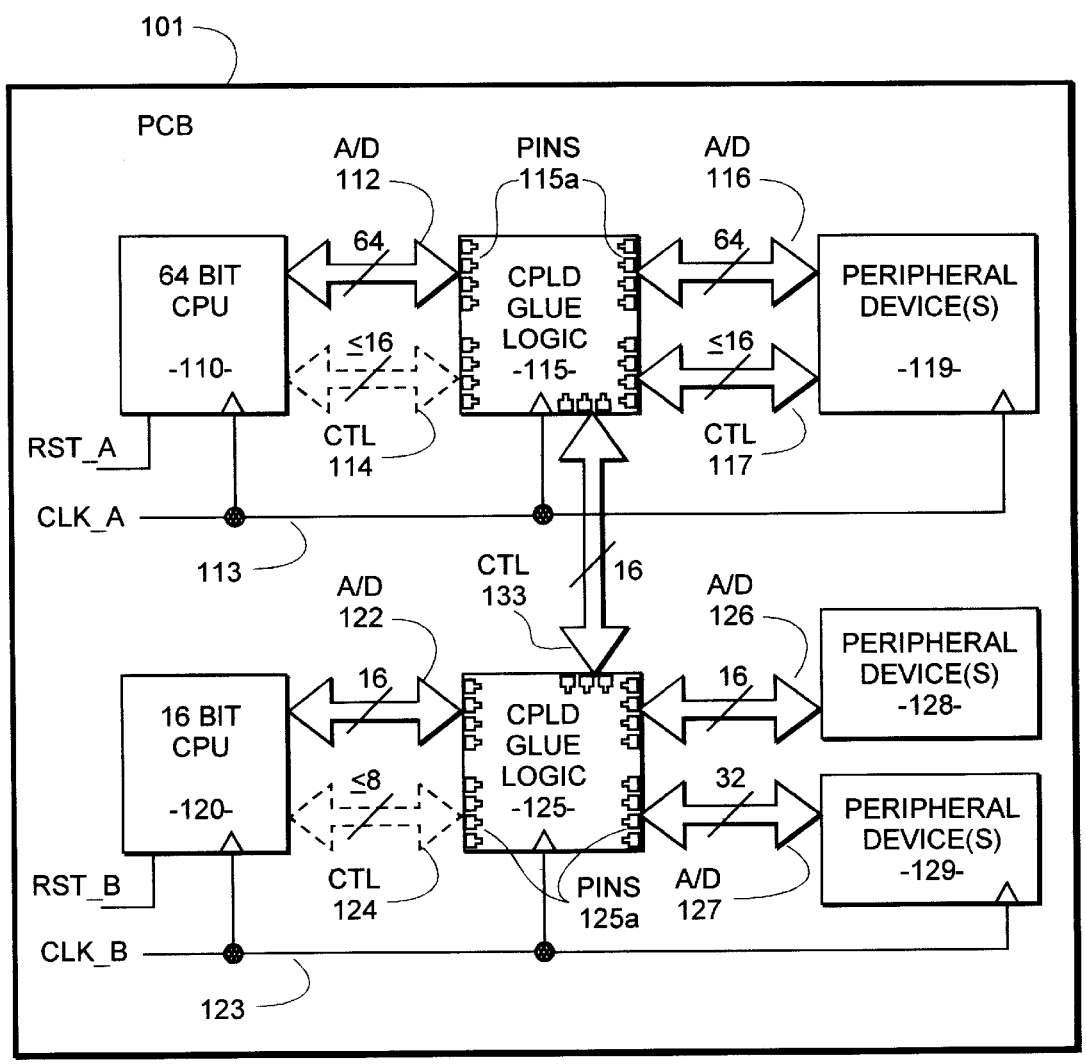
FIG. 1 is a block diagram of a system that may call for CPLD glue logic with capabilities to efficiently handle differing word sizes.

FIG. 1 shows, for purpose of example, a possible system 100 that uses plural CPLD's such as 115 and 125 for 'glue logic'. CPLD 115 is a first integrated circuit having a respective plurality of I/O pins 115a (external terminals) that are coupled by PCB traces to other circuits provided on a printed circuit board (PCB) 101 of the system 100. CPLD 115 is interposed between a first central processor unit (CPU) 110 and one or more, on-board or off-board peripheral devices 119 associated with that first CPU 110.

CPLD 125 is similarly a second integrated circuit having a respective plurality of I/O pins 125a that are coupled by PCB traces to other circuits provided on the same printed circuit board 101. CPLD 125 is mounted to PCB 101 so as to provide interfacing between a second CPU 120 and its respective, on-board or off-board peripheral devices 128, 129.

In the illustrative case of system 100, CPU 110 is a 64-bit microprocessor that has a 64-bit wide, and time-multiplexed, address/data bus 112 (A/D bus 112). CPU 110 further has a clock input line 113 for receiving a respective first clock signal, CLK_A.

Additional control signals (CTL) may be provided on a separate control bus 114. Bidirectional bus 114 depicted by a dashed, double-arrow symbol to indicate that it may either be physically there in full or it may instead be partly or wholly a phantom bus whose CTL signals are instead included as time-multiplexed signals that are passed along the, 64-lines wide, A/D bus 112.

If CTL bus 114 is real rather than phantom, then a corresponding number of the I/O pins 115a of IC 115 will be consumed for servicing that real bus. If CTL bus 114 is instead phantom, then the same I/O pins 115a that service A/D bus 112 can also service the control signals of bus 114 on a time-multiplexed basis. Of course, for the latter case, additional signal-processing resources within the CPLD 115 may have to be consumed to support the time-multiplexed routing of the A/D and CTL signal transmissions through a shared set of I/O pins 115a. Also for the latter case, the speed at which CPLD 115 can process the A/D signals (112) may be disadvantageously reduced because time slices are being donated (stolen) to support the transmitting of the CTL signals (114).

Empirical observations have shown that the number of parallel lines that will generally be needed for carrying the CTL signals 114 associated with address and/or data signals of the 64 parallel lines in A/D bus 112, is typically about 8 or slightly more. In other words, the number of further-and-control carrying, parallel lines in the real or phantom CTL bus 114 tends to be on the order of about 12.5% or a slightly larger fraction of the number of parallel lines in associated A/D bus 112. In can be less as well. In some instances, the number of further-and-control carrying, parallel lines in the real or phantom CTL bus 114 can be as large as 25% of the number of parallel lines in the A/D bus 112.

Examples of signals that might be deemed as parallel and overhead CTL signals include: error correction bits, frame identifying bits, and handshake protocol bits. More specifically, if simple parity check is used, then there will usually be one parity bit for every 8 bits of a data word. Thus a 64-bit wide address and/or data word might call for at least 8 additional CTL overhead bits just for providing a simple error detection function. More bits may be used if more complex, error catching and correction (ECC) functions are to be provided.

If A/D bus 112 is used on a time-multiplexed basis, then one or more additional ones of the CTL overhead bits 114 may serve as frame identifying bits for identifying what phase and/or process is having its data being transmitted at the moment over bus 112. For example, a first time slice may be dedicated for a CPU address-outputting phase for a process involving a first of plural peripheral devices (119) while a second time slice may be dedicated for a peripheral data-inputting phase for a process involving a second peripheral device.

One or more additional ones of the CTL overhead bits 114 may serve as handshake protocol bits whereby peripheral devices (119) acknowledge error-free receipt of instructions or data and/or they report what state they are next going into (e.g., bus master or slave).

The CTL overhead bits (114) described above are merely examples. There is a wide range of possibilities for different kinds of industry standard buses (e.g., SCSI, PCI, etc.) and for nonstandard bus designs. Even when one considers a simple 8:1 parity check with one additional bit for flagging data versus address, and one further additional bit for handshaking, it is seen that 10 bits (about 16% of 64) have already been consumed on the CTL bus 114 for supporting a 64-bit wide A/D transmission on bus 112. If both an A/D bus transmission and a control overhead transmission are to occur in parallel so that the CPLD glue logic 115 can process both simultaneously rather than in separate time slots, then the CPLD glue logic 115 needs to have a sufficient number of external package pins and internal resources to handle such, relatively-wide, parallel transmissions.

Empirical observations have further shown that the complexity of control functions tends to increase as the amount of control overhead increases in a supplied design problem. More specifically, consider a simple decision function as set forth in the expressive form:

$$f_{error} = \Sigma^8 XOR\{Parity\_Bit_i, Parity\_Calculated_i\} \quad \{Exp. A3\}.$$

In Exp. A3, eight observed parity bits (Parity_Bit$_i$) are being compared with expected values (Parity_Calculated$_i$)

to determine if a parity error has occurred. The error flag, $f_{error}$ goes high if the Boolean sum of these XOR operations does not remain at zero. As the number of parity bits increases, so too does the complexity of the error function and vice versa. A 16-bit wide design problem may have only two parity bits while a 64-bit wide design problem may have eight parity bits that need to be tested. The 64-bit wide design problem calls for a higher level of control complexity than does the 16-bit wide design problem. There is therefore a need for a CPLD architecture that can efficiently generate Boolean function signals of relatively high complexity.

Typically, the CTL overhead bits (114) will include at least a global RESET signal for flagging a global resetting, to a predefined state, of the CPU 110 and its associated circuits 115 and 119. Thus, one yet further overhead control signal that may need to be carried by the actual or phantom CTL bus 114 is such a RESET signal. In the illustrated example, the RESET signal for CPU 110, CPLD 115, and peripheral device(s) 119 is initiated by actuating a RST_A line that is coupled to the CPU 110. It then propagates through CTL buses (e.g., 114 and 117 where the latter is described shortly) to reach the other devices. Beyond the global RESET function, there may be need for more-localized reset or set functions.

Typically, when the first A/D bus 112 that couples CPU 110 to CPLD 115 is 64-bits wide, there will be a corresponding 64-bit wide and second A/D bus 116 provided between the CPLD glue logic 115 and its one or more, associated peripheral devices 119. It is possible, on the other hand, that the address/data interface between the CPLD glue logic 115 and peripheral devices 119 may have a word size smaller than 64 bits, for example, such as 32 bits or 16 bits.

Also as shown, there will typically be a real or phantom, second control bus 117 between the CPLD glue logic 115 and peripheral devices 119. The number of parallel control signals carried by this phantom or real control bus 117 will usually be about the same as that carried by the first CTL bus 114, although it may be different.

The total number of the I/O pins 115a of IC 115 that are consumed for servicing A/D buses such as 112, 116 and CTL overhead buses such as 114, 117 will vary depending on how wide each and all of buses are, and what extent each is phantom or real. Of course, although it may have more pins, CPLD 115 must have at least as many I/O pins 115a as are necessary for simultaneous servicing of its respective and various buses 112, 116, etc.

In the illustrative example provided by system 100, second CPU 120 is a 16-bit microprocessor that has a corresponding 16-bit wide, time-multiplexed, address/data bus 122 (A/D bus 122). Second CPU 120 further includes a respective clock input line 123 for receiving a respective second clock signal, CLK_B. Additional control signals (CTL) may be provided on a separate, third control bus 124. Bus 124 is shown dashed to indicate that it may either be physically there in full or may instead be partly or wholly a phantom bus whose corresponding CTL signals are included as time-multiplexed signals along A/D bus 122.

The number of further parallel lines that may be needed for carrying control signals 124 associated with address and/or data signals of the 16 parallel lines in A/D bus 122, is typically about 2 or sightly more (about 12.5% or a greater fraction of the number of parallel lines in associated A/D bus 122, e.g., 2 parity bits). In some rare instances however, the number of further-and-control carrying, parallel lines in the real or phantom CTL bus 114 can be as large as about 50% (about 8 lines). One of the control signals that is carried by actual or phantom CTL bus 124 can be a RESET_B signal for flagging a resetting to a predefined state of second CPU 120 and its associated circuits 125 and 128, 129. In the illustrated example, the RESET_B signal for second CPU 120, second CPLD 125, and corresponding peripheral devices 128, 129 is initiated by actuating a RST_B line that is coupled to the CPU 120.

Typically, when the third A/D bus 122 that couples second CPU 120 to second CPLD 125 is 16-bits wide, there will be a corresponding 16-bit wide and fourth A/D bus 126 provided between the CPLD glue logic 125 and its one or more, associated peripheral devices 128. Additionally or alternatively there may be a corresponding, but narrower or wider fifth A/D bus 127 (e.g., 32-bits wide) provided between the second CPLD glue logic 125 and its one or more, associated peripheral devices 129.

Also, although not shown, there will typically be real or phantom, control buses between the second CPLD glue logic 125 and its associated peripheral devices 128, 129. The number of parallel control signals carried by these phantom or real control buses (not shown) will usually be about 12.5% or less of the number carried by the associated A/D bus, although it may be much higher such as 25% to 50%.

In addition to providing interfaces between different CPU's such as 110 and 120 and their respective peripheral devices 119, 128, 129; the CPLD glue logic circuits 115 and 125 may need to talk to one another over a control bus such as 133. The number of parallel lines provided in CTL bus 133 may be as many as 16, 32 or 64.

Given these various possibilities (FIG. 1), one problem that confronts designers of CPLD integrated circuits is how to arrange internal components of a CPLD IC so that the CPLD (e.g., 115, 125) can operate efficiently under circumstances where it is processing relatively small digital words having 16 or less bits each and, as such, internal function complexity may remain relatively low. And concurrently, the same problem extends to circumstances where the CPLD is processing relatively large digital words having 32, 64 or more bits each, and, as such, internal function complexity may become relatively high.

Speed is typically of the essence when CPLD's are being used. It is generally not acceptable to serialize a 64-bit design into 4 or more time slices that each process one fourth or a smaller fraction of a 64-bit wide operation. Users want the CPLD to process the entire 32, 64, or more bits of their wide-datapaths in parallel (simultaneously) so that processing results can be obtained as quickly as possible.

Figure 2:
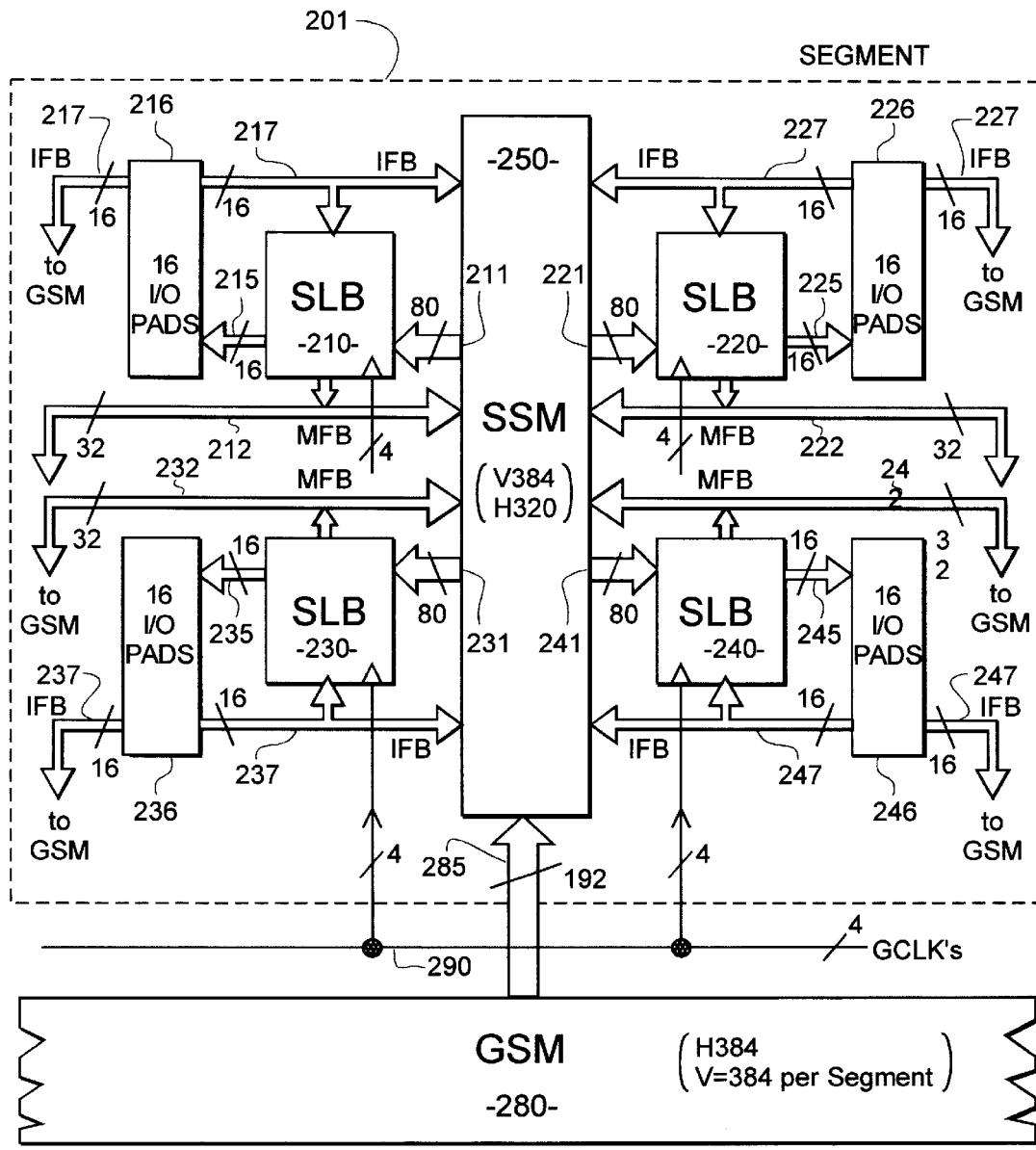
FIG. 2 is a block diagram showing one combination of a CPLD 'Segment' and a 'Global Switch Matrix' (GSM) in accordance with the invention.

FIG. 2 provides an introduction to a scalable CPLD architecture 200 that may be used in accordance with the invention to provide such flexibility.

The structure shown within dashed box 201 is referred to as a 'segment'. In a central portion of this segment structure 201, there is provided a Segment Switch Matrix (SSM) 250. Symmetrically disposed about the SSM 250 there are an even number of programmable logic blocks, such as the illustrated four identical units which are each referred to herein as a Super Logic Block (SLB). The four SLB's are respectively designated here as 210, 220, 230 and 240. Corresponding and identical groups of 16 I/O terminals (e.g., buried or externally-connected pads) each are provided respectively for SLB's 210, 220, 230 and 240. The I/O pad groups are respectively designated as 216, 226, 236 and 246.

It is seen from the broad overview of FIG. 2 that a 'segment' 201 is capable of inputting and/or outputting as many as 64 I/O signals simultaneously from the combination of I/O pad groups 216, 226, 236 and 246. The same arrangement 201 may alternatively be used for transceiving the signals of four separate, 16-bit wide buses or for transceiving the I/O signals of two, 32-bit wide buses. SSM 250 can be symmetrically organized to provide efficient operation for 64-bit wide bus operations, 32-bit wide bus operations, or 16-bit wide bus operations.

Referring to SLB 210 as an exemplary representative of the identically-structured other three SLB's of the same segment 201, each SLB receives a first set of 80 input signals from the SSM 250. The first SLB input set for SLB 210 is identified as 211. Independent but essentially same SLB input sets of 80 signals each are available to each of the other SLB's 220–240 of the same segment 201 and are each carried by a respective, 80-bits wide bus. The SLB input buses of the other three blocks are respectively designated as 221, 231 and 241.

The 80-bits carried by the eighty parallel lines of first input bus 211 can represent, by way of example, sixty-four simultaneous bits of data or address combined with up to sixteen simultaneous control signals (up to a 25% control overhead). Thus if B is the number of parallel bits of a given design, each SLB can support parallel processing of 125% of B up to a value where, for the illustrated segment design, B equals 64 bits. Migrations to larger segment designs where B is 96, 128, and so forth are within the spirit of the present invention. Of course, die size may have to be increased and pin-to-pin delay may suffer if the number (B times 1.25) of SLB input lines per SLB increases without commensurate improvements in the underlying technology (e.g., without using smaller, lower voltage transistors, without using metal interconnect with lower resistivity such as copper, and so forth).

Each of the eighty lines of input bus 211 is a general purpose line that may be used for carrying any kind of input signal. The example that is given above regarding 64 address/data signals and 16 overhead control signals is merely an example to demonstrate how the architecture of segment structure 201 may be exploited to implement a circuit that corresponds to CPLD 115 (FIG. 1), and its 64-bit wide A/D bus 116 and its associated 16-bit wide, overhead control bus 117. All 80 SLB input signals can be present at a same time as independent signals that are output from SSM 250 and are input through SLB input bus 211 into SLB 210 so that the 80 SLB input signals (211) can be simultaneously processed by SLB 210.

Because a control overhead of 25% is an extreme and the more typical control overhead is about 12.5%, the excess part of the 80 input paths provided by SLB input bus 211 can be seen as a kind of agility insurance that gives CPLD configuring software with more degrees of freedom for routing a necessary signal from SSM 250 into SLB 210.

SLB 210 can produce 32 macrocell result signals where each is a sum-of-products function whose product terms (PT's) can each be a product of up to the full 80, general purpose signals provided by input bus 211 or their complements. One or more of local control signals for specific macrocells (e.g., I/O_OE) and/or local control signals for specific blocks (e.g., SLB_RST) and/or local control signals for specific segment-wide control functions (e.g., SEG_RST) and/or global control signals for CPLD-wide, global control functions (e.g., GLB_RST) may be further formed from the 80 general purpose signals provided by input bus 211 if desired.

The sum-of-products (SoP) result signals 212 that are produced by the 32 macrocells of each SLB (210) are also referred to herein as macrocell feedback signals or 'MFBs'.

In one embodiment (see FIG. 5), each MFB signal can take on the expressive form:

$$f_{SoP} = \Sigma^{N=5++}(PTi^{Ki/80 \; max/(L=384/[16])})$$ {Exp. B} wherein the N=5++ factor indicates that a single-delay, one-pass sum can be a sum of at least as many as five product terms (5 PT's), but can be larger with use of simple allocation or super-allocation (the latter otherwise being referable to as, post-allocation re-allocation). In the expression, Exp. B, each product term, PTi can be a Boolean AND of as many as 80 independent input signals.

The Kmax=80 independent input signals of Exp. B can be obtained by sampling from a larger available set of 384 signals from an available set of L=384 lines. The '[16]' factor that divides into each of the L available lines indicates the level of partial-population that fills the crosspoint array formed by the intersection of the Kmax=80 lines (bus 211) of each SLB and the crossing L=384 lines of SSM 250. A corresponding routability factor is defined by, R=(Kmax=80 times [16] divided by 384 supply lines)=3.33 PIP's average per supply line.

Qualifier words used above, such as 'single-delay' will be detailed later. The N=5+ value can be raised to larger values such as N=10 or N=20 or larger by use of sums reallocation. In a sums re-allocation operation (see also FIGS. 6 and 7), a sum of sums (SoS) is formed. For example, four SoP's of 5 PT's each might be ORred together to define a SoP of 20 PT's. The result of a first Sum-of-Sums (SoS) operation may itself be further allocated as a contributing sum to a yet larger SoS. For example if the 20 PT's result of a first OR gate are summed during re-allocation with the 20 PT's result of a second OR gate, a functionally richer result based on 40 PT's is obtained. However such chained re-allocation incurs additional gate delays. Each serial passage of a bottlenecking PT signal through more OR gates and/or more allocation steering circuits increases the ultimate delay of the resulting Sum-of-Sums. Thus the value, N=5++ can be much larger if the circuit designer is willing to tolerate more than a single quantum of allocation delay.

Continuing with our overview of FIG. 2, MFB signals 212 are fed back both to SSM 250 and to Global Switch Matrix (GSM) 280. If the delay of feedback or cascading can be tolerated in a given design, then any one or more of the 80 inputs of SLB input bus 211 can itself be an MFB signal that was generated by the same SLB 210 and thereafter fed back through SSM 250. Alternatively or supplementally, any one or more of the 80 inputs of SLB input bus 211 can be an MFB signal that was generated by another SLB (220–240) of the same segment (201) and thereafter forwarded by way of SSM 250 and bus 211 to SLB 210. As yet another variation, any one or more of the 80 inputs of SLB input bus 211 can be an MFB signal that was generated by another SLB in a different segment (see FIG. 3) and thereafter passed through the GSM 280, the SSM 250 and SLB input bus 211 to reach SLB 210.

As yet a further variation, any one or more of the 80 inputs of SLB input bus 211 can be an externally-produced I/O signal (an IFB signal 217). Up to 64 such externally-produced I/O signals can come directly from the up-to 64 I/O pins (nonburied pads) of the illustrated segment 201 while up to another 16 such externally-produced I/O signals can come from I/O pins of other segments.

SSM 250 has 384 vertical longlines (indicated in the drawing by 'V384'). These V384 lines of SSM 250 can simultaneously carry 4 separate sets of 80 independent signals each respectively to the 4 SLB input buses 211, 221, 231 and 241 of SLB's 210, 220, 230 and 240. Note that the number of horizontal crosslines in SSM 250 is 320 (denoted as H320).

The 32 MFB signals (e.g., 212, 222, etc.) that are respectively produced by the 32 macrocells of each SLB (210, 220, etc.) may be used to selectively generate a smaller subset of sixteen I/O signals. These 16, SLB-produced I/O signals may be provided on a tri-stated basis and by way of I/O bus 215 (225, etc.) to respective I/O pads 216 (226, etc.). Not all of the I/O pads 216 necessarily connect to an external package pin. Some may be 'buried' pads.

One or more of the sixteen I/O signals on I/O pads 216 may be instead generated outside the CPLD and supplied into the chip by way of respective I/O pins that connect to nonburied ones of the I/O pads 216. The externally-sourced or internally-produced I/O signals may be transmitted by way of bus 217 from I/O pads 216 to SSM 250 and also to GSM 280. Bus 217 may also serve as a path by way of which externally-generated signals enter the CPLD through I/O pads 216 and then enter into the SLB 210 for synchronization before being forwarded via bus 212 or 215 to one or both of SSM 250 and GSM 280. In this latter transfer process, a data storing portion of SLB 210 may receive the externally-sourced I/O signals 217 for storage and subsequent output onto MFB bus 212 and/or I/O bus 215 as will be described below.

Although the above discussion has focused on SLB 210, it is to be understood that each of SLB 220, 230 and 240 has a similar arrangement of inputs and outputs which are referenced accordingly in FIG. 2. Furthermore, each of SLB 210, 220, 230 and 240 receives four global clock signals (GCLK's) from a global clock bus 290.

It is seen from the above that SSM 250 receives 192 general purpose, global signals from GSM 280 by way of connection 285. Another 192 input signals of Segment Switch Matrix 250 are defined by a 100% intra-segment return of the four sets of 48 signals each produced by the MFB and IFB resources (buses 212, 217, 222, 227, 232, 237, 242, 247) of the corresponding SLB's 210–240. SSM 250 can be viewed as including a matrix of 384 vertical longlines (V-LL's) and 320 crossing over, horizontal shortlines (H-SL's). The count of the 320 shortlines is formed by the four sets of 80 signals each output from the SSM 250 into respective SLB input buses 211, 221, 231 and 241. The crossed-lines matrix in SSM 250 of 384 vertical lines and 320 horizontal lines is represented by the symbol, V384/H320. This V384/H320 matrix of crosspoints is preferably, partially populated by a similar set of PIP's (programmable interconnect points) so that each SSM local longline is generally, similarly loaded by a respective same number of PIP's, so that each SSM global longline is correspondingly and similarly loaded by a respective same number of PIP's, and so that each SSM shortline is similarly loaded by a respective same number of PIP's. Thus, for the illustrated embodiment, a respective and essentially same delay is provided by routing to any corresponding SSM output line (of buses 211, 221, 231, 241) either a respective signal from any SSM local input (e.g., 212, 217) or a respective signal from any SSM global input (285).

GSM 280 can receive up to 192 general purpose signals from each segment (e.g., 201), can output up to 192 general purpose signals to each segment (by way of bus 285), and can carry as many as 384 inter-segment signals. The H384/(V384 per segment) matrix of crosspoints in GSM 280 is preferably, partially populated by a similarly distributed set of PIP's (programmable interconnect points) so that each GSM longline (horizontal) is loaded by a similar and generally same number of PIP's and each to-GSM inputting shortline (vertical) is respectively loaded by a similar and generally same number of PIP's and each from-GSM outputting shortline (feeds into 285) is respectively loaded by a similar and generally same number of PIP's. Thus an essentially same delay is provided by routing a signal from any GSM input to any corresponding GSM output.

Figure 3:
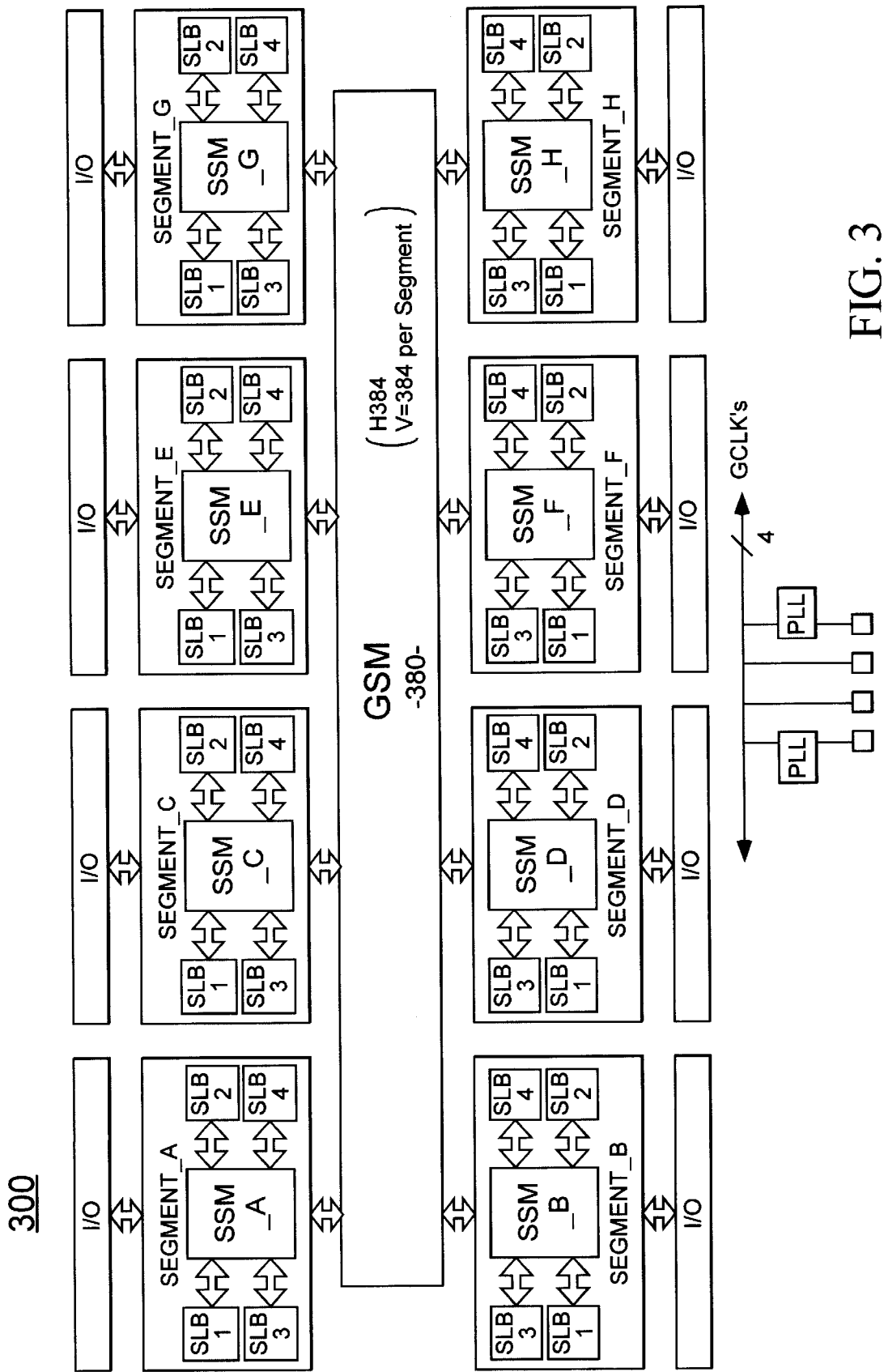
FIG. 3 is a block diagram showing a CPLD having a plurality of Segments and a common GSM in accordance with the invention.

FIG. 3 illustrates a CPLD monolithic device 300 in accordance with the invention. One version of monolithic IC 300 employs at least four layers of metal interconnect and transistors with drawn channel lengths of $0.35\mu$ or less and effective transistor channel lengths of $0.25\mu$ or less. The Vdd voltages of such $0.25\mu$ Leff transistors is typically 3.6V or less. The metal interconnect is used for longlines in switch matrices for reducing routing delays. The submicron transistors are used for defining PIP's (programmable interconnect points) having relatively short signal transmission times. Pin-to-any-other-pin delay time in CPLD 300 can be as short as about 15 nS to 10 nS (nanoseconds) or less. Intra-segment pin-to-any-other-pin delay time can be as short as about 7 nS or less.

CPLD 300 comprises eight segments, respectively denoted as A–H, which are provided symmetrically about GSM 380. Each of segments A–H has 64 I/O pads and four SLB's. Some of the I/O pads may be buried ones (e.g., 32 per segment) while the others are connected to external pins. Each SLB contains 32, result-storing macrocells. The illustrated CPLD 300 therefore has 512 I/O pads and 1024 macrocells. There are 128 fully-interconnectable macrocells within each segment. If the pad burial rate is 50%, there will also be 256 I/O pins for the IC device. The layout arrangement shown in FIG. 3 is more for conceptual purposes than actual layout. In an alternate layout, segments A–D are arranged as a square and placed above the GSM while segments E–H are similarly placed below, thereby providing a die with a more square shape and shorter wire lengths.

There are four global clock (GCLK) pins in CPLD 300. Two of the pins are coupled to programmably-bypassable phase locked loops (PLL's) which then couple to two chip-wide GCLK lines. The other two pins connect directly to two other chip-wide GCLK lines. The PLL's may be used for frequency multiplication and/or phase adjustment relative to chip-external clock signals.

Each of segments A–H may operate as an independent and self-contained mini-CPLD that has up to 64 I/O terminals and has 128 macrocells. The 384 longlines (horizontal lines) of GSM 380 may be used as substitute for a printed circuit board which can interconnect the total of 512 I/O pads (buried or not) of the 8 mini-CPLD's in a wide variety of ways.

Alternatively, the 192 output signals of a first Segment Switch Matrix (e.g., SSM_A) can be fully interconnected by way of the 384 H-lines of the Global Switch Matrix (GSM) 380 to the 192 global V-lines of any other Segment Switch Matrix (e.g., SSM_H) so that two segments can define a global-wise, fully interconnected, double-mini-CPLD. (The other 192 V-lines in each SSM can be used for fully-supporting local feedback.)

Alternatively, the 384 H-lines of GSM 380 may be used on a more sparing basis to couple certain selected MFB and/or IFB signals of any first Super Logic Block (e.g., SLB1_A) to serve as inputs for any other Super Logic Block (e.g., SLB4_H). CPLD configuring software determines how many such global interconnects can be made based on the interconnect flexibilities provided by the GSM 380 and SSM's A–H.

Figure 4A:
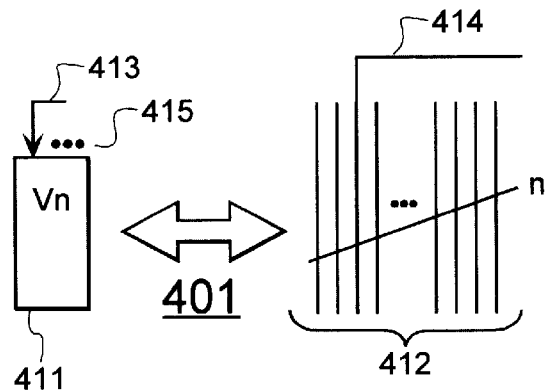
FIGS. 4A–4C provide a legend for various symbols used in others of the drawings.
Figure 4A:
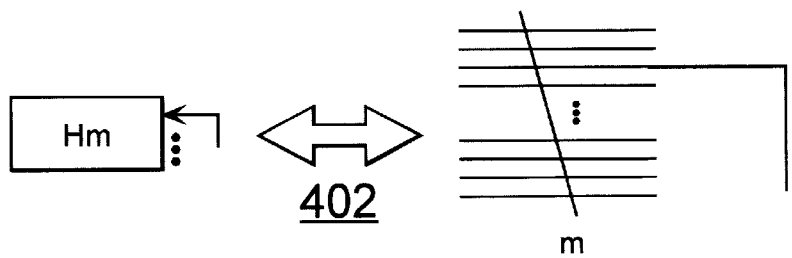
Figure 4A:
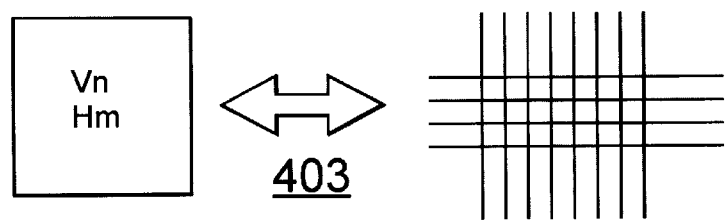
Figure 4A:
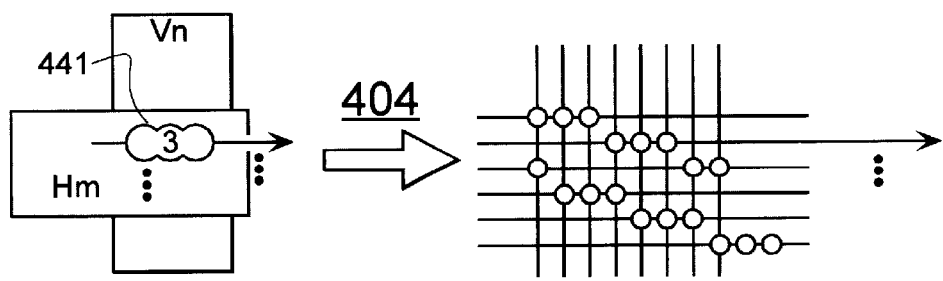
Figure 4B:
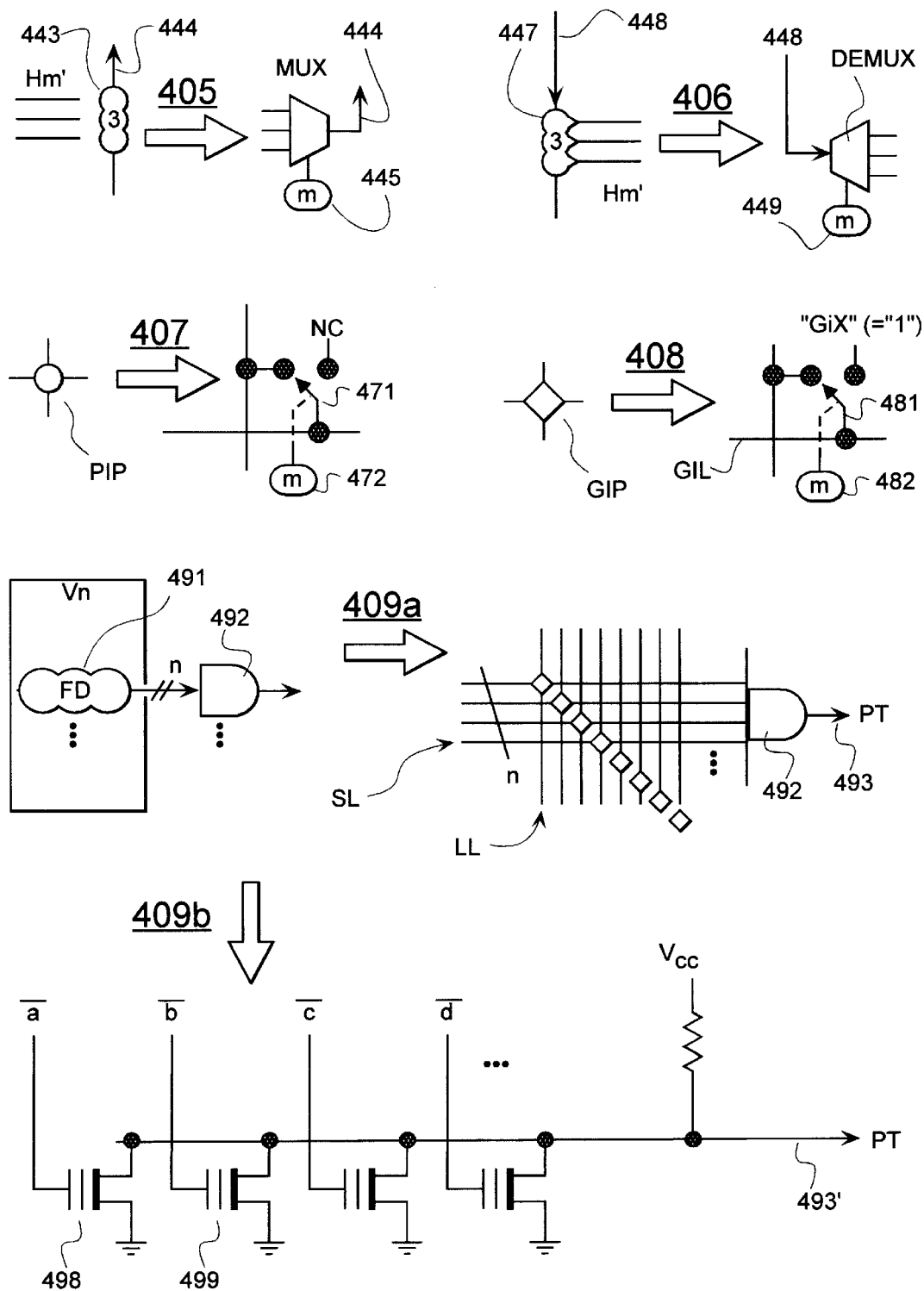
Figure 4C:
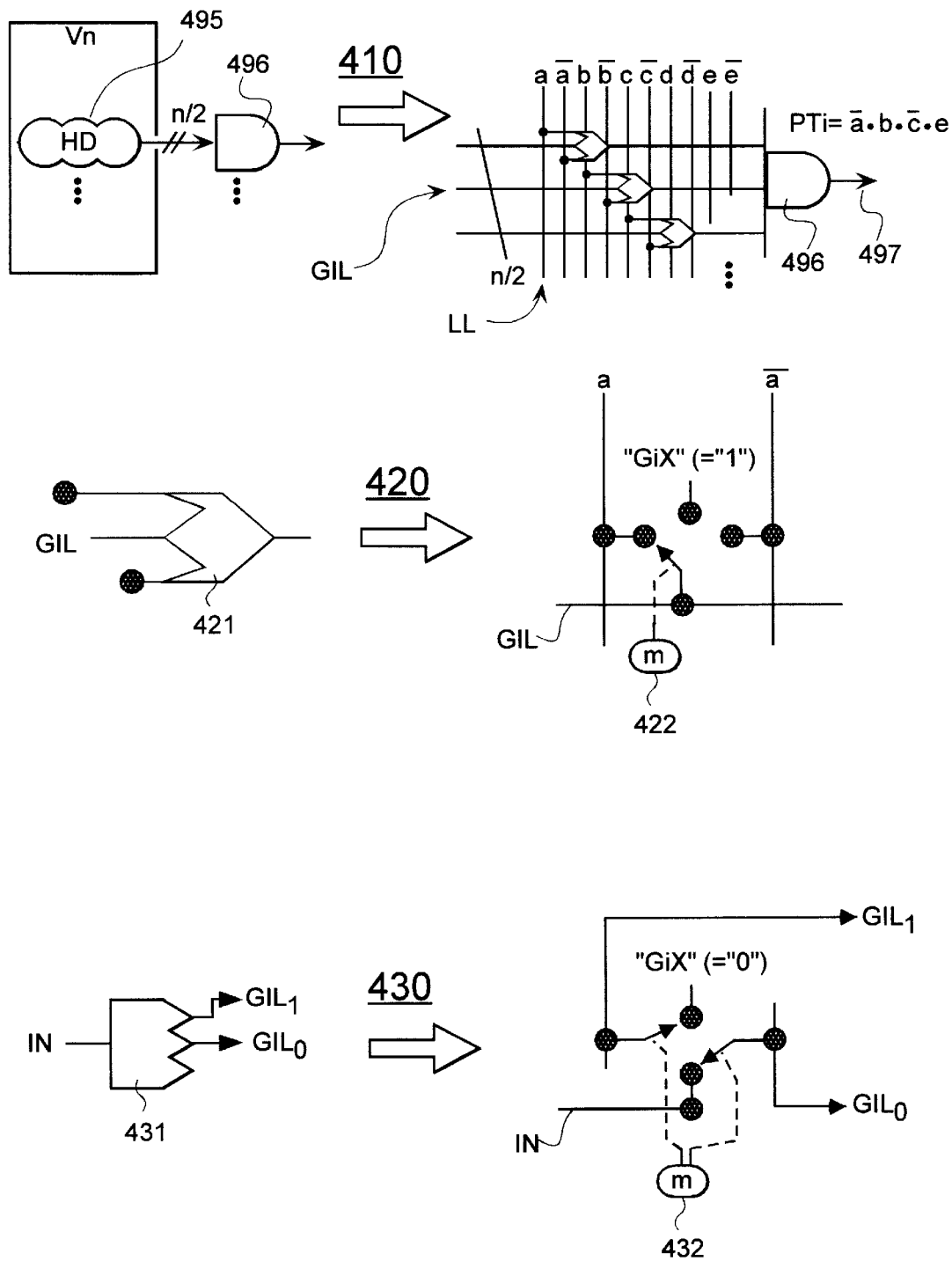
Figure 5:
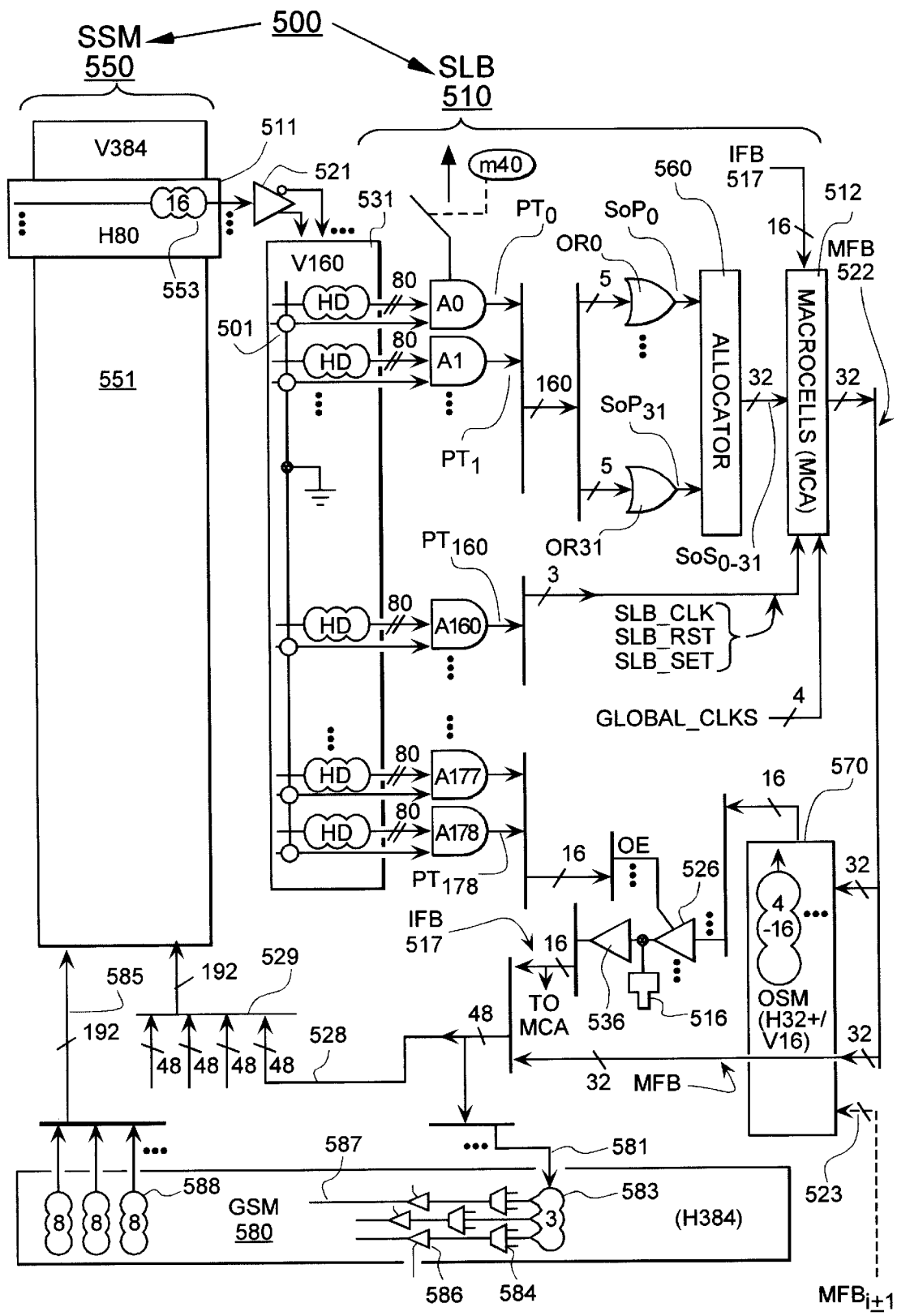
FIG. 5 is a schematic showing a 'Super Logic Block' (SLB) in accordance with the invention and further showing N-way routing capabilities provided by couplings through the corresponding 'Segment Switch Matrix' (SSM) and through the GSM.

FIG. 5 demonstrates how local and global routing flexibility is provided in the feedback loops of one embodiment 500 due to the provided combinations of switch matrix sizes and multiplexer sizes. However, before FIG. 5 is discussed, the meanings of various symbols therein are explained by referring to the legend 400 of FIGS. 4A–C.

Interchangeability symbol 401 demonstrates that a rectangle 411 with insignia of the form 'Vn' in it represents a set 412 of n parallel lines extending in the vertical (V) direction. The vertical (V) direction is that used in the respective drawing and does not in any way limit the direction or directions of extension of a given, actual bus even though that bus is described herein as being 'vertical'.

A particular one line such as 413 may serve as an exemplary representative of the n V-lines of a bus such as 411. The counterpart of the exemplary representative line 413 is shown as 414 in the schematic at the right of interchangeability symbol 401. An arrow may be used to indicate signal direction within the exemplary line 413. The ellipses 415 indicate that the example is understood to be repeated.

Interchangeability symbol 402 demonstrates that a rectangle with insignia of the form 'Hm' in it represents a set of m parallel lines extending in the horizontal (H) direction. The horizontal (H) direction is that used in the respective drawing and does not in any way limit the direction or directions of extension of a given bus that is described herein as being 'horizontal'. Of course, when a horizontal first bus crosses with a vertical second bus, a corresponding set of crosspoints will be defined in the actual device. The presence of a crosspoint by itself does not imply that an electrical connection is present there or can be programmably created at that crosspoint. However, as is explained shortly, a set of crosspoints can be fully or partially populated by PIP's (programmable interconnect points) to thereby define a programmable switch matrix.

Interchangeability symbol 403 demonstrates the equivalence between a rectangle with insignia of the form 'Vn/Hm' in it, and a crossing of a Vn bus with an Hm bus.

One-way interchangeability symbol 404 shows the formation of a partially populated, programmable switch matrix at the intersection of a Vn bus and a Hm bus. A peanut-shaped symbol such as 441 with a number in it, represents an exemplary set of partially populating PIP's. In this example a horizontally-extensive pattern of 3 PIP's is repeated vertically in a staggered and wrap-around manner so that in general, each H-line is loaded by same number of PIP's (e.g., 3) and each V-line is loaded by a same, vertically-associated number of PIP's (e.g., 2).

The routing function of the peanut-shaped symbol 441 can vary based on whether signal flow is bidirectional or unidirectional. One-way interchange-ability symbol 405 shows the case where each 3:1 peanut symbol 443 represents a 3-to-1 multiplexer (MUX) because signal flow is defined by 3 input signals (Hm') and one output signal 444. Configuration memory 445 and the selection control port are implied.

One-way interchangeability symbol 406 shows the case where each 1:3 peanut symbol 447 represents a 1-to-3 demultiplexer (DEMUX) because signal flow is defined by 3 output signals (Hm') and one input signal 448. Configuration memory 449 and the selection control port are implied.

One-way interchangeability symbol 407 shows how a PIP (represented by a hollow circle) might be implemented by a configuration-memory controlled switch 471. In one state, the PIP creates either a unidirectional or bidirectional connection between the crossing H and V-lines. In a second state, the PIP does not provide a connection between the crossing H and V-lines. Switch 471 may defined by any one of a plurality of elements, such as an NMOS pass transistor, a CMOS transmission gate, a blowable fuse or makeable anti-fuse, one or an opposed pair of tristate drivers, and so forth. Configuration memory 472 can be discrete from controllable switch 471 or an integral part of it, such as when switch 471 includes a floating gate transistor and the charge on the floating gate defines a configuration memory state.

One-way interchangeability symbol 408 shows how a GIP (a Gate Input Point which is represented here by a hollow diamond) might be implemented by a memory controlled switch 481. In one state, the GIP creates a unidirectional connection between a crossing signal-providing line and a gate input line (GIL). In a second state, the GIP instead couples the gate input line (GIL) to a Gate-input doesn't-care state 'GiX'. If the gate on the output end of the GIL is an AND gate, then the don't-care state 'GiX' is a logic '1' because that allows other inputs of the AND gate to define its output. If the gate on the output end of the GIL is an OR gate, then the don't-care state 'GiX' is a logic '0' for similar reasons. Switch 481 may defined by any one of a plurality of elements, such as an NMOS pass transistor with pull-up, a blowable fuse or makeable anti-fuse with pull-up, an open collector driver or a tristate driver with pull-up, and so forth. Memory 482 can be discrete from controllable switch 481 or an integral part of it, such as when switch 481 includes a floating gate transistor and the charge on the floating gate defines a memory state.

One-way interchangeability symbol 409a demonstrates for purpose of understanding symbolic equivalence, the relationship between a Vn rectangle with a Full-Diagonal symbol (FD peanut) 491 and a corresponding matrix of crosspoints that are populated by GIP's. The output 493 of AND gate 492 defines a product term (PT) of one or more of all n signals provided by the vertical longlines (V-LL's). The real or theoretical lines that cross with the V-LL's are sometimes referred to herein as shortlines (SL's) even though SL's might be longer than their LL's. Typically, LL's broadcast a set of available signals along an array of SL's. PIP's or GIP's on the SL's select a subset of the LL-broadcast signals and deliver the selected subset to an array of subsequent circuits (e.g., AND gates) provided along the longlines.

Those skilled in the art will recognize that the depiction to the right of symbol 409a is generally more symbolic than real. One-way interchangeability symbol 409b demonstrates a more realistic implementation of an n-inputs AND gate. Here, the product term signal 493' is formed by a wired-AND circuit having a pull-up resistor. The pull-up resistor can be an implied feature of a sense amplifier that inputs line 493' and skews the sense amplifier output towards high if the level on line 493' is above an appropriate threshold value. Speed of the wired-AND circuit tends to be related to the power drawn by the pull-up resistor and/or sense amplifier (latter not shown). If the RC of the wired-AND circuit is increased to conserve power (by increasing R), the response time of the circuit also increases. Each of NMOS floating gate transistors such as 498, 499, etc. receives a respective and pre-complemented one of the n input signals at its gate while its source is tied to ground and its drain is tied to pulled-up line 493'. If one of the pre-complemented input signals goes high, its transistor pulls line 493' low and thereby performs the Boolean ANDing function. Charge may be programmably and individually stored onto the floating gate of each of transistors 498, 499, etc. to define whether that crosspoint is active or not. If none of transistors 498, 499, etc. are active, then the pull-up resistor or its equivalent will pull the output of line 493' high to Vcc.

In some instances, it is not desirable to use a Full-Diagonal (FD) of crosspoint populating GIP's such as implied by FD peanut symbol 491. For example, if each input signal and its complement are simultaneously presented for input into a gate, then the theoretical number of gate input lines (GiL's) can be cut in half because both of the gate input signal and its complement will generally not be applied at the same time to a same AND gate or a same OR gate. Such a condition is illustrated to the right of interchangeability symbol 410. Each of the illustrated, hollow bird symbols (421) represents a memory-controlled, 3-to-1 switch that couples the GiL either to supplied input signal or its complement or to a Gate-Input don't care level (Gix). The HD insignia at 495 represents such a Half-full Diagonal condition. The output 497 of AND gate 496 can be configured by the three-way switches (421) to be a product of any desired ones of the supplied input signals (a, a-NOT, b, b-NOT, etc.).

Those skilled in the art will recognize that the depiction to the right of 410 is generally more symbolic than real. One-way interchangeability symbol 409b again demonstrates a more realistic implementation. For the HD embodiment, additional and like-connected transistors will typically be added onto line 493' to receive the non-complemented signals, a, b, c, d, etc. The n number of vertical input lines will therefore be twice as many as the up to n/2 number of terms that may be ANDed together by the circuit. This relationship between the Vn input lines and the n/2 independent terms that may be ANDed is indicated in FIG. 4C to the left of leftmost gate symbol 496 by the double-slash symbol and its 'n/2' descriptor.

One-way interchangeability symbol 420 shows how a three-state switch 421 might be formed so configuration memory 422 determines whether input signal 'a' or 'a-NOT' or a don't care level (GiX) is applied to the gate input terminal line (GiL). If the receiving gate is an AND gate, then GiX='1'. At least two memory bits are generally needed to define the 3 states.

Those skilled in the art will recognize that a pair of transistors such as 498, 499 in the implementation shown below 409b can be used with a pull-up or pull-down resistor to emulate the operation implied at 420. For example, if an AND gate is being implemented, input signals a and a-bar (a-NOT) will be supplied respectively to the gates of transistors 498, 499. Three configuration memory states can be defined by disabling only 498 (receives 'a'), disabling only 499 (receives 'a-bar'), and disabling both of 498 and 499. If a fourth memory state is allowed where both of 498 and 499 are enabled, then the output 493' of the AND gate will be forced to zero because at least one of 'a' and 'a-bar' is zero.

Shown to the left of the next, one-way interchange-ability symbol 430, there is a crown-shaped symbol 431 that represents the inverse of the operation performed by gate-input element 421. The crown-shaped symbol 431 represents a one-to: as-many-as-N-points, programmable steering switch that has one input point (IN) and a plurality of N output points (2 active ones in this example). Steering switch 431 is programmable to steer its input signal (IN) to at least one, programmably-selected one of its N output points while applying a predefined default level to each of the remaining of its N output points that are not specifically selected for receiving the input signal (IN). In other words, those of the N output points to which the IN signal is not specifically steered, will instead receive a respective default level (e.g., a GiX level).

In the illustrated example of one-way interchange-ability symbol 430, the two (N) output points of steering switch 431 are respectively, a first input terminal (GIL$_0$) of a first gate (not shown) and a second input terminal (GIL$_1$) of a separate second gate (not shown). Both of the first and second gates (not shown) have a same, input don't care level (GiX). For example, if the first and second gates (not shown) are OR gates, then GiX is a logic '0' and that becomes the default output level of the corresponding steering switch 431. Thus, if configuration memory 432 can only select a specific one of the N output points, say the first input terminal (GIL$_0$), then steering switch 431 will steer the input signal (IN) to GIL$_0$ while steering the don't care, default level (GiX) to the input terminal (GIL$_1$) of the second gate. If configuration memory 432 instead selects GIL$_1$, then the vice versa operation will be performed. The input signal (IN) will be steered to GIL$_1$ while GiX will be steered to GIL$_0$.

If desired, configuration memory 432 can be made larger such that it can programmably-select more than one of the N output points of the steering switch 431 while applying a default level to the remaining of its N output points. In the illustrated example therefore, configuration memory 432 might be organized as two bits instead of one, in which case memory 432 can be programmed to control each of the illustrated SPDT electronic switches independently. Typically, in CPLD's where pass transistors are used for implementing PIP's, and where configuration memory can be become excessively large if some restraint is not used, the configuration memory 432 of a steering switch 431 is limited to selecting just one of the N output points. One reason why it is desirable to steer the input signal (IN) to the input terminal of only one gate at a time is so that speed can be maintained without having to provide too large of a signal generating driver (not shown).

Referring to FIG. 5, the illustrated super structure 500 is constituted by a Segment Switch Matrix (SSM) 550, and a cooperating part of Global Switch Matrix (GSM) 580, and a plurality of Super Logic Blocks, of which only SLB 510 is shown. Where practical, reference numerals in the '500' century series are used in FIG. 5 to refer to elements that have corresponding counterparts in FIG. 2, where the latter are identified by reference numerals in the '200' century series.

As such, the illustrated set 511 of eighty H-lines that emerge from SSM 550 represent the SLB input bus 511 for SLB 510. The illustrated set 522 of thirty-two MFB lines that emerge from macrocells area 512 carry the macrocell result signals (MFB's) of SLB 510. Pad 516 is a representative one of the 16 I/O pads of SLB 510. A preselected subset of the I/O pads 516 may be buried if desired. The 16-bit wide bus 517 corresponds to bus 217 of FIG. 2 and includes a connection to macrocells area (MCA) 512. IFB bus 517 merges into a 48-bits wide, combined feedback bus 528. Combined feedback bus 528 then merges into a 192-bits wide, combined feedback bus 529 which feeds into Segment Switch Matrix (SSM) 550.

SSM 550 is constituted by a V384 section of longlines 551 crossing with respective H80 shortlines that define corresponding SLB input buses (only one of plural H80 sets is shown at 511). The V384 section of longlines 551 is divisible into a local-feedback portion (fed by bus 529) and a global-feedback portion (fed from the GSM by bus 585). On each H-line of SLB input bus 511 there is a partially-populating pattern of PIP's that define a 16-to-1 multiplexer (16:1 mux) 553. The 16 PIP's of each such mux 553 are provided in the cross area of H80 bus 511 with the V384 longlines of lines of section 551.

There are therefore, 1280 PIP's in the cross area of H80 bus 511 and V384 section bus 551. Because the PIP's are generally uniformly distributed in this cross area, the 1280 PIP's provide, on average, 3.33 ways (1280/384) for a given signal on V384 bus 551 to enter SLB 510. In one embodiment, preference for routability is given to the IFB ones of signals carried on the V384 lines of bus 551 so that, for every triad of 2 MFB-carrying V-lines and 1 IFB-carrying V-line, there are 3 PIP's per SLB on each of the 2 MFB-carrying V-lines and 4 PIP's per SLB on the 1 IFB-carrying V-line. This combination of 10 PIP's per SLB for each corresponding triad of V-lines produces the average of 3.33 ways to route a signal from an SSM local line to a given SLB (10/3=3.33).

Up to eighty, independent, SLB input signals may be carried by H80 bus 511 into SLB 510. The SLB input signal on each of the H80 lines may be chosen from among a respective 16 of the 384 signals carried by the longlines of SSM 550. Each of the H80 lines is loaded by the electrical capacitance of its respective 16 PIP's plus the electrical capacitance of the one SSM longline to which one of multiplexers 553 programmably couples the SSM shortline. Each of the V384 longlines of SSM 550 is loaded by the electrical capacitance of its 3.33 on average PIP's per SLB (e.g., 4 PIP's for longlines carrying IFB's, 3 for those with MFB's) times the number of SLB's in the given segment structure.

The eighty, independent, SLB input signals of bus 511 are supplied to a corresponding set of 80 complementary line drivers. Element 521 is an example of one such complementary line driver. The V160 output lines of the 80 complementary line drivers (521) enter area 531 to cross with 179 HD structures. Each HD structure of area 531 can supply a theoretical number of as many as 80 independent input signals to a respective one of one hundred seventy nine AND gates, A0 through A178. Additionally, a nulling PIP 501 may be provided in reality or theory for each of AND gates, A0–A178 for forcing the output its respective AND gate to zero. In general practice, the nulling PIP 501 will not be used, and instead one of the memory-controlled, 3-to-1 switches 421 (FIG. 4C) of each HD peanut may be replaced by a 4 state switch that further allows both a PT input term and its complement to be simultaneously applied to a respective pair of GiL's of the respective AND. Simultaneous application of the input term and its complement will force a zero output. This approach has been discussed above with respect to transistors 498 and 499.

Each of AND gates, A0 through A178 produces a respective one of product term signals, $PT_0$–$PT_{178}$. Each respective product term, $PT_i$ can represent the Boolean product of one or more of any of the 80 SSM signals acquired by SLB input bus 511 or their corresponding complements. Each respective product term, $PT_i$ can also be set to logic '0' if no input term is selected by the respective HD structure of crosspoint area 531 and the respective nulling PIP 501 or its equivalent is activated. Each respective product term, $PT_i$ can also be set to logic '1' if no input term is selected by the respective HD structure of crosspoint area 531 and the respective nulling PIP 501 or its equivalent is not activated.

To conserve power, each SLB (e.g., 510) may include a programmably-controllable power switch that is driven by a corresponding configuration memory cell m40. If the product terms, $PT_0$–$PT_{178}$ of the given SLB are not needed, m40 is left in its programming default state and the pull-up resistors and/or sense amplifiers of AND gates, A0–A178 are placed in a zero or minimal power-consumption mode. OE signals of below-described, drivers 526 are placed in output disabling states. However, pad input buffers 536 (also described below) remain usable so that I/O pads 516 of the powered-down SLB may be loaned to other SLB's for signal inputting purposes as will be described later.

A first subset of 160 of the product terms, $PT_0$–$PT_{159}$ are subdivided into 32 groups of 5 PT's each, and supplied as such to a corresponding set of 32 OR gates, OR0–OR31. Each of OR gates, OR0–OR31 produces a respective one of 32 sum-of-products signals, $SoP_0$–$SoP_{31}$. Each of the $SoP_0$–$SoP_{31}$ signals can therefore be expressed by the expressive form:

$$f_{SoP} = \Sigma^{N-5+} Xi \cdot (PTi^{Ki/Kmax-80/L-384}) \qquad \{\text{Exp. B1}\}$$

where Xi=0 if the corresponding nulling PIP 501 is activated, Xi=1 otherwise, and PTi=1 if Ki is a null subset of Kmax.

Allocator 560 receives the $SoP_0$–$SoP_{31}$ signals and produces a derived set of 32 sums-of-sums signals, $SoS_0$–$SoS_{31}$. Allocator 560 can be programmably configured to cause $SoS_0$–$SoS_{31}$ to be merely copies respectively of the $SoP_0$–$SoP_{31}$ signals. Alternatively, allocator 560 can be designed and programmably configured to cause each respective $SoS_i$ signal to follow the expressive form:

$$SoS_i = \Sigma^{Ma} X_J \cdot SoP_J + \Sigma^{Mb} Y_J \cdot SoS_J \qquad \{\text{Exp. C}\}.$$

Note that the terms after the second sigma symbol ($\Sigma$) are SoS (sum-of-sums) terms and not SoP (sum-of-products) terms. There are also two different summation ranges, Ma and Mb. Selection term, $X_J$ equals 1 if the corresponding $SoP_J$ term is to be included in the sum-of-sums result $SoS_i$ and $X_J$=0 if not. Selection term, $Y_J$ equals 1 if the corresponding $SoS_J$ term is to be included in the sum-of-sums result $SoS_i$ and $Y_J$=0 if not. The first summation range, Ma usually covers a range including the value J=i. The second summation range, Mb should cover a range that excludes the value J=i and will typically also exclude at least a further subset of Ma such as J=i+1 and J=i−1.

Allocator 560 can have a wide variety of designs whose specifics are not directly germane to the over all architecture of the CPLD. However, these specifics are germane to the present invention and will be further discussed when we reach FIG. 6. In one embodiment, Ma covers a continuous range including the values J=i−1 and J=i+2 while Mb is limited to a discontinuous range that includes one or both of J=i−4 and J=i+4 (see FIG. 7).

Each of the 32 macrocells in macrocells area (MCA) 512 will typically comprise an XOR gate that can dynamically define the polarity of its respective $SoS_i$ signal. In accordance with DeMorgan's well known theorem, inversion of a Boolean sum (e.g., $SoS_i$) causes it to appear as a product of its complemented terms and vice versa. Each of the 32 macrocells will typically further comprise a storage unit for storing the polarity-adjusted $SoS_i$ signal. The storage unit can be fixed or programmably configured to behave as anyone of, for example, a D-type flip flop with single or dual edge triggering, a T-type flip flop (toggling on appropriate clock edge or flat), a latch, or a combinatorial pass-through device that passes its input to its output without delaying for carrying out a storage function.

Figure 6:
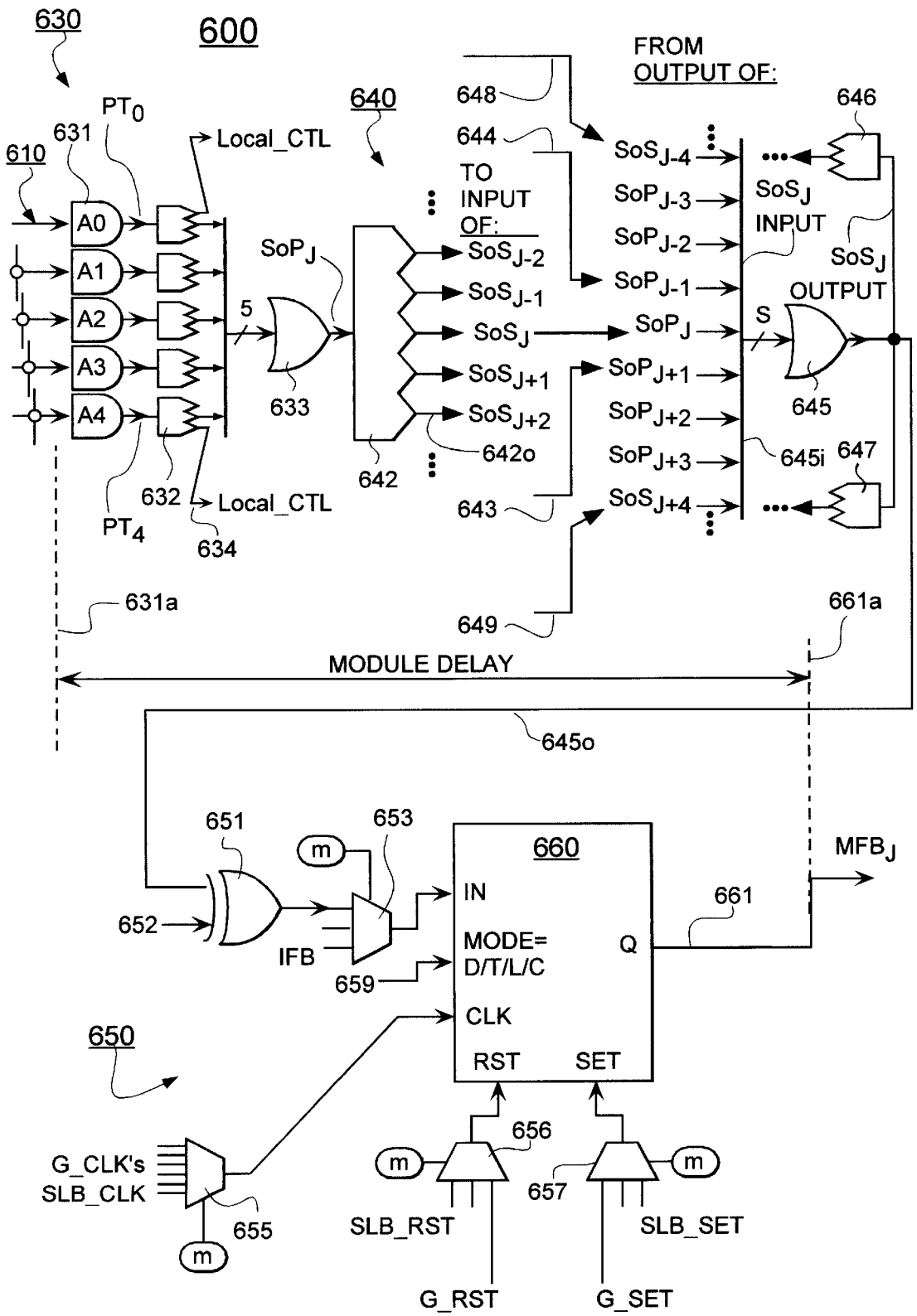
FIG. 6 is a schematic showing a general structure of a macrocell module that may be used within the SLB structure of FIG. 5.

FIG. 6 shows a generic example of a macrocell module 600 in accordance with the invention. Macrocell module 600 has an input term signals acquiring means 610 (e.g., area 531 of FIG. 5), an AND/OR array 630, an allocator 640, and storage macrocell 650. As used herein, the term, 'macrocell module delay' refers to the time delay between when valid input terms (product-forming signals) appear at an input boundary 631*a* of a module's AND/OR array 630 and when a corresponding, valid macrocell output signal, $MFB_J$ appears at output boundary 661*a*. As will be understood later below, boundaries 631*a* and 661*a* do not necessarily have to be in a same macrocell module. One module may acquire input signals while another produces a corresponding, macrocell output signal, MFB. Delays attributed to PIP's and switch matrix lines in the input term signals acquiring means 610 are not counted as part of the macrocell module delay. Similarly, delays attributed to PIP's and switch matrix lines in each Pad Output Switch Matrix (POSM, see 770 of FIG. 7) are not counted as part of the macrocell module delay. In one embodiment, macrocell module delay can be as short as 3 nS or less if super-allocation is not employed.

Storage macrocell 650 and the remainder of module 600 constitute a Jth one of an array of like modules that are sequentially numbered, as for example in the sequence, J−3, J−2, J−1, J, J+1, J+2, J+3, etc.

The AND/OR array 630 comprises a first array 631 of five AND gates, A0–A4 that respectively generate product term signals, PT0–PT4. AND/OR array 630 further comprises a second array 632 of up to five PT-steering elements, and a first OR gate 633 which generates a respective sum-of-products signal, SoP$_J$, where the latter can be sum of as many as 5 PT's, namely, PT0–PT4. However, if one or more of the PT-steering elements 632 is activated to steer (steal) its respective PT signal away from the first OR gate 633, then the output sum-of-products signal, SoP$_J$, will be a sum of a fewer number of product terms than 5 PT's.

Each of the PT-steering elements 632 is a one-to-one-of-N steerer which can be programmably configured to either steer its respective PTi signal to an input terminal of first OR gate 633, or to supply a logic '0' (GiX=0) to that terminal of OR gate 633. If the respective PTi signal is not steered to OR gate 633, the PTi signal may be instead steered to an i-th local control within the Jth macrocell module 600. If the respective PTi signal is not steered to the i-th local control, then the respective PT-steering element 632 provides a predefined default control signal on the line 634 of that respective i-th local control.

The exact nature of each of the, up-to-five local controls can vary in accordance with different design goals. A more specific design will be detailed in the below discussion of FIG. 7. By way of an introductory example for FIG. 6 though, the optionally re-directed PT signals that are steered through the local-control lines 634 of PT-steering elements 632 can be applied to a respective terminal 652 of soon-described XOR gate 651. Others of the optionally re-directed PT signals can be applied for controlling the polarity and/or edge-sensitivity of the CLK input of storage element 660. They can also be applied to a mode control 659 for causing element 660 to function as a desired one of a D-type flip flop (IN=D), a T-type flip flop (IN=T), a latch (IN=L), or a combinatorial pass-through element (IN=C), where in the last mode, C, the IN signal of element 660 is passed directly to Q output 661 without intermediate storage.

Each additional amount of control flexibility may or may not significantly increase the amount of configuration memory that is needed for providing it on a per-macrocell basis. One configuration memory bit can be used to define two mutually-exclusive control states. Two configuration memory bits can be used to define four mutually-exclusive control states, and so on. If four states are already consumed and one wishes to add yet another, mutually exclusive control state to a pre-existing group, the per macrocell impact on configuration memory will be an additional memory cell and a larger decoding circuit for decoding the corresponding group of 3 configuration memory cells that replace the previous two. It is desirable to keep die size overhead for supporting configuration memory and decoding circuits as small as possible. Thus, choice of when and how PT signals are re-steered should be made on a careful basis. More on this when we reach FIG. 7.

In FIG. 6, the SoP$_J$, sum-of-products signal of the first OR gate 633 is supplied to a post-SoP steering element 642 of allocator 640. The SoP$_J$ signal can be steered to a memory-specified one (or optionally more) of the output destinations of steering element 642 while the remaining output destinations generally receive a don't care level, typically a logic '0'.

Module 600 includes a second OR gate 645 having a plurality of input terminals 645*i* for receiving SoS$_J$ input signals and an output terminal 645*o* for producing a respective SoS$_J$ output signal. Inputs 645*i* can come from other modules (e.g., J+1, J−1, etc.) as well as coming from the same Jth module 600.

For a first example, assume that the only inputs 645*i* of second OR gate 645 are those from the SoP outputs of modules J−3 through J+3. (This series includes J itself but pretends that the J+4 and J−4 elements of illustrated inputs 645*i* are either not there for the moment or are grounded.) Assume further that the respective post-SoP steering elements (642) of macrocell modules J, J+1 and J+2 steer their respective sum-of-products signals, SoP$_J$, SoP$_{J+1}$, SoP$_{J+2}$, to the input terminals 645*i* of the SoS$_J$ OR gate 645 while the respective post-SoP steering elements (642) of remaining modules, J+3, J−1, J−2 and J−3 steer their respective sum-of-products signals, SoP$_{J+i}$ elsewhere. As a result, the SoS$_J$ output signal on line 645*o* will represent the Boolean sum of SoP$_J$, SoP$_{J+1}$, and SoP$_{J+2}$. The SoP$_{J+1}$ term, for example, is supplied from the (J+1)th macrocell module by line 643. A GiX signal (a steady logic '0') will arrive from the (J−1)th macrocell module in this example by way of line 644. The delay for producing the sum-of-three sums result of this example, SoS$_J$=SoP$_J$+SoP$_{J+1}$+SoP$_{J+2}$ will be simply the parallel gate delays through elements 630 and 642 of all modules plus the gate delay of second OR gate 645 in module J.

Note that the SoS$_J$ output of OR gate 645 can be optionally fed through one or both of post-SoS steering elements 646 and 647 to other macrocell modules. Similarly, every Nth-away macrocell module such as J−4k and J+4k (where k=1, 2, 3, etc.) can steer its respective SoS$_{J+ik}$ output to inputs 645*i* of macrocell module J.

By way of a second example, assume that the inputs 645*i* of OR gate 645 now include not only the SoP outputs of modules J−3 through J+3 but also the illustrated SoS steered outputs, 648 and 649, of modules J−4 and J+4. (Note the subtle but important difference between SoS outputs 645*o* and SoP outputs 642*o* here. SoP outputs are produced by the first OR gate 633 of their respective macrocell module while SoS outputs are produced by the second OR gate 645 of their respective macrocell module.)

Assume further for the second example that the respective post-SoP steering elements (642) of macrocell modules J and J+2 steer their respective sum-of-products signals, SoP$_J$, SoP$_{J+2}$, to the input terminals 645*i* of the SoS$_J$ OR gate 645 while the respective post-SoP steering elements (642) of remaining modules, J+1, J+3, J−1, J−2 and J−3 steer their respective sum-of-products signals, SoP$_{J+i}$ elsewhere. Assume yet further, that a post-SoS steering element (646) of macrocell module J+4 steers its respective sum-of-sums signal, SoS$_{J+4}$ by path 648 to a corresponding one of the input terminals 645*i* of the SoS$_J$ OR gate 645 while the post-SoS steering element (647) of macrocell module J−4 steers its respective sum-of-sums signal, SoS$_{J-4}$ elsewhere. As a result, the SoS$_J$ output signal on line 645*o* of macrocell module J will represent the Boolean sum of SoP$_J$, SoP$_{J+2}$, and SoS$_{J+4}$. The sum-of-sums output, SoS$_{J+4}$ of macrocell module J+4 is thereby cascaded into an input 645*i* for the SoS OR gate 645 of macrocell module J. Unlike the first example, the delay for producing this result will include serial gate delays through elements 645 of modules J+4 and J. However the number of Boolean sums that can be represented by the $SoS_J$ output signal (645o) includes the number of Boolean sums that can be represented by the $SoS_{J+4}$ output signal. As such, complexity of resultant sums can be greatly increased. The cost, of course, is the delay penalty of serially cascading macrocell modules such as J+4 (not shown) and J. Although FIG. 6 shows super-allocation of only the $SoS_{J+4}$ and $SoS_{J-4}$ signals into inputs port 645i of second OR gate 645, it is within the contemplation of the invention to have a more generic super-allocation of sums-of-sums signals of the form, $SoS_{J+ik}$ and/or $SoS_{J-ik}$ into inputs port 645i, where k=4, 8, 16, etc. and i=1, 2, 3, etc.

Moreover, it is within the contemplation of the invention to use leapfrogging values other than k=4, 8, 16, etc. in cases where the inputs port 645i of second OR gate 645 receives an appropriate number of SoP signals (e.g., more than 3) from neighboring macrocell modules and there are larger numbers of macrocells per SLB. For example, let's say there are 40 macrocells per SLB rather than 32 (a 25% increase) and that, besides receiving the four SoP's of relative modules, J−1, J (itself), J+1 and J+2, each SoS-producing gate 645 receives at its inputs port 645i, at least a fifth SoP of either relative module J−2 or J+3. In such a case, signals 648 and 649 (if both are present) would come from the steered SoS outputs of modules J+5 and J−5 respectively instead of J+4 and J−4. There would be 5 super-allocation chains and the maximal function depth of each SLB would be 5PT times 40, or 200PT's total. Further variations along this line are also contemplated. Of course, with each such change in number of macrocells per SLB, the number of MFB lines per SLB would change, the sizes of the SSM and GSM would change, the number of output points of steerer 642 would change, the number of configuration memory cells would change, and die size and signal propagation times may increase disadvantageously.

$SoS_J$ output signal (645o) is supplied to one input of XOR gate 651 while a polarity control signal 652 is supplied to the other input. The polarity-adjusted result can be routed to the D-or-T-or-L-or-C input of storage/pass-through element 660 by way of multiplexer 653. Alternatively, routing multiplexer 653 can route a desired IFB signal (I/O feedback) of the SLB or another kind of signal to the D/T/L/C input (IN) of element 660. In one embodiment, respective ones of the 16 IFB signals are fed one to each of two of the 32 macrocell modules such that each IFB signal can be stored in either selected one or both of two macrocell modules. The Q output of storage element 660 becomes the MFB (macrocell feedback) signal 661 of the corresponding macrocell module J.

The clock, reset and set terminals of storage element 660 receive respective control signals by way of respective multiplexers 655, 656 and 657, each of which is configured by a respective part of configuration memory. The routed clock, reset and set signals can respectively include G__CLK's (up to 4 such global clocks), SLB__CLK, SLB__RST and SLB__SET signals. FIG. 5 shows that these SLB__CLK, SLB__RST and SLB__SET signals can be produced by respective AND gates A160, A161 and A162 as independent PT signals. The default is a logic '0' if PT signals are not so-used for respectively generating the SLB__CLK, SLB__RST and SLB__SET signals.

Continuing in FIG. 5, the 32 MFB result signals (bus 522) of macrocells area 512 can be passed through an Output Switch Matrix (OSM) 570 for application to programmably-selected input terminals of 16 tristate drivers 526. Respective output enable (OE) terminals of tristate drivers 526 are driven by independent PT signals produced by respective AND gates A163–A178. Each of the 16 tristate drivers 526 may have an independently configurable slew rate (control not shown).

The illustrated OSM 570 is structured as a H32+V16 partially-populated switch matrix. (The H32+ part indicates that there optionally may be more than 32 horizontal lines, as will be explained.) Multiplexer size may be in the range of 4:1 through 16:1. Thus each I/O pad 516 can have an MFB signal programmably routed to it from any one of, between 4 to 16 macrocells of the same SLB (or optionally from other macrocells of other SLB's). The OSM 570 gives CPLD configuring software flexibility in placing a particular function in one macrocell and then routing it to a desired output pad 516. This feature may be used for realizing re-design PinOut-Consistency (re-design Pin-Retention). A same I/O pad may be used for a given function even though re-design causes the CPLD configuring software to shift the placement of the implementing macrocell within the SLB. The dashed plurality of $MFB_{i\pm1}$ lines 523 represent an optional addition of more horizontal shortlines that may be added into the H32+ parameter of OSM 570 so that pad 516 may receive MFB outputs from neighboring SLB's if desired. Of course this can disadvantageously increase die size and propagation time through the OSM.

Combined signal bus 528 is formed, as already explained, by combining the 32 MFB signals of bus 522 with the 16 IFB signals of bus 517 to thereby provide 48 feedback signals (MFB+IFB) per SLB. Each bus 528 of each of four SLB's in a segment (201 in FIG. 2) are combined to define the 192 lines of bus 529. Bus 529 feeds into SSM 550. V384 section 551 can therefore simultaneously carry all the feedback signals (MFB+IFB) of the four SLB's 210–240 of its segment. Intra-segment communications can therefore be provided at the full 100% level irrespective of what happens at the inter-segment (global) communications level. In other words, each segment can operate as its own, fully contained and independent mini-CPLD.

Each of the 48 lines of bus 528 further feeds into a respective 1:3 demultiplexer on GSM 580. Peanut symbol 583 represents one such 1:3 demultiplexer among a plurality of like but staggered demultiplexers. Line 581 represents an exemplary, GSM-feeding line among the 48 lines of bus 528. In one embodiment, the 1:3 DEMUX 583 couples to respective longlines of the GSM such as line 587 by passing its respective, demultiplexed signal 581 through a configurable multiplexer 584 that can further receive other like demultiplexed signals from the respective other 1:3 demultiplexers (583) of other segments. The output of exemplary multiplexer 584 is applied to a tristate longline driver such as 586. While not explicitly shown in FIG. 5, it is to be understood that each GSM longline (e.g., 587) will generally have a plurality of tristate longline drivers such as 586 coupled to the GSM longline for driving their respective signals (e.g., 581) onto the GSM longline. Contention may be avoided on each GSM longline by enabling no more than the output of one such tristate longline driver at a time for the given longline. The OE (output enable) control terminals of the tristate longline drivers 586 may be controlled either statically by configuration memory or dynamically by applying steered product terms to such OE control terminals.

The 384 horizontal longlines of GSM 580 (of which 587 is an exemplary one) cross with 192 vertical shortlines of bus 585. The 384 times 192 resulting crosspoints are partially-populated by 8:1 multiplexers such as 588. Signal routability from any given GSM line such as 587 to a desired SSM (e.g., 550) is therefore 192×8 divided by 384, or 4-ways per GSM H-line.

External signals can be fed into the CPLD from the pins of nonburied ones of pads 516. The input path of such externally-supplied signals can be purely intra-segment, such as moving from pad 516, through input buffer 536 and through IFB bus 517 directly to macrocells area 512. For the embodiment of FIG. 6, this direct path 517 into MCA 512 continues into multiplexer 653. The externally-supplied signal can then be temporarily stored in element 660 for synchronization with a chip-internal clock (655) or it can be passed through asynchronously onto MFB bus 522 if storage element 660 is in one of the latch (L) or combinatorial (C) modes.

The input path of an externally-supplied signal can additionally or alternatively be a global one (inter-segment). The signal can propagate from pad 516, through input buffer 536 and through a GSM-feeding line 581 into the Global Switch Matrix 580. From there, it can be broadcast into any one or more segments, as desired, by way of the 192 per segment, 8:1 multiplexers 588.

A summarizing review of FIG. 5 shows that, a particular CPLD architecture has been developed that features a two-tiered hierarchical switch matrix construct. The two-tiered hierarchical switch matrix construct has a Global Switch Matrix (e.g., GSM 580) and a plurality of Segment Switch Matrices (e.g., SSM 550). Coupled to each SSM is an even plurality of at least four programmable logic blocks (e.g., SLB 510, see also 210–240 of FIG. 2). Each SSM and its even number of SLB's define a segment (201) that couples to the GSM for both injecting SLB result signals 522 and/or I/O pin input signals 536 into (528, 581) the GSM and for extracting (588) globally-provided signals (585) from the GSM for input (511) into each SLB of a given segment.

Each SLB has at least 80 complementable inputs (521) and can generate product term signals (PT's) that are Boolean products of as many as 80 independent input terms. With use of allocation (560, 640), large sums of such large PT's may be produced in each SLB. Each sum-of-products signal (MFB 522) can take on the expressive form:

$$f_{SoP}=\Sigma^{N-5+}(Xi \cdot PTi^{Ki/80/384})$$  {Exp. B1'}

Some of the product terms generated within each SLB are dedicated to SLB-local controls such as SLB-wide clock, set and reset controls (A160–A162) and such as I/O drive enable controls (A163–A178).

Each SLB has at least 32 macrocells and at least 16 I/O pads (buried or nonburied) which feedback to both to the local SSM (by way of path 528) and to the global GSM (by way of multiplexers 588). Each SSM has dedicated for intra-segment communications, at least as many longlines (48×4) as there are macrocells (32×4) and I/O pads (16×4) in the segment, thereby assuring that every macrocell signal (MFB) and I/O signal (IFB) can be simultaneously transmitted through the SSM.

The 80 parallel inputs (511) of each SLB ease implementation of 64-bit wide designs. Each segment has at least 64 I/O pads (516). Symmetry within the design of each segment allow for more finely-granulated implementations such as for 32 or 16-bit wide designs. A convenient migration path is therefore provided by one unified architecture for implementing 16-bit wide designs (e.g., bus 122 of FIG. 1), and/or 32-bit wide designs (e.g., bus 127 of FIG. 1), and/or 64-bit wide designs (e.g., bus 112 of FIG. 1).

Figure 7:
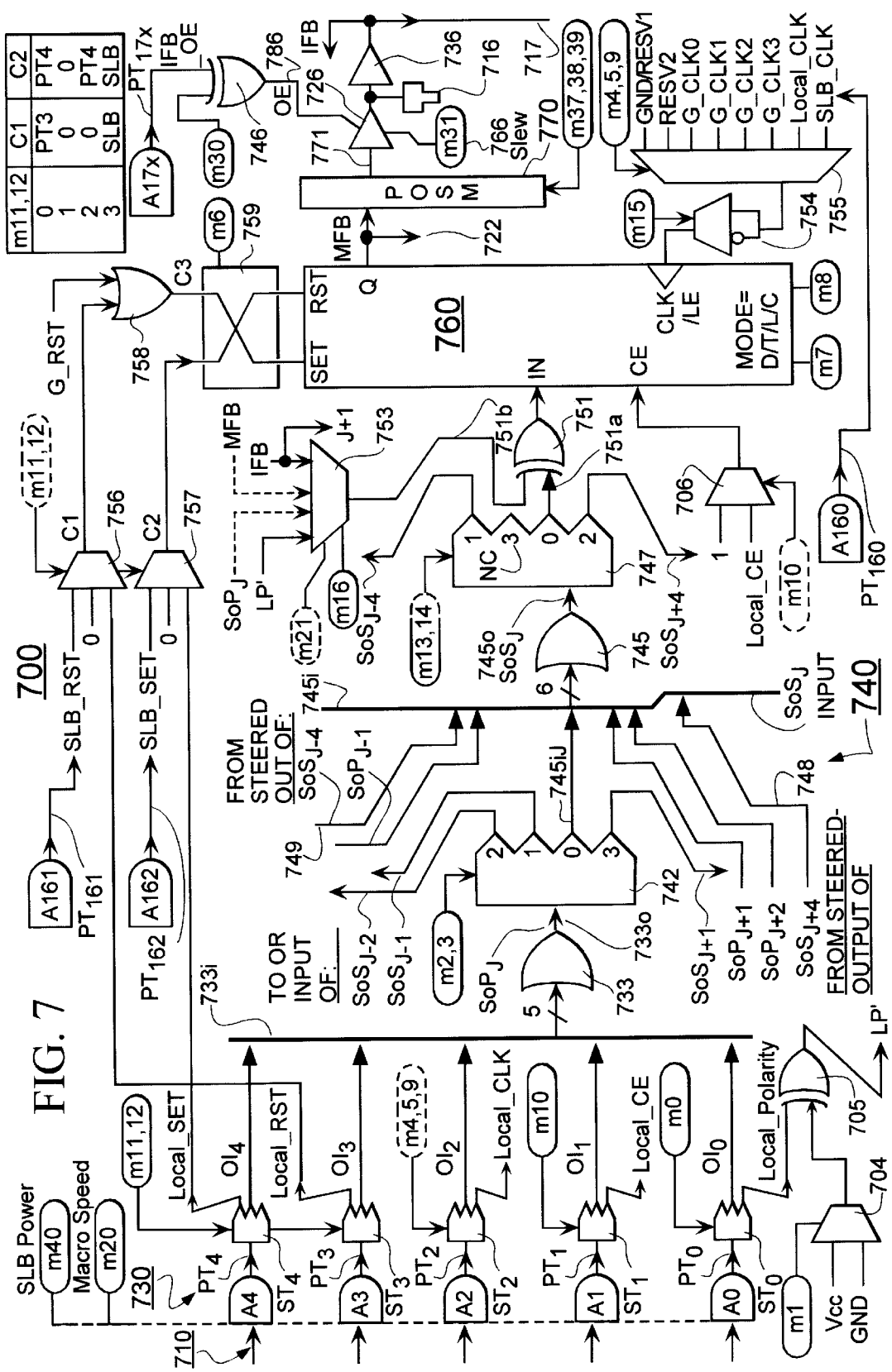
FIG. 7 is a schematic depicting a set of more specific structures for macrocell modules that may be used within the SLB structure of FIG. 5.

FIG. 7 is a schematic illustrating a specific set of embodiments of a storage macrocell module 700 in accordance with the invention. Where practical, reference numerals in the '700' century series are used in FIG. 7 to refer to elements that have corresponding counterparts in FIG. 6, where the latter are identified by reference numerals in the '600' century series.

As such, each of the illustrated set of five AND gates A0–A4 obtains a respective subset of up to Kmax independent SLB input signals 710 and generates a responsive product term signal, PTi. Each of the five AND gate circuits, A0–A4 can be forced to output a constant logic '0' and/or a constant logic '1' by using techniques described above or equivalents thereof. A first configuration memory cell m40 is shown even though it was described above and it is understood to control sense amplifier power of the whole SLB by turning such power on or off. A second configuration memory cell m20 is shown coupling to just the 5 AND gate circuits, A0–A4 of the illustrated macrocell module 700. When switched out of its default state, m20 reduces the power consumption of the AND gate sense amplifiers by about 50%. In one embodiment, this power reduction slows the response time of AND gate circuits, A0–A4 by about 2 to 5 nS so that global pin-to-pin delay is around 12–15 nS instead of around 10 nS. It is useful in applications (e.g., battery powered ones) where reduced power consumption may be more valuable than fast speed. Power reduction is controllable on a module-by-module basis so that it is possible to place only those modules which carry speed critical signals in the higher power mode while the remainder are in a lower power mode.

The respective outputs of AND gates A0–A4 drive respective steering elements ST0–ST4. The non-steered or default output terminals of steering elements ST0–ST4 are respectively designated as $OI_0$–$OI_4$ and are coupled to respectively five input terminals of first OR gate 733.

Steering element ST0 is controlled by configuration memory cell m0 to steer PT0 either towards $OI_0$ or away therefrom and to an input of a first XOR gate 705. If steered-away to gate 705, the PT0 product term signal can function as a local polarity control for the macrocell module 700. Alternatively, the steered-away PT0 signal can function as a single product term output of the macrocell (if input terminal 751a of a second XOR gate 751 is held constant by techniques described below). When steered-away PT0 signal functions as a single product term output, a sum of others of the acquired PTi's of the same macrocell may be steered to neighboring macrocells. (This will be better understood after elements 742 and 747 are described in more detail.)

Configuration memory cell m1 drives a 1/0-selecting multiplexer 704 whose output couples to a second input of first XOR gate 705. If m1 is at logic '1', the 1/0-selecting multiplexer 704 outputs Vcc whereas, if m1 is at logic '0', multiplexer 704 provides the ground level (GND) at its output. In an alternate embodiment, configuration memory cell m1 couples directly to the second input of XOR gate 705. Either technology (direct or indirect through a multiplexer such as 704) may be used in the rest of the illustrated circuitry as appropriate. Generally, the indirect approach is used in conjunction with floating gate types of (EEPROM-based) configuration memory.

The LP' output signal of gate 705 couples to an input of a below-described multiplexer 753 and follows the local polarity output of steering element ST0 if cell m1 cause a logic '0' to be applied to gate 705. Otherwise, the LP' output signal is defined by the inverse of the local polarity output of steering element ST0 if cell m1 causes a '1' to be applied to first XOR gate 705.

If steering element ST0 steers PT0 to $OI_0$, then the local polarity output of ST0 is at a constant default level, for example '0'. In such a case, cell m1 defines the value of LP', where the latter is also referenced here as the adjusted local polarity signal LP'. The combination of cells m0 and m1 therefore define four possible configurations for the LP' signal, namely, a constant '0', a constant '1', steered-away PT0, and the NOT of steered-away product term, PT0.

Steering element ST1 is controlled by configuration memory cell m10 to steer PT1 either towards $OI_1$ or away therefrom and to an input of CE multiplexer 706. If steered-away to multiplexer 706, the PT1 product term signal can function as a local clock-enable (CE) control for the macrocell module 700. CE control can therefore be provided on a macrocell-by-macrocell basis. If memory cell m10 does not steer PT1 to be the local clock-enable, cell m10 causes multiplexer 706 to output a '1' to the CE terminal of storage/pass-through element 760.

Steering element ST2 is controlled by a decoding of configuration memory cells m4, m5 and m9 to steer PT2 either towards $OI_2$ or away therefrom and to an input of multiplexer 755. If steered-away to multiplexer 755, the PT2 product term signal can function as a local clock for the macrocell module 700. The decoding of configuration memory cells m4, m5 and m9 defines up to 8 possible configurations, including the selecting of one of the following 6 signals to serve as the clock source for storage/pass-through element 760: Local_CLK (the steered-away PT2), SLB-CLK (obtained from A160), G_CLK0, G_CLK1, G_CLK2, and G_CLK3.

The other two states of the m4,5,9 combination are reserved for future expansion uses and are defined as RESV1 and RESV2. In one alternate embodiment, RESV1 is replaced by GND and this is defined as the default programming state for the m4,5,9 combination if the latter is not affirmatively programmed to a different state by boundary-scan programming or the like. The GND state may be used to inhibit switching noise in cases where storage element 760 is not to respond to clock signals (e.g., such as when it is in combinatorial (C) mode). The GND state may be used in conjunction with the state of m15 to define the CLK/LE level when storage element 760 is in latch mode.

Other possible uses for one or both of the RESV1 and RESV2 inputs include: (a) increasing the number of global clocks to 5 or 6 and using the one or two extra two reserve states for selecting those additional global clocks; (b) defining a semi-global clock for two or more segments but less than all and selecting that semi-global clock with one of the extra two states; (c) using the SLB_CLK as the output of multiplexer 755 while steering-away PT2 as a local OE control (applied via a MUX, not shown, to IFB_OE input of a third XOR gate 746—described below); and (d) using the Local_CLK (PT2) as the output of multiplexer 755 while steering SLB_CLK to serve as the CE input of the local register. Note that there is no need for a separate, segment-wide clock because that can be implemented by configuring all SLB's of a given segment to generate a same SLB_CLK internally and then configuring all multiplexers 755 of the given segment to select the SLB_CLK.

The combination of configuration memory cell m15 and multiplexer 754 control the polarity of the clock signal applied to storage/pass-through element 760. Thus, when element 760 is in the D-type or T-type flipflop modes, its edge sensitivity is defined by the programming of cell m15. Configuration memory cells m7 and m8 define the D/T/L/C mode of storage/pass-through element 760.

In one embodiment, the D/T/L/C modes of storage/pass-through element 760 operates as follows. In combinatorial (C) mode, IN signals pass through to the Q output without any storage taking place and without being affected in any way by the SET, RST, CE and CLK/LE controls.

In the D-flipflop (D) mode, IN data is latched into the register on the rising edge of CLK if CE is high. If CE is low, the IN and CLK inputs will not affect the storage state of the register. SET and RST can affect the storage state of the register asynchronously. Both should not be high simultaneously. The behavior of the D-flipflop (D) mode is summarized in TABLE 1.1.

TABLE 1.1

| CLK | CE | RST | SET | Q |
|-----|----|----|-----|---|
| X | 0 | 0 | 0 | Q |
| X | X | 0 | 1 | 1 |
| X | X | 1 | 0 | 0 |
| 0 | 1 | 0 | 0 | Q |
| 1 | 1 | 0 | 0 | IN |

In the T-flipflop (T) mode, the storage state of the register is toggled on the rising edge of CLK if CE is high and IN is high. If either CE or IN is low, the CLK input will not affect the storage state of the register. SET and RST can affect the storage state of the register asynchronously. Both should not be high simultaneously. The behavior of the T-flipflop (T) mode is summarized in TABLE 1.2.

TABLE 1.2

| CLK | CE | RST | SET | IN | Q |
|-----|----|----|-----|----|----|
| X | 0 | 0 | 0 | X | Q |
| X | X | 0 | 1 | X | 1 |
| X | X | 1 | 0 | X | 0 |
| 0 | 1 | 0 | 0 | X | Q |
| 1 | 1 | 0 | 0 | 0 | Q |
| 1 | 1 | 0 | 0 | 1 | /Q |

There are two alternate embodiments for latch (L) mode. In the first embodiment of latch (L) mode, the CE terminal should be constantly held at logic '1'. IN data is then latched into the register on the falling edge of the CLK/LE input (clock/latch enable). SET and RST can affect the storage state of the register asynchronously. Both should not be high simultaneously. The behavior of this first embodiment of Latch (L) mode is summarized in TABLE 1.3.

TABLE 1.3

| CLK/LE | CE | RST | SET | Action |
|--------|----|----|-----|--------|
| Falling | 1 | 0 | 0 | Store and Q = IN |
| 0 | 1 | 0 | 1 | Set Q = 1 |
| 0 | 1 | 1 | 0 | Reset, Q = 0 |
| 1 | 1 | X | X | Q = IN but no storage |

In the second embodiment of latch (L) mode, the CE signal may be time varying. IN data is latched into the register on the falling edge of the CLK/LE input (clock/latch enable) if CE is then high. Additionally, IN data is latched into the register on the falling edge of CE if CLK/LE is then high. The behavior of this second embodiment of Latch (L) mode is summarized in TABLE 1.4.

TABLE 1.4

| CLK/LE | CE | RST | SET | Action |
|---|---|---|---|---|
| Falling | 1 | 0 | 0 | Store and Q = IN |
| 1 | Falling | 0 | 0 | Store and Q = IN |
| 0 | X | 0 | 1 | Set Q = 1 |
| 0 | X | 1 | 0 | Reset, Q = 0 |
| 1 | 1 | X | X | Q = IN but no storage |

Steering elements ST3 and ST4 are both controlled by a decoding of configuration memory cells m11 and m12, as further are multiplexers 756 and 757. Multiplexer 756 receives as three respective inputs thereof, a logic '0', the steered-away PT3 signal, and the SLB_RST signal (PT-161). Multiplexer 757 receives as three respective inputs thereof, a logic '0', the steered-away PT4 signal, and the SLB_SET signal (PT-162). Multiplexer 756 generates a first asynchronous control signal, C1 that is selected from its three inputs and is thereafter ORred together with global reset signal G_RST by gate 758 to define a C3 signal which normally functions as a reset signal for storage/pass-through element 760. Multiplexer 757 generates a second asynchronous control signal, C2 which defines the normal SET signal for storage/pass-through element 760. Unit 759 includes a DPDT cross switch that is controlled by configuration memory cell m6. If activated by m6, cross switch 759 enters into the non-normal mode and swaps the connections of C2 and C3 to instead couple respectively to the RST and SET terminals of element 760 instead of to their normal and respective couplings to SET and RST. Unit 759 further includes logic for preventing logic '1' to be simultaneously applied to the SET and RST terminals of storage element 760. If both of C2 and C3 are at logic '1', then C3 dominates to thereby force a RESET if unit 759 is in normal mode or to force a SET if unit 759 is in the function-swapping mode.

The decoding of configuration memory cells m11 and m12 provide four configurations as defined by TABLE 2.

TABLE 2

| m11 | m12 | C1 | C2 | OI-3 | OI-4 |
|---|---|---|---|---|---|
| 0 | 0 | PT3 | PT4 | 0 | 0 |
| 1 | 0 | 0 | PT4 | PT3 | 0 |
| 0 | 1 | 0 | 0 | PT3 | PT4 |
| 1 | 1 | SLB RST | SLB SET | PT3 | PT4 |

The asynchronous control of storage/pass-through element 760 can accordingly be provided from a global signal (G_RST) which can be routed on a macrocell by macrocell basis through each cross switch 759 to either the RST or SET terminal of the corresponding storage/pass-through element 760 so as to establish a pre-loaded data word in the storage elements 760 of plural macrocells during a global, power-up reset (PU G_RST). Alternatively, the SLB_RST signal (PT161) can perform a similar function on an SLB by SLB basis for the corresponding macrocells of each SLB. Supplementally, the SLB_SET signal (PT162) can perform a complementary function on an SLB by SLB basis for the corresponding macrocells of each SLB. (If in normal mode, and not reset by C3, the state of a storage element 760 can be either left unchanged or it can be switched to the SET state by activation of C2.) If for some reason, a desired resetting or setting of a given storage element 760 cannot be achieved on a global or SLB by SLB basis, then one or both of PT3 and PT4 may be steered-away from respective OR input terminals OI-3 and OI-4 and used to generate corresponding signals, C1 and C2. Note that both of the SET and RST functions of each macrocell module can be simultaneously of the local kind. Thus, by using the dominant C3 attribute of swapping element 759, each macrocell module can provide the asynchronous function of: set per local PT4 unless reset by either local PT3 or the G_RST signal. Also either or both of SLB_RST and SLB_SET can be blocked (inhibited) from affecting a particular module within the SLB by programming respective multiplexers 756 and 757 to output either logic '0' or the local product term signal, PT3 and PT4.

First OR gate 733 (the SoP-producing gate of module J) receives those of product terms PT0–PT4 that are not steered-away by their respective steering elements ST0–ST4 and it receives logic '0' (GiX) in place of those PT's that are steered-away (stolen). The resulting sum-of-products signal, $SoP_J$ is applied to the IN terminal of 1-to-1 of 4 steering element 742. Configuration memory cells m2 and m3 determine which of the four output points (numbered 0–3) of steerer 742 will produce the $SoP_J$ signal while the other 3 output points produce a GiX=0 signal.

A first of the output points of steerer 742 is designated as 742-0 and it couples to a corresponding, first input 745iJ of second OR gate 745 (the SoS-producing gate of module J). The combined inputs of SoS-producing gate 745 are referenced as inputs port 745i. The output of SoS-producing gate 745 is referenced as 745o.

A second of the output points of steerer 742 is designated as 742-1 and it couples to a corresponding input of the SoS-producing gate (like 745) of an immediately-adjacent macrocell module, J−1. A third one of the output points of steerer 742 is designated as 742-2 and it couples to a corresponding input of the SoS-producing gate (745) of a next-adjacent macrocell module, J−2. The fourth one of the output points of steerer 742 is designated as 742-3 and it couples to a corresponding input of the SoS-producing gate (745) of another immediately-adjacent macrocell module, J+1. Thus, the $SoP_J$ output of OR gate 733 may be steered to contribute to the SoS result of any of neighboring modules J−2, J−1, J or J+1.

Second OR gate 745 (the SoS-producing gate of module J) can receive at least the steered SoP results produced by gate 733 or its equivalent in neighboring modules J+2, J+1, J and J−1. Thus, module J can steer a first 5-PT's signal, $SoP_J$ to the respective inputs port 745i of gate 745 while at the same time each of other modules J+2, J+1, and J−1 can steer corresponding second through fourth ones of 5-PT's signals to the respective inputs port 745i of gate 745. The sums-of-sums output 745o of gate 745 can thereby represent a function of up to 20 independent PT's by such action.

The resulting sums-of-sums signal, $SoS_J$ produced by gate 745 is applied to the IN terminal of, what in one embodiment is, a second 1-to-1 of 4 steering element 747. Configuration memory cells m13 and m14 determine which of the four output points (numbered 0–3) of steerer 747 will produce the $SoS_J$ signal while the other 3 output points produce a GiX=0 signal. In first and second alternate embodiments, configuration memory cell m14 is left out, output point 3 (also referenced as an NC or No-Connection point) is left out, and a respective one of output points 747-1 and 747-2 is left out. The result of these first and second alternate embodiments is thus, a use of less configuration memory space (which could result in smaller die size), less loading on the output 745o of the SoS-producing gate of each macrocell (which could result in less delay), fewer steering choices for the $SoS_J$ signal, and therefore, less flexibility for the CPLD configuring software. The embodiments in which one of output points 747-1 and 747-2 is left out will be occasionally referred to below as embodiments that have only 'unidirectional' super-allocating functionality.

A first of the output points of steerer 747 is designated as 747-0 and it couples to a first input, 751a of second XOR gate 751. The output of XOR gate 751 couples to the IN input terminal of storage element 760. A second input, 751b of XOR gate 751 is driven by multiplexer 753. In one embodiment, multiplexer 753 is a 2-to-1 multiplexer controlled by configuration memory cell m16 and receiving LP' and IFB as input signals. In a second embodiment, multiplexer 753 is a 4-to-1 multiplexer controlled by configuration memory cells m16 and m21 and further receiving $SoP_J$ and $MFB_J$ as input signals. If the $SoS_J$ signal (745o) is steered to XOR input 751a while XOR input 751b is held at logic '0', then the $SoS_J$ signal will be applied to the IN terminal of storage element 760. If, instead, XOR input 751b is held at logic '1' while $SoS_J$ signal (745o) is steered to output point 0 of steerer 747, then the inverse of the $SoS_J$ signal will be applied to the IN terminal of element 760. As known in the art, under DeMorgan's well known theorem, inversion of a Boolean sum (e.g., $SoS_J$) causes it to appear as a product of its complemented terms. Thus, the functionally-rich, sums-of-sums that is defined by output 745o of the SoS-producing gate of module J can be further enriched by selectively inverting or not inverting it.

Multiplexer 753 can be programmably configured to pass the LP' signal to XOR input 751b. As already explained, there are four possible configurations for LP', namely, '0', '1', steered-away PT0, and the NOT of steered-away PT0. If PT0 or its inverse is used for driving XOR input 751b, then the loss of contribution by the steered-away PT0 to the $SoP_J$ signal is counterbalanced by the functional richness which PT0 brings to the XORing by gate 751 of itself (PT0) with the $SoS_J$ signal (745o).

If the $SoS_J$ signal is steered-away from output point 747-0 then that output point generates a GiX=0 level. In that case, multiplexer 753 can be programmably configured to pass a desired one of the LP' signal or IFB signal through XOR gate 751 without inversion. In this mode, XOR gate 751 functions essentially like a gateway for porting IFB into storage element 760 while the $SoS_J$ signal is steered elsewhere. Note that when the $SoS_J$ signal is instead steered to output point 747-0 and XOR input 751b is held constant at '0' or '1', that the passage of the $SoS_J$ signal into storage element 760 is not delayed by multiplexer 753. Multiplexer 753 is out of the direct delay path of the $SoS_J$ signal.

In the alternate embodiments where multiplexer 753 has 3 or more inputs rather than just the two for LP' and IFB, the path through multiplexer 753 may be used as a shortcut (less delay) by the $SoP_J$ signal (733o). The $SoP_J$ signal may be routed through multiplexer 753 as indicated by a first dashed input into unit 753 in order to have $SoP_J$ bypass steering elements 742 and 747 and OR gate 745. This shortcut-routed $SoP_J$ signal may then be applied to XOR input terminal 751b while a '0' is applied to other terminal 751a because, for example, steerer 747 is steering $SoS_J$ away from output point 747-0. Alternatively, the shortcut-routed $SoP_J$ signal may be applied to XOR input terminal 751b while steerer 747 is steering $SoS_J$ to output point 747-0. The shortcut-routed $SoP_J$ signal will then be XORred with the $SoS_J$ signal. Note that the $SoS_J$ signal (745o) does not necessarily contain $SoP_J$ in its sum. (But if it did, that would constitute a Boolean don't care situation because $SoP_J$ XORred with itself generates a zero term.) Steerer 742 may be steering $SoP_J$ (733o) out of module J while in other modules, the corresponding SoP steerer is steering its respective $SoP_{(J \pm i)}$ signal to one of the inputs 745i of OR gate 745.

Alternatively or additionally, another of the additional (dashed) inputs of multiplexer 753 may be used to feedback the MFB signal of this macrocell module J through line 751b to XOR gate 751. Once again, a constant '0' may be applied to the other terminal 751a of the XOR gate because, for example, steerer 747 is steering $SoS_J$ away from output point 747-0. Different effects may be achieved with such a configuration depending on whether storage element 760 is in the D or T or L or C mode and depending on what control signals are concurrently applied to the SET and RST terminals of storage element 760.

Alternatively, the fedback $MFB_J$ signal may be applied to XOR input terminal 751b while steerer 747 is steering $SoS_J$ to output point 747-0. The fedback $MFB_J$ signal will then be XORred with the $SoS_J$ signal. Note that such feedback XORring may be used to implement part of a binary adder/counter. By way of another example, the pre-stored MFB signal may represent a pre-calculated, expected bit state (e.g., pre-calculated parity) and the incoming signal at terminal 751a may represent a currently-defined bit state (e.g., actual parity) that is to be compared with the pre-calculated, expected bit state. In such a case, XOR gate 751 can provide such a comparison function and store the comparison result in storage element 760.

Continuing with our detailed examination of steerer 747, a second of its output points is designated as 747-1 and couples to an input of the SoS-producing gate of module J-4. A line corresponding to 748 in that (J-4)th macrocell module would then receive the $SoS_J$ signal if the latter is steered to point 747-1.

A third one of the output points of steerer 747 is designated as 747-2 and it couples to an input of the SoS-producing gate of module J+4. A line corresponding to 749 in that (J+4)th macrocell module would then receive the $SoS_J$ signal if the latter is steered to point 747-2.

A fourth one of the output points of steerer 747 is designated as 747-3 and it does not couple to any further point in the SLB. If the $SoS_J$ signal is steered-away to output point 747-3, then each of other points 747-0, 747-1 and 747-2 produces the GiX=0 level. This state may be used for passing an input of multiplexer 753 through XOR gate 751 without alteration to the IN terminal of storage element 760.

The Q output of storage/pass-through element 760 defines the $MFB_J$ signal of the illustrated macrocell module J. As already explained, in one embodiment, $MFB_J$ may be fed back to multiplexer 753. The $MFB_J$ signal further continues along line 722 for feeding into the GSM and local SSM. $MFB_J$ is further applied to Pad Output Switch Matrix (POSM) 770. Each pad 716 has its own POSM 770. The combination of all POSM's 770 of the pads 516 of an SLB (see FIG. 5) define the OSM 570 of that SLB 510. In the embodiment illustrated in FIG. 7, the $MFB_J$ signal constitutes one of 8 macrocell feedback signals that are input into POSM 770. Configuration memory cells m37, m38, and m39 are used to select which MFB signal is routed to the pad 716 associated with POSM 770. In an alternate embodiment, m39 is removed and POSM 770 is thereby allowed to select only one of 4 MFB signals for routing to pad 716. In yet another alternate embodiment, a fourth configuration memory cell is added to the group, m37,38,39 and POSM 770 is thereby allowed to select one of 16 different MFB signals for routing to pad 716.

In one specific embodiment, the following four macrocell modules: MM0, MM1, MM2 and MM3 are defined as tail ends (output ends) or head ends of maximal super-allocation chains (assuming no wrap-around). The following, maximal super-allocation chains are defined: ChainA=MM0+MM4+ MM8+MM12+MM16 plus others, ChainB=MM1+MM5+ MM9+MM13+MM17 plus others, ChainC=MM2+MM6+ MM10+MM14+MM18 plus others, and ChainD=MM3+ MM7+MM11+MM15+MM19 plus others. See below TABLE 4.6 for a more detailed explanation of all the macrocell modules that are consumed by each maximal, super-allocation chain. PIP's of POSM 770 may be patterned such that each maximal super-allocation chain can output its maximal super-allocation result to one of four I/O pads. TABLE 3 illustrates such a patterning of PIP's where the 8 PIP's of each I/O pad are identified by the chain they service. The leftmost vertical column identifies the I/O pad number as one of the series 00, 01, 02, . . . , 15. The topmost horizontal row identifies macrocell modules as being numbered 0 through 31 inclusively. Note that if macrocell module MM0 forms the tail end of super-allocation chain A, the maximal super-allocation result of chain A can be routed to any one of I/O pads 00, 01, 02 or 03. Similarly, if macrocell module MM30 forms the tail end of super-allocation chain C, the maximal super-allocation result of such a chain C can be routed to any one of I/O pads 12, 13, 14 or 15. As will be seen, only one chain can produce the maximal super-allocation result at a time because such maximal super-allocation consumes essentially all (up to 160PT's) of the summable product terms of the corresponding SLB.

A super-allocation chain can be divided into two subchains that concurrently produce half-maximal super-allocation results (about 80PT each). Each such subchain consumes a respective half of the summable product terms of the corresponding SLB. Similarly, a super-allocation chain can be divided into four subchains that concurrently and respectively produce four quarter-maximal super-allocation results (about 40PT each). TABLE 3 may be used by CPLD configuring software to determine which I/O pads can have the output of a given super-allocation chain or subchain routed to that pad.

The output line of POSM 770 is shown at 771 of FIG. 7. OSM output line 771 feeds tristate pad driver 726 and the latter can be used to drive an output signal onto corresponding pad 716.

I/O pad 716 is shared for purposes of inputting an external signal by a respectively assigned pair of macrocells, which pair may or may not be the illustrated macrocell module J and a next immediate module J+1.

One or more configuration memory cells such as m31 couple to a slew control terminal 766 of pad driver 726 for defining a corresponding one or more of rising edge and falling edge slopes of the outputs of pad driver 726.

OE control terminal 786 of the pad driver receives output enable (OE) signals from XOR gate 746. An IFB_OE input of the XOR gate receives a PT-17X signal from product term AND gate A17$x$, where PT-17X is a corresponding one of signals PT-163 through PT-178 (see FIG. 5) that is assigned to pad 716 and AND gate A17$x$ is a corresponding one of gates A163 through A178. Configuration memory cell m30 controls a second input of XOR gate 746 so as to either pass the PT-17X signal or its Boolean complement through XOR gate 746. Pad 716 may be either a nonburied pad that connects to an external package pin (not shown) or a buried pad which does not connect to an external package pin.

Note that configuration memory cells m30 and m31 of the illustrated embodiment repeat in each SLB on a pads-per-SLB basis. The pads-per-SLB repetition rate can be less than the macrocells-per-SLB rate. In the illustrated example, external I/O signals acquired by pad 716 are directed to respective multiplexers 753 of a corresponding pair of odd and even numbered macrocell modules (J and J+1) and thus it is seen that the pads-per-SLB repetition rate is half of the macrocells-per-SLB rate for this embodiment. It is within the contemplation of the invention however to provide different pads-to-macrocells ratios such as 1:1. The point is that each pad driver 726 within a given SLB receives a respective one of a set of product term signals (PT-17X) and this PT-17X signal can be DeMorganized (inverted) on a per pad basis so as to provide a rich spectrum of OE control.

Configuration memory cells m0 through m16 and m20–m21 (where among these m14 and m21 are optional) each repeats in each SLB on a per macrocell basis. Control on a per macrocell basis is therefore provided for the following functions: steering PT0 (controlled by m0); adjusting the polarity of LP' (m1); controlling steerer 742 (m2 and m3); steering PT2 and also selecting the clock

TABLE 3

| MACROCELL NUMBER | | | | | | | | | | | | | | | | | | | | | | | | | | | | | | | |
|---|---|---|---|---|---|---|---|---|---|---|---|---|---|---|---|---|---|---|---|---|---|---|---|---|---|---|---|---|---|---|---|
| IG | 0 | 1 | 2 | 3 | 4 | 5 | 6 | 7 | 8 | 9 | | | | | | | | | | | | | | | | | | | 29 | 30 | 31 |
| 00 | A | B | C | D | A | B | C | D | | | | | | | | | | | | | | | | | | | | | | | |
| 01 | A | B | C | D | | | C | D | A | B | | | | | | | | | | | | | | | | | | | | | |
| 02 | A | B | C | D | A | B | | | C | D | | | | | | | | | | | | | | | | | | | | | |
| 03 | A | B | | | A | B | C | D | C | D | | | | | | | | | | | | | | | | | | | | | |
| 04 | | | C | D | A | B | | | C | D | A | B | | | | | | | | | | | | | | | | | | | |
| 05 | | | | | C | D | A | B | | | A | B | C | D | | | | | | | | | | | | | | | | | |
| 06 | | | | | | | A | B | C | D | A | B | C | D | | | | | | | | | | | | | | | | | |
| 07 | | | | | | | A | B | | | | | C | D | A | B | C | D | | | | | | | | | | | | | |
| 08 | | | | | | | | | A | B | C | D | A | B | | | C | D | | | | | | | | | | | | | |
| 09 | | | | | | | | | | | A | B | C | D | A | B | C | D | | | | | | | | | | | | | |
| 10 | | | | | | | | | | | A | B | C | D | | | C | D | A | B | | | | | | | | | | | |
| 11 | | | | | | | | | | | | | C | D | A | B | | | | | C | D | A | B | | | | | | | |
| 12 | | | | | | | | | | | | | A | B | | | A | B | C | D | | | C | D | | | | | | | |
| 13 | | | | | | | | | | | | | A | B | | | | | C | D | A | B | C | D | | | | | | | |
| 14 | | | | | | | | | | | | | C | D | A | B | | | A | B | C | D | | | | | | | | | |
| 15 | | | | | | | | | | | | | | | A | B | C | D | A | B | C | D | | | | | | | | | | signal (m4, m5 and m9); swapping the controls for SET and RST (m6); selecting the operating mode of storage/pass-through element 760 (m7 and m8); steering PT1 to serve as the local CE control or otherwise setting CE high (m10); steering one or both of PT3 and PT4 to serve as the local SET and RST controls or otherwise setting one or both of the local SET and RST controls low (which setting can be overridden by G_RST) or otherwise supplying the SLB-wide controls, SLB_SET and SLB_RST to the local controls (m11 and m12); controlling steerer 747 (m13 and m14); controlling local clock polarity (m15); selecting the input to XOR terminal 751b (m16 and optionally, also m21); and putting the module in a lower-power, slower speed mode (m20).

Configuration memory cells m30–m31 and m37–m39 each repeats in each SLB on a per pad basis. Control on a per I/O pad basis is therefore provided for the following functions: DeMoraganizing the OE product term signal (m30); controlling the pad driver's slew rate (m31); and routing an MFB signal from one of, up to eight selectable macrocell modules to a given I/O pad (m37, m38, m39).

Configuration memory cells m40 each repeats once in each SLB. Control on a per SLB basis is therefore provided for minimizing power draw by all the PT-producing AND gates of the SLB if not needed.

Input buffer 736 receives input signals from pad 716 and drives them onto IFB line 717. Line 717 couples to the GSM and the local SSM. Also, as already explained, pad 716 is shared for purposes of inputting its signal by a respectively assigned pair of macrocells, which pair may be the illustrated macrocell module J and a next module J+1. The IFB output of buffer 736 is therefore understood to be coupled to the IFB input of multiplexer 753 to a similar multiplexer input in module J+1, or more generically speaking, in module J+i.

Figure 8:
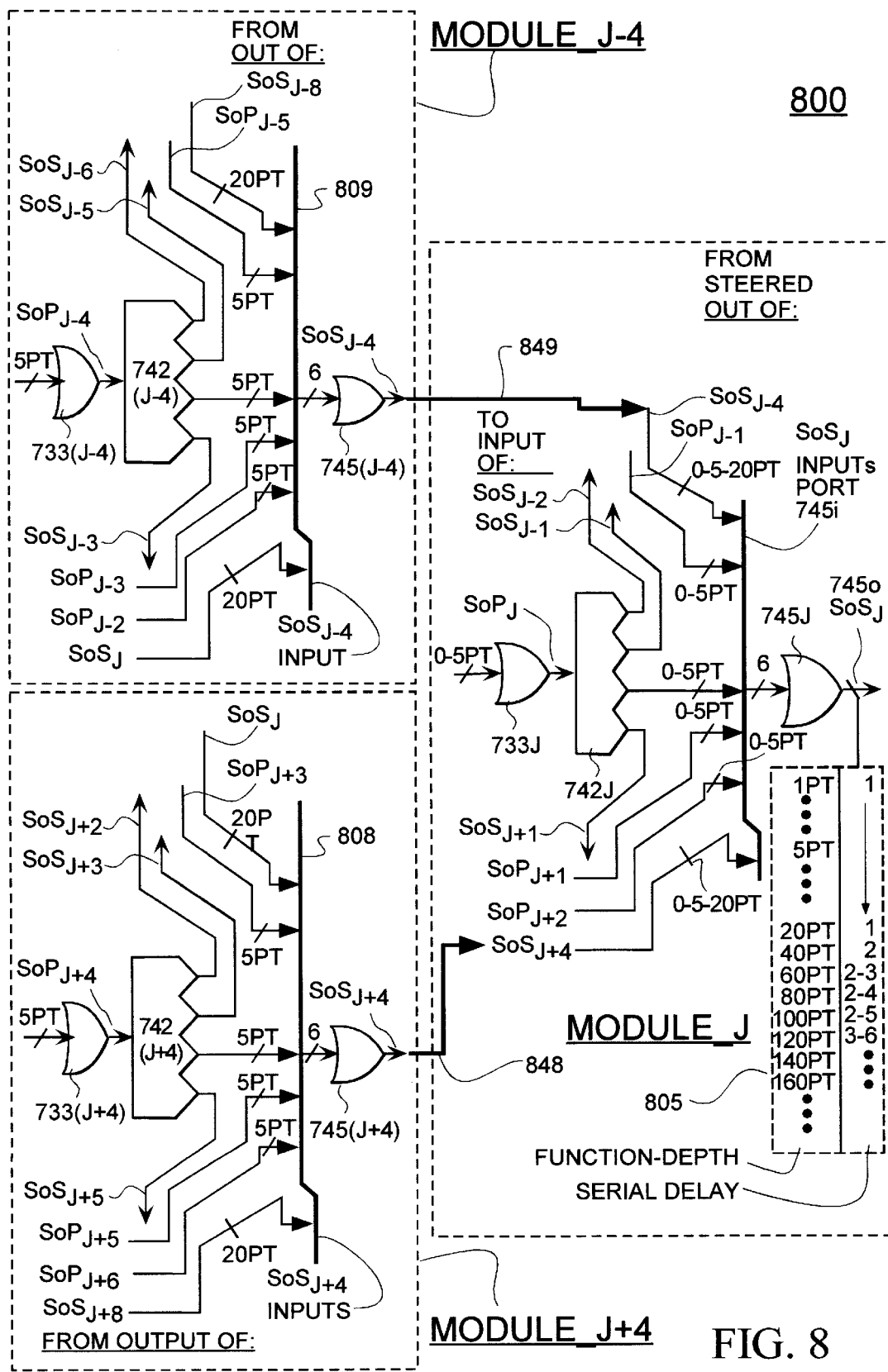
FIG. 8 is a schematic showing how serial and/or parallel allocation may be carried out at the simple or super-cluster levels to provide increasing degrees of function depth while maintaining one-pass Speed-Consistency and/or PinOut-Consistency.

Referring to FIG. 8, a closer examination is now made of the granular, function richness which a CPLD in accordance with the invention can provide. Within module_J, it is understood that the product terms received by inputs port 733i of SoP-producing gate 733J can number as any combination of from 0 to 5 depending on how the respective PT steering elements are configured. Each PT can be a product of as many as Kmax independent signals, where in one embodiment, Kmax=80, and more generally Kmax is about 125% of B, the datapath bit-width of a targeted design.

The $SoP_J$ output of OR gate 733J can be represented in shorthand as, 0–5PT, which indicates it is a sum of any of none to five product terms. Steerer 742J can steer this 0–5PT signal to a first input of inputs port 745i of SoS-producing gate 745J. Note that even if SoP-producing gate 733J produces a 0PT result (because all five PT's of its port 733i are being steered-away for purpose of providing local controls), that does not mean that the macrocell module J produces a 0PT result. This is so because the $SoS_J$ inputs port 745i can receive a further 0–5PT SoP signal from steerer 742(J+1) of module J+1 (not shown). $SoS_J$ inputs port 745i can yet further receive another 0–5PT SoP signal from steerer 742(J+2) of module J+2 (not shown). $SoS_J$ inputs port 745i can additionally receive yet another 0–5PT SoP signal from steerer 742(J−1) of module J−1 (not shown).

The sums-of-sums result which SoS-producing gate 745J can then produce from these four steered-to-it, 0–5PT, SoP signals (without considering steered-to-it SoS signals) may be denoted as 0–20PT. The maximum, functional depth of this $SoS_J$ signal may be denoted as 20PT. The delay for producing such a 0–20PT result at output terminal 745o may be that of only one macrocell module because each of the 0–5PT SoP signals may be generated in parallel in respective modules J−1, J, J+1 and J+2 and thereafter supplied in parallel to $SoS_J$ inputs port 745i. A short table, 805 in FIG. 8 shows this possible configuration including the function depth and a relative delay. In one embodiment, a one module delay is about 3–4 nS or less while a one OR gate (745) delay is about 1 nS or less. The specific amount of delay per module or gate will vary with transistor size and dopings, wire lengths and resistivities, and other technology factors.

Consider next, a situation where $SoS_J$ inputs port 745i has steered-to-it not only the SoP outputs of modules J−1, J, J+1 and J+2, but also the $SoS_{J+4}$ result signal produced by module J+4 and where the $SoS_{J+4}$ signal itself has a function depth of 20PT. The latter steering operation is represented by path 848 in FIG. 8. The sums-of-sums result which SoS-producing gate 745J can then produce from the combination of the four steered-to-it, 0–5PT, SoP signals and the one steered-to-it, 20PT, $SoS_{J+4}$ signal may be denoted as 0–40PT. The maximum, functional depth of this $SoS_J$ signal may be denoted as 40PT as shown in short table 805. The delay for producing such a 40PT result at output terminal 745o will be that of one normal macrocell module plus the incremental delay of one additional OR gate, but is rounded up to 2 in table 805 to indicate that the serial path extends through two different modules. The larger propagation delay occurs because the $SoS_{J+4}$ signal suffers the added delay of propagating through SoS-producing gate $745_{(J+4)}$ of module J+4. All signals under consideration here suffer the delay of propagating in parallel through one of SoP-producing gates $733_{(J+4)}$ and $733_J$. All signals under consideration here further suffer the delay of propagating through one of post-SoP steerers $742_{J+4}$ and $742_J$. All signals under consideration here suffer the delay of propagating through SoS-producing gate 745J. But it is the $SoS_{J+4}$ signal that suffers an additional, serial delay through gate $745_{(J+4)}$. In one embodiment, a normal delay propagating through a macrocell module is about 4 to 5 nS or less and the incremental delay associated with each extra OR gate is about 1 nS or less.

Consider now, an almost identical, next situation where the $SoS_J$ inputs port 745i has steered-to-it not only the SoP outputs of modules J−1, J, J+1 and J+2, but also the $SoS_{J+4}$ result signal produced by module J+4 and where this time the $SoS_{J+4}$ signal has a function depth of 40PT because $SoS_{J+8}$ was steered-to the $SoS_{J+4}$ inputs port (808). The latter steering operation is still represented by path 848 in FIG. 8. The sums-of-sums result which SoS-producing gate 745J can then produce from the combination of the four steered-to-it, 0–5PT, SoP signals and the one steered-to-it, 40PT, $SoS_{J+4}$ signal may be denoted as 0–60PT. The maximum, functional depth of this $SoS_J$ signal may be denoted as 60PT as shown in short table 805. The delay for producing such a 60PT result by serializing through 3 modules is represented as a 3 in table 805 to indicate that the serial path covers three different modules. This larger delay occurs because the $SoS_{J+8}$ signal suffers the added delay of propagating through SoS-producing gate $745_{(J+8)}$ (not shown) of module J+8.

A signal with a function depth of 80PT may be similarly generated by steering unidirectionally through 4 modules, and so on. However, note that the generation of a 20PT result in one module consumes the 3 adjacent neighbors of that module. Accordingly, there is a limitation on how far the chaining process may extend. First, there is a finite number of macrocells in the SLB (32 in the illustrated example) and we are incrementing J by quantums of 4 (32=8×4). Second, if there is no wrap-around and the module that produces the end result (for forwarding into the MFB bus 722 and/or IFB bus 717) is close to the end of the array of macrocell modules, such an edge of the macrocells area will limit the number of PT's that can be acquired.

Next, we consider for FIG. 8, an operation wherein the $SoS_J$ inputs port 745i of module J has steered-to-it not only the 5PT's-each, SoP outputs of modules J−1, J, J+1 and J+2, but also the $SoS_{J+4}$ result signal produced by module J+4 and the $SoS_{J-4}$ result signal produced by module J−4, where each of the $SoS_{J+4}$ and $SoS_{J-4}$ signals has a function depth of 20PT. This is referred to herein as bidirectional super-allocation. The steering-in of the $SoS_{J-4}$ result signal is represented by path 849 in FIG. 8. Output 745o of module J can now have a maximum function depth of 60PT while the added delay is +1 gate; in other words, the parallel penalty of propagating through OR gates 745(J−1) and 745(J+1).

Consider now, an almost identical, next situation where the $SoS_{J+4}$ and $SoS_{J-4}$ signals are again steered into module J, but this time each has a function depth of 40PT because of respective contributions from further modules J+8 and J−8. Now, output 745o of module J can have a maximum function depth of 100PT (=20+40+40) while the added delay is +2 gates. Thus it is seen that with a mere, added delay of +2 gates, the structure of FIG. 7 can deliver a function depth of 100PT's. Larger function depths (e.g., 160PT's in one pass) can be delivered if super-allocation with added delay of more than +2 gates is tolerable.

TABLE 4.1 demonstrates how, without wrap-around being available for SoP contributions, edge effects can limit the maximum function depth available out of certain macrocell modules (MM's 0–31) when using only regular allocation (not super allocation). For example, macrocell module J=MM0 does not have the benefit of being able to acquire 5PT SoP contributions from module J−1 if there is no provision made for SoP-contributions wrap-around. The maximum function depth of MM0 with SoP's-contribution only, is therefore 15PT. The maximum function depth of MM1 (with SoP's-contribution only) however is 20PT and so on. At the other end of TABLE 4.1, MM31 does not get a contribution of SoP's from beyond-edge modules J+1 and J+2. The SoP's only, maximum function depth of MM31 is therefore 10PT.

TABLE 4.1

| Macrocell J = | SoP Groups J − 1, J, J + 1 & J + 2 (Clusters of 5PT's each) | Max Number of PTs from SoP's only (No SoS's) |
|---|---|---|
| MM0 | —, G0, G1, G2 | 15 |
| MM1 | G0, G1, G2, G3 | 20 |
| MM2 | G1, G2, G3, G4 | 20 |
| MM3 | G2, G3, G4, G5 | 20 |
| MM4 | G3, G4, G5, G6 | 20 |
| MM5 | G4, G5, G6, G7 | 20 |
| ... | J − 1, J, J + 1, J + 2 | 20 |
| MM26 | G25, G26, G27, G28 | 20 |
| MM27 | G26, G27, G28, G29 | 20 |
| MM28 | G27, G28, G29, G30 | 20 |
| MM29 | G28, G29, G30, G31 | 20 |

TABLE 4.1-continued

| Macrocell J = | SoP Groups J − 1, J, J + 1 & J + 2 (Clusters of 5PT's each) | Max Number of PTs from SoP's only (No SoS's) |
|---|---|---|
| MM30 | G29, G30, G31, — | 15 |
| MM31 | G30, G31, —, — | 10 |

If only unidirectional super allocation is allowed such that each macrocell module $MM_J$ can obtain additional contribution from the J+4i next module while allowing for additional, incremental OR gate delays of +1 such OR gate, +2 such OR gates, etc., then the results of below TABLE 4.2 may apply. Note that MM27 picks up its J+4 contribution from MM31 but the latter can only contribute 10PT's. MM26 picks up its J+4 contribution from MM30 where the latter can only contribute 15PT's. And so forth. There is no J+8 contribution for MM31–MM24 (without wrap-around for SoS contribution) and thus the +2 and higher delay table-entries for those modules remain empty. In TABLE 4.2, empty boxes indicate that the level of serial or parallel steering is not available. Ellipses ( . . . ) indicate that a similar progression of values is being skipped over in order to keep the table brief.

TABLE 4.2

| | (J + 4 Unidirectional Super Alloc) | | | | | | | |
|---|---|---|---|---|---|---|---|---|
| J = | Normal Delay | +1 delay | +2 | +3 | +4 | +5 | +6 | +7 |
| MM0 | 15 PT | 35 PT | 55 | 75 | 95 | 115 | 135 | 155 |
| MM1 | 20 | 40 | 60 | 80 | 100 | 120 | 140 | 160 |
| MM2 | 20 | 40 | 60 | 80 | 100 | 120 | 140 | 160 |
| MM3 | 20 | 40 | 60 | 80 | 100 | 120 | 140 | 160 |
| MM4 | 20 | 40 | 60 | 80 | 100 | 120 | 140 | |
| MM5 | 20 | ... | ... | ... | ... | ... | ... | ... |
| ... | ... | ... | ... | ... | ... | ... | ... | |
| ... | ... | ... | ... | ... | ... | ... | | |
| MM14 | 20 | 40 | 60 | 80 | 100 | | | |
| MM15 | 20 | 40 | 60 | 80 | 90 | | | |
| ... | ... | | | | | | | |
| MM17 | 20 | 40 | 60 | 80 | | | | |
| MM18 | 20 | 40 | 60 | 75 | | | | |
| MM19 | 20 | 40 | 60 | 70 | | | | |
| MM20 | 20 | 40 | 60 | | | | | |
| MM21 | 20 | 40 | 60 | | | | | |
| MM22 | 20 | 40 | 55 | | | | | |
| MM23 | 20 | 40 | 50 | | | | | |
| MM24 | 20 | 40 | | | | | | |
| MM25 | 20 | 40 | | | | | | |
| MM26 | 20 | 35 | | | | | | |
| MM27 | 20 | 30 | | | | | | |
| MM28 | 20 | | | | | | | |
| MM29 | 20 | | | | | | | |
| MM30 | 15 | | | | | | | |
| MM31 | 10 | | | | | | | |

If both unidirectional and bidirectional super allocation is allowed such that each macrocell module MMJ can obtain additional SoS contributions (without SoS-contribution wrap-around) from the J+4i and/or J−4i next modules while allowing for additional, incremental OR gate delays of +1 such OR gate, +2 such OR gates, etc., then the results of below TABLE 4.3 may apply.

TABLE 4.3

(Bidirectional and/or Uni Super Alloc)

| J = | Normal Delay | +1 delay | +2 delay | +3 delay | +4 delay | +5 delay | +6 delay | +7 delay |
|---|---|---|---|---|---|---|---|---|
| MM0  | 15 | 35 | 55 | 75 | 95 | 115 | 135 | 155 |
| MM1  | 20 | 40 | 60 | 80 | 100 | 120 | 140 | 160 |
| MM2  | 20 | 40 | 60 | 80 | 100 | 120 | 140 | 155 |
| MM3  | 20 | 40 | 60 | 80 | 100 | 120 | 140 | 150 |
| MM4  | 20 | 40 | 60 | 80 | 100 | 120 | 140 | |
|      |    | /55 | /75 | /95 | /115 | /135 | /155 | |
| MM5  | 20 | 40 | 60 | 80 | 100 | 120 | 140 | |
|      |    | /60 | /80 | /100 | /120 | /140 | /160 | |
| MM6  | 20 | 40 | 60 | 80 | 100 | 120 | 135 | |
|      |    | /60 | /80 | /100 | /120 | /140 | /155 | |
| MM7  | 20 | 40 | 60 | 80 | 100 | 120 | 130 | |
|      |    | /60 | /80 | /100 | /120 | /140 | /150 | |
| MM8  | 20 | 40 | 60 | 80 | 100 | 120 | | |
|      |    | /60 | /95 | /115 | /135 | /155 | | |
| MM9  | 20 | 40 | 60 | 80 | 100 | 120 | | |
|      |    | /60 | /100 | /120 | /140 | /160 | | |
| MM10 | 20 | 40 | 60 | 80 | 100 | 115 | | |
|      |    | /60 | /100 | /120 | /140 | /155 | | |
| MM11 | 20 | 40 | 60 | 80 | 100 | 110 | | |
|      |    | /60 | /100 | /120 | /140 | /150 | | |
| MM12 | 20 | 40 | 60 | 80 | 100 | | | |
|      |    | /60 | /100 | /135 | /155 | | | |
| MM13 | 20 | 40 | 60 | 80 | 100 | | | |
|      |    | /60 | /100 | /140 | /160 | | | |
| MM14 | 20 | 40 | 60 | 80 | 100 | | | |
|      |    | /60 | /100 | /140 | /155 | | | |
| MM15 | 20 | 40 | 60 | 80 | 100 | | | |
|      |    | /60 | /100 | /140 | /150 | | | |
| MM16 | 20 | 40 | 60 | 80 | 100 | | | |
|      |    | /60 | /100 | /140 | /155 | | | |
| MM17 | 20 | 40 | 60 | 80 | 100 | | | |
|      |    | /60 | /100 | /140 | /160 | | | |
| MM18 | 20 | 40 | 60 | 80 | 100 | | | |
|      |    | /60 | /100 | /135 | /155 | | | |
| MM19 | 20 | 40 | 60 | 80 | 100 | | | |
|      |    | /60 | /100 | /130 | /150 | | | |
| MM20 | 20 | 40 | 60 | 80 | 100 | 115 | | |
|      |    | /60 | /100 | /120 | /140 | /155 | | |
| MM21 | 20 | 40 | 60 | 80 | 106 | 120 | | |
|      |    | /60 | /100 | /120 | /140 | /160 | | |
| MM22 | 20 | 40 | 60 | 80 | 100 | 120 | | |
|      |    | /60 | /95 | /115 | /135 | /155 | | |
| MM23 | 20 | 40 | 60 | 80 | 100 | 120 | | |
|      |    | /60 | /90 | /110 | /130 | /150 | | |
| MM24 | 20 | 40 | 60 | 80 | 100 | 120 | 135 | |
|      |    | /60 | /80 | /100 | /120 | /140 | /155 | |
| MM25 | 20 | 40 | 60 | 80 | 100 | 120 | 140 | |
|      |    | /60 | /80 | /100 | /120 | /140 | /160 | |
| MM26 | 20 | 40 | 60 | 80 | 100 | 120 | 140 | |
|      |    | /55 | /75 | /95 | /115 | /135 | /155 | |
| MM27 | 20 | 40 | 60 | 80 | 100 | 120 | 140 | |
|      |    | /50 | /70 | /90 | /110 | /130 | /150 | |
| MM28 | 20 | 40 | 60 | 80 | 100 | 120 | 140 | 155 |
| MM29 | 20 | 40 | 60 | 80 | 100 | 120 | 140 | 160 |
| MM30 | 15 | 35 | 55 | 75 | 95 | 115 | 135 | 155 |
| MM31 | 10 | 30 | 50 | 70 | 90 | 110 | 130 | 150 |

In TABLE 4.3, empty boxes indicate that the level of serial or parallel steering is not available. A slash indicates that different, maximal amounts of function depth are available depending on whether unidirectional super-allocation is used in the positive or negative direction or if bidirectional super-allocation is used.

TABLE 4.4 shows the results of TABLE 4.3 rearranged so that one can quickly see which specific macrocell modules can output a result signal of a given, maximal function depth within a specified minimum time. If the function depth is 160PT, that means all 32 of the clusters of 5PT's each of the SLB are being consumed for steering into super-allocation use or normal use.

TABLE 4.4

(J + 4 Unidirectional Super Alloc)

| Maximum # of PTs | Minimum Levels of Added Delay | Macrocells from which such function depth is available with Min Delay |
|---|---|---|
| 160 | +4 | MM13, MM17 |
| 140 | +3 | MM13, MM14, MM15, MM16 MM17 |

TABLE 4.4-continued (J + 4 Unidirectional Super Alloc)

| Maximum # of PTs | Minimum Levels of Added Delay | Macrocells from which such function depth is available with Min Delay |
|---|---|---|
| 120 | +3 | MM9, MM10, MM11, MM12, MM13, MM14, MM15, MM16 MM17, MM18, MM19, MM20 MM21 |
| 100 | +2 | MM9, MM10, MM11, MM12, MM13, MM14, MM15, MM16 MM17, MM18, MM19, MM20 MM21 |
| 80 | +2 | MM5, MM6, MM7, MM8 MM9, MM10, MM11, MM12, MM13, MM14, MM15, MM16 MM17, MM18, MM19, MM20 MM21, MM22, MM23 MM24, MM25 |
| 60 | +1 | MM5, MM6, MM7, MM8 MM9, MM10, MM11, MM12, MM13, MM14, MM15, MM16 MM17, MM18, MM19, MM20 MM21, MM22, MM23 MM24, MM25 |
| 40 | +1 | MM1, MM2, MM3, MM4 MM5, MM6, MM7, MM8 MM9, MM10, MM11, MM12, MM13, MM14, MM15, MM16 MM17, MM18, MM19, MM20 MM21, MM22, MM23 MM24, MM25, MM26, MM27 MM28, MM29 |
| 20 | Base (+0) | MM1, MM2, MM3, MM4 MM5, MM6, MM7, MM8 MM9, MM10, MM11, MM12, MM13, MM14, MM15, MM16 MM17, MM18, MM19, MM20 MM21, MM22, MM23 MM24, MM25, MM26, MM27 MM28, MM29 |

As seen in TABLE 4.4, only macrocell modules MM13 and MM17 provide the full 160PT function depth within the time of one normal macrocell delay plus four gate increments (+4) because of the unique positionings of these modules relative to the none-wrapped-around edges of the SLB. Thus, if the CPLD configuring software determines that it is highly desirable to produce a 160PT function signal with a delay of no more than +4, the CPLD configuring software should pick one of macrocell modules MM13 and MM17 for outputting such a signal. The CPLD configuring software may use any one or more of the edge-effect tables described herein or there equivalents for determining what placements and/or routings are best suited for a given design problem.

For example, if the CPLD configuring software determines that it is highly desirable to produce a signal with a smaller function depth, of say, 140PT and with a delay of no more than +3, the CPLD configuring software can pick any one of macrocell modules, MM9–MM21 for outputting such a 140PT signal. And similarly, if the CPLD configuring software determines that it is acceptable to produce a signal with a much smaller function depth, of 20PT and with a delay of no more than one macrocell (a +0 base delay), the CPLD configuring software can pick any one of macrocell modules, MM1–MM29 for outputting such a 20PT signal. Thus, there is a trade-off between speed, function depth, and routing flexibility. TABLE 4.4 provides an example of how such trade-offs can be identified and made by the CPLD configuring software.

TABLE 4.5 shows another way in which contributions from other clusters (SoP groups) can be viewed. The leftmost column provides the macrocell module number (J) of the module that is to produce an output signal whose delay time is a function of contributions made from other modules. MM00–MM03 and MM28–MM31 are close enough to an edge of the macrocells area to stretch across the area for an incremental delay of +7. The maximum delay that may be incurred to consume up-to-the-full 160PT's of the macrocells area is set forth in the rightmost column.

TABLE 4.5

(Cluster-Delay/Distance)

Added Delay to get contribution from Cluster number Gxx

| J= | G001 | G002 | G003 | G004 | G005 | G006 | G007 | G008 | G009 | G010 | G011 | G012 | G013 | G014 | G015 | G016 | G017 | G018 | G019 | G020 | G021 | G022 | G023 | G024 | G025 | G026 | G027 | G028 | G029 | G030 | G031 | Max Pts | Max Adders |
|---|---|---|---|---|---|---|---|---|---|---|---|---|---|---|---|---|---|---|---|---|---|---|---|---|---|---|---|---|---|---|---|---|---|
| M00 | 0 | 0 | — | 1 | 1 | 1 | 1 | — | 2 | 2 | 2 | 2 | 3 | 3 | 3 | 3 | 3 | 4 | 4 | 4 | 4 | 5 | 5 | 5 | 6 | 6 | 6 | 7 | 7 | 7 | 7 | — | 7 |
| M01 | 0 | 0 | 0 | — | 1 | 1 | 1 | 1 | — | 2 | 2 | 2 | 2 | 3 | 3 | 3 | 3 | 4 | 4 | 4 | 4 | 5 | 5 | 5 | 6 | 6 | 6 | 7 | 7 | 7 | 7 | — | 7 |
| M02 | — | 0 | 0 | 0 | 0 | — | 1 | 1 | 1 | 1 | — | 2 | 2 | 2 | 2 | 3 | 3 | 3 | 3 | 4 | 4 | 4 | 4 | 5 | 5 | 5 | 6 | 6 | 6 | 6 | 7 | 155 | 7 |
| M03 | 1 | — | 0 | 0 | 0 | 0 | — | 1 | 1 | 1 | 1 | — | 2 | 2 | 2 | 2 | 3 | 3 | 3 | 3 | 4 | 4 | 4 | 4 | 5 | 5 | 5 | 6 | 6 | 6 | 7 | 160 | 7 150 7 |
| M04 | 1 | 1 | — | 0 | 0 | 0 | 0 | — | 1 | 1 | 1 | 1 | 2 | 2 | 2 | 2 | 3 | 3 | 3 | 3 | 3 | 4 | 4 | 4 | 5 | 5 | 5 | 6 | 6 | 6 | 6 | 7 | 6 |
| M05 | 1 | 1 | 1 | — | 0 | 0 | 0 | 0 | — | 1 | 1 | 1 | 1 | 2 | 2 | 2 | 2 | 3 | 3 | 3 | 3 | 4 | 4 | 4 | 5 | 5 | 5 | 5 | 6 | 6 | 6 | — | 6 |
| M06 | — | 1 | 1 | 1 | 1 | — | 0 | 0 | 0 | 0 | — | 1 | 1 | 1 | 1 | 2 | 2 | 2 | 2 | 3 | 3 | 3 | 3 | 4 | 4 | 4 | 5 | 5 | 5 | 5 | 6 | 155 | 6 |
| M07 | 2 | — | 1 | 1 | 1 | 1 | — | 0 | 0 | 0 | 0 | — | 1 | 1 | 1 | 1 | 2 | 2 | 2 | 2 | 3 | 3 | 3 | 3 | 4 | 4 | 4 | 5 | 5 | 5 | 6 | 160 | 6 150 6 |
| M08 | 2 | 2 | — | 1 | 1 | 1 | 1 | — | 0 | 0 | 0 | 0 | 1 | 1 | 1 | 1 | 2 | 2 | 2 | 2 | 3 | 3 | 3 | 3 | 4 | 4 | 4 | 5 | 5 | 5 | 5 | — | 5 |
| M09 | 2 | 2 | 2 | — | 1 | 1 | 1 | 1 | — | 0 | 0 | 0 | 0 | 1 | 1 | 1 | 1 | 2 | 2 | 2 | 2 | 3 | 3 | 3 | 3 | 4 | 4 | 4 | 5 | 5 | 5 | — | 5 |
| M10 | — | 2 | 2 | 2 | 2 | — | 1 | 1 | 1 | 1 | — | 0 | 0 | 0 | 0 | 1 | 1 | 1 | 1 | 2 | 2 | 2 | 2 | 3 | 3 | 3 | 3 | 4 | 4 | 4 | 5 | 155 | 5 |
| M11 | 3 | — | 2 | 2 | 2 | 2 | — | 1 | 1 | 1 | 1 | — | 0 | 0 | 0 | 0 | 1 | 1 | 1 | 1 | 2 | 2 | 2 | 2 | 3 | 3 | 3 | 4 | 4 | 4 | 5 | 160 | 5 150 5 |
| M12 | 3 | 3 | — | 3 | 3 | 3 | 2 | — | 2 | 2 | 2 | 2 | 1 | 1 | 1 | 1 | 1 | 2 | 2 | 2 | 2 | 3 | 3 | 3 | 3 | 3 | 4 | 4 | 4 | 4 | 4 | — | 4 |
| M13 | 3 | 3 | 3 | — | 3 | 3 | 3 | 2 | — | 2 | 2 | 2 | 2 | 1 | 1 | 1 | 1 | 1 | 2 | 2 | 2 | 2 | 3 | 3 | 3 | 3 | 3 | 4 | 4 | 4 | 4 | — | 4 |
| M14 | — | 3 | 3 | 3 | 3 | — | 3 | 3 | 3 | 2 | — | 2 | 2 | 2 | 2 | 1 | 1 | 1 | 1 | 1 | 2 | 2 | 2 | 2 | 3 | 3 | 3 | 3 | 4 | 4 | 4 | 155 | 4 |
| M15 | 4 | — | 3 | 3 | 3 | 3 | — | 3 | 3 | 3 | 2 | — | 2 | 2 | 2 | 2 | 1 | 1 | 1 | 1 | 1 | 2 | 2 | 2 | 2 | 3 | 3 | 3 | 3 | 4 | 4 | 160 | 4 150 4 |
| M16 | 4 | 4 | — | 4 | 4 | 4 | 3 | — | 3 | 3 | 3 | 2 | 2 | 2 | 2 | 2 | 1 | 1 | 1 | 1 | 2 | 2 | 2 | 2 | 2 | 3 | 3 | 3 | 3 | 3 | 3 | — | 4 |
| M17 | 4 | 4 | 4 | — | 4 | 4 | 4 | 3 | — | 3 | 3 | 3 | 2 | 2 | 2 | 2 | 2 | 1 | 1 | 1 | 1 | 2 | 2 | 2 | 2 | 2 | 3 | 3 | 3 | 3 | 3 | — | 4 |
| M18 | — | 4 | 4 | 4 | 4 | — | 4 | 4 | 4 | 3 | — | 3 | 3 | 3 | 2 | 2 | 2 | 2 | 2 | 1 | 1 | 1 | 1 | 2 | 2 | 2 | 2 | 2 | 3 | 3 | 3 | 155 | 4 |
| M19 | 5 | — | 4 | 4 | 4 | 4 | — | 4 | 4 | 4 | 3 | — | 3 | 3 | 3 | 2 | 2 | 2 | 2 | 2 | 1 | 1 | 1 | 1 | 2 | 2 | 2 | 2 | 2 | 3 | 3 | 160 | 3 150 4 |
| M20 | 5 | 5 | — | 5 | 5 | 5 | 4 | — | 4 | 4 | 4 | 3 | 3 | 3 | 3 | 2 | 2 | 2 | 2 | 2 | 1 | 1 | 1 | 1 | 2 | 2 | 2 | 2 | 2 | 2 | 3 | — | 5 |
| M21 | 5 | 5 | 5 | — | 5 | 5 | 5 | 4 | — | 4 | 4 | 4 | 3 | 3 | 3 | 3 | 2 | 2 | 2 | 2 | 2 | 1 | 1 | 1 | 1 | 2 | 2 | 2 | 2 | 2 | 2 | — | 5 |
| M22 | — | 5 | 5 | 5 | 5 | — | 5 | 5 | 5 | 4 | — | 4 | 4 | 4 | 3 | 3 | 3 | 3 | 2 | 2 | 2 | 2 | 1 | 1 | 1 | 1 | 2 | 2 | 2 | 2 | 2 | 155 | 5 |
| M23 | 6 | — | 5 | 5 | 5 | 5 | — | 5 | 5 | 5 | 4 | — | 4 | 4 | 4 | 3 | 3 | 3 | 3 | 2 | 2 | 2 | 2 | 1 | 1 | 1 | 1 | 2 | 2 | 2 | 2 | 160 | 2 150 5 |
| M24 | 6 | 6 | — | 6 | 6 | 6 | 5 | — | 5 | 5 | 5 | 4 | 4 | 4 | 4 | 3 | 3 | 3 | 3 | 2 | 2 | 2 | 2 | 1 | 1 | 1 | 1 | 1 | 2 | 2 | 2 | — | 6 |
| M25 | 6 | 6 | 6 | — | 6 | 6 | 6 | 5 | — | 5 | 5 | 5 | 4 | 4 | 4 | 4 | 3 | 3 | 3 | 3 | 2 | 2 | 2 | 2 | 1 | 1 | 1 | 1 | 1 | 2 | 2 | — | 6 |
| M26 | — | 6 | 6 | 6 | 6 | — | 6 | 6 | 6 | 5 | — | 5 | 5 | 5 | 4 | 4 | 4 | 3 | 3 | 3 | 3 | 2 | 2 | 2 | 2 | 1 | 1 | 1 | 1 | 1 | 2 | 155 | 6 |
| M27 | 7 | — | 6 | 6 | 6 | 6 | — | 6 | 6 | 6 | 5 | — | 5 | 5 | 5 | 4 | 4 | 4 | 3 | 3 | 3 | 3 | 2 | 2 | 2 | 2 | 1 | 1 | 1 | 1 | 2 | 160 | 1 150 6 |
| M28 | 7 | 7 | — | 7 | 7 | 7 | 6 | — | 6 | 6 | 6 | 5 | 5 | 5 | 5 | 4 | 4 | 4 | 4 | 3 | 3 | 3 | 3 | 2 | 2 | 2 | 2 | 1 | 1 | 1 | 2 | — | 7 |
| M29 | 7 | 7 | 7 | — | 7 | 7 | 7 | 6 | — | 6 | 6 | 6 | 5 | 5 | 5 | 5 | 4 | 4 | 4 | 4 | 3 | 3 | 3 | 3 | 2 | 2 | 2 | 2 | 1 | 1 | 2 | — | 7 |
| M30 | — | 7 | 7 | 7 | 7 | — | 7 | 7 | 7 | 6 | — | 6 | 6 | 6 | 5 | 5 | 5 | 5 | 4 | 4 | 4 | 4 | 3 | 3 | 3 | 3 | 2 | 2 | 2 | 2 | 2 | 155 | 7 |
| M31 | — | — | 0 | — | 7 | 7 | 7 | 7 | — | 7 | 7 | 7 | 6 | 6 | 6 | 5 | 5 | 5 | 5 | 4 | 4 | 4 | 4 | 3 | 3 | 3 | 3 | 2 | 2 | 2 | 2 | 0 0 | 150 7 |

In the second from rightmost column of TABLE 4.5, the maximal function depth is given for a signal generated by the respective macrocell module, MM0–MM31. As seen, only certain ones of the macrocells, and in particular MM13 and MM17, are situated such that they can generate a full 160PT signal in a minimal time that includes a +4 gates increment above the normal delay of a single macrocell module. TABLE 4.5 or an equivalent may be used by CPLD configuring software to identify the macrocell placements that may be best suited for achieving a desired level of function depth in combination with a desired ceiling on single-pass delay.

TABLE 4.6 shows the four basic, J±4 super-chains (A–D) that can generate maximal function depth signals in the range of 150PT–160PT's.

TABLE 4.6

(Super-Chains)

| Chain | A | B | C | D |
|---|---|---|---|---|
|  | MM0 | MM1 | MM2 | MM3 |
|  | 15 | 20 | 20 | 20 |
|  | MM4 | MM5 | MM6 | MM7 |
|  | 20 | 20 | 20 | 20 |
|  | MM8 | MM9 | MM10 | MM11 |
|  | 20 | 20 | 20 | 20 |
|  | MM12 | MM13 | MM14 | MM15 |
|  | 20 | 20 | 20 | 20 |
|  | MM16 | MM17 | MM18 | MM19 |
|  | 20 | 20 | 20 | 20 |
|  | MM20 | MM21 | MM22 | MM23 |
|  | 20 | 20 | 20 | 20 |
|  | MM24 | MM25 | MM26 | MM27 |
|  | 20 | 20 | 20 | 20 |
|  | MM28 | MM29 | MM30 | MM31 |
|  | 20 | 20 | 15 | 10 |
| Total PT's contributions | 155 | 160 | 155 | 150 |

Note that only Chain B can offer maximum of 160 PTs. Chains A, C and D offer a maximum of 155, 155 and 150 PT's respectively. The optimal MM13 and MM17 macrocell modules reside in Chain B and provide their maximal speed by relying on bidirectional super-allocation as should be apparent from their placements in TABLE 4.6.

TABLE 4.7 shows how amount of delay can vary depending on whether bidirectional or only unidirectional, super-allocation is available in the CPLD chip.

TABLE 4.7

(Delay Choices)

| Levels of delay | Unidirectional Minimum | Bidirectional Minimum |
|---|---|---|
| 20 PTs | Base | Base |
| 40 PTs | +1 delay unit | +1 delay unit |
| 60 PTs | +2 delay units | +1 delay unit |
| 80 PTs | +3 delay units | +2 delay units |
| 100 PTs | +4 delay units | +2 delay units |
| 120 PTs | +5 delay units | +3 delay units |
| 140 PTs | +6 delay units | +3 delay units |
| 160 PTs | +7 delay units | +4 delay units |

The additional units of delay are, of course, the incremental delays added by propagating the signals serially through a chain of SoS-producing gates such as 745.

Referring back to FIGS. 5 and 7, it is seen in a summarizing review of the above that flexible and efficient structures for macrocell modules have been disclosed. These structures can efficiently adapt to the control overhead needs, pinout needs, and speed requirements of designs whose parallel address and/or data paths are 16-bits wide, 32-bits wide, or 64-bits wide. Designs can be provided in which CPLD logic exhibits re-design Speed-Consistency, and/or re-design PinOut-Consistency, and/or the ability to implement in one pass, the generation of complex function signals. Such complex function signals can be expressed by the expressive form:

$$f_{SoP/PoS} = Sgn \cdot \Sigma^{N=5++} Xi \cdot (PTi^{Ki/Kmax/L/[Q]}) \qquad \{\text{Exp. B2}\}$$

where $f_{SoP/PoS}$ can be either a Boolean sum-of-products (SoP) or a Product of Sums (PoS) depending on whether the polarity controlling, sign value Sgn is a NOT function (−1) or a pass-through function (+1). In Exp. B2, L represents the number of longlines in the Segment Switch Matrix (SSM) of each segment and [Q] represents a longline sampling factor (e.g., 16:1). The number of independent SLB input signals that are provided for one-pass processing by each of the plural SLB's of each segment is Kmax, and this number is at least 112.5%, and more preferably at least 125% of the expected, maximum and parallel, address and/or data path width (e.g., B=64-bits, B=96 bits, B=128 bits, etc.).

Some or all of the five or more product term signals (PTi's) of each macrocell module can be stolen (steered-away) for providing local control functions in place of SLB-wide or global-wide controls, as needed. Sum-of-products results (SoP's) of respective macrocell modules can be stolen (steered-away) for consumption by SoS-producing gates (e.g., 745) of neighboring modules. Sum-of-Sums results (SoS's) of respective macrocell modules can be stolen (steered-away) for consumption by SoS-producing gates (e.g., 745) of neighboring modules to thereby produce super-allocation results of greater function depth.

Synchronization of MFB or IFB signals can be provided in response to global clocks (G_CLK's), block-wide clocks (SLB_CLK's), or local clocks (PT2) with edge sensitivity being defined on a per-macrocell basis. Each macrocell can have its own, local CE function (PT1). Asynchronous SLB_SET and/or SLB_RST can be inhibited individually and on a per-macrocell basis. Every I/O pad has its own OE control.

The above disclosure is to be taken as illustrative of the invention, not as limiting its scope or spirit. Numerous modifications and variations will become apparent to those skilled in the art after studying the above disclosure.

By way of a first example, although FIG. 3 shows only 8 segments, it is within the spirit of the invention to provide CPLD devices that have a fewer number or a larger number of segments.

By way of a second example, FIG. 5 can be modified to include, immediately after AND gates A163–A178, a plurality of up to sixteen, 1-to-2-of-N steering switches (see 431) that are programmable to steer the respective PT signal either to the OE terminal of the respective tristate driver 526 or to at least one, other wise programmably-specified control terminal, for example, selected ones of the OE controls of tristate longline drivers 586. If the PT output signal of such modified AND gates A163–A178 is steered away from the respective OE terminal, then the 1-to-2-of-N steering switch is further programmable to apply one or the other of an output enabling level (OE=1) or output disabling level (OE=0) to its respective tristate driver 526. Of course, by inserting such steering switches between AND gates A163–A178 and the OE terminals, the propagation time for OE-controlling PT's is increased and the size of the CPLD configuration memory is increased. Thus the design shown in FIG. 5 is faster and simpler.

By way of a third example, the OSM 570/770 in FIGS. 5/7 can be modified as indicated by dashed bus 523 to have more than 32 H-lines, where the additional H-lines (up to 32 more) receive respective MFB signals from one or more other SLB's. This allows SLB 510 to 'lend' or 'donate' its pads (516) for the outputting of result signals from the other SLB's if SLB 510 is not itself using such pads (516, buried or not) for the outputting of result signals. Of course, by inserting such additional pad sharing functionality, signal delays through the modified OSM and along lengthened MFB buses (522) may increase disadvantageously. Also, the size of the CPLD configuration memory will be increased to support the additional flexibility and the size of the IC die will increase commensurately. Thus the design shown in FIG. 5 is faster, smaller, simpler and cheaper to manufacture.

Given the above disclosure of general concepts and specific embodiments, the scope of protection sought is to be defined by the claims appended hereto.

What is claimed is:

1. A monolithic, Complex Programmable Logic Device (CPLD) for programmably implementing designs having parallel data words that are at least B bits wide, where B is an integer equal to or greater than 32, said CPLD having a plurality of more than B I/O terminals for communicating with external circuitry, said CPLD further comprising:

a plurality of macrocell modules operatively coupled to at least a subset of said I/O terminals, wherein each macrocell module includes:

(a) at least first through fifth product term generators for producing respective and local first through fifth product term signals, where each product term signal can represent at least up to B times 112.5%, independent input terms or more;

(b) a local SoP-producing gate, operatively coupled to receive a selected subset or all of the local product term signals and to produce therefrom a local SoP signal representing a Boolean sum-of-products of one or more of the respective and local product term signals (PT0–PT4);

(c) at least first through fifth PT steerers respectively coupled each to an output of a respective one of the first through fifth product term generators, wherein each PT steerer may be programmably configured to either direct to the local SoP-producing gate or steer-away the respective one of the local product term signals (PT0–PT4);

(d) a local SoS-producing gate that can produce a sums-of-sums signal (SoS) that represents a Boolean sum of one or more of the local SoP signal, of SoP signals of neighboring macrocell modules, and of SoS signals of neighboring macrocell modules;

(e) a post-SoP steerer that can be programmably configured to direct to the local SoS-producing gate or steer-away to SoS-producing gates of neighboring macrocell modules, the local SoP signal; and (f) a local storage or storage plus combinatorial-pass-through element having an IN terminal, internal storage operatively coupled for receiving and storing a signal applied to the IN terminal, and a Q output terminal operatively coupled for outputting a signal stored in said storage, where said IN terminal of said local storage/pass-through element is operatively coupled to receive IN signals from one or more of said local SoS-producing gate and said PT steerers.

2. The Complex Programmable Logic Device (CPLD) of claim 1 and further wherein each macrocell module includes:

(g) a first XOR gate having an output coupled to the IN terminal of said local storage and/or combinatorial-pass-through element (storage/pass-through element), the first XOR gate further having respective first and second input terminals;

(h) a post-SoS steerer that may be programmably configured to direct to the first input terminal of the first XOR gate or steer-away to SoS-producing gates of neighboring macrocell modules, the local SoS signal; and (i) an XOR-feeding multiplexer that may be programmably configured to direct to the second input terminal of the first XOR gate, at least an adjustable local polarity signal (LP'), where the LP' signal may be programmably defined as a logic '0' or as a logic '1' level.

3. The Complex Programmable Logic Device (CPLD) of claim 2 and further wherein each macrocell module includes:

(j) a second XOR gate having an output that defines the LP' signal, and a first XOR input for receiving a steered-away product term signal and a second input for receiving a configuration memory signal.

4. The Complex Programmable Logic Device (CPLD) of claim 1 and further wherein each macrocell module includes:

(g) a clock-selecting multiplexer having an output that defines a clock input signal for the local storage/pass-through element and a plurality of inputs including ones for respectively receiving a CPLD global clock signal, a logic-block wide clock signal, and a macrocell local clock signal, where the local clock signal can be defined by a steered-away one of the local product terms.

5. The Complex Programmable Logic Device (CPLD) of claim 1 and further wherein each macrocell module includes:

(g) a local SET/RST swapping unit that can be programmably configured to swap respective SET and RST signals supplied to local set and reset terminals of the storage/pass-through element; and (h) an asynchronous-controls supplying circuit for supplying asynchronous-control signals to at least one of the swapping unit and storage/pass-through element, where the asynchronous-control signals are selectable from a set including a default constant, a CPLD global reset signal, a logic-block wide reset signal, a logic-block wide set signal, and macrocell local set and reset signals.

6. The Complex Programmable Logic Device (CPLD) of claim 1 and further wherein:

groups of said macrocell modules define respective ones of at least four programmable, Super Logic Blocks (SLB's), where each SLB is operatively coupled to a Segment Switch Matrix (SSM) such that each SLB can receive in parallel a first number, K of SLB input signals from the SSM and such that each SLB can supply in parallel a second number, M of SLB output signals to the SSM, where said combination of each one SSM and its respective plurality of SLB's defines a segment;

the number, K of SLB input signals is greater than 112.5% of B, the bit-width of said to-be-implemented designs; and the number, M of SLB output signals per SLB is greater than B divided by the number of SLB's in each segment.

7. The CPLD of claim 6 wherein:
B, the bit-width of said to-be-implemented designs is at least 64.

8. The CPLD of claim 7 wherein:
the number, K of SLB input signals is at least 125% of B, the bit-width of said to-be-implemented designs.

9. The CPLD of claim 6 wherein:
the number, K of parallel SLB input signals is at least 80.

10. The CPLD of claim 9 wherein:
the number, M of SLB output signals per SLB is at least 32.

11. The CPLD of claim 6 wherein:
each SLB has at least 32 macrocell modules and
each segment has at least 16 I/O pads per SLB within the segment, said I/O pads being programmably couplable to the Q output terminals of at least a subset of the local storage/pass-through elements.

12. The Complex Programmable Logic Device (CPLD) of claim 1 wherein said CPLD has at least 128 I/O terminals for providing communication between said external circuitry and said macrocell modules.

13. The Complex Programmable Logic Device (CPLD) of claim 1 wherein each product term signal can represent at least up to B times 125% independent input terms.

14. A method for implementing with a High Density Complex Programmable Logic Device (HCPLD), designs that are either 16-bits wide or 32-bits wide or 64-bits wide,
where said HCPLD is a monolithic device having at least 64 I/O terminals for communicating with external circuitry and at least 256 result-storing macrocell modules, and the macrocell modules of said CPLD further each comprises:
  (0.1) at least first through fifth product term generators for producing respective and local product term signals each capable of representing up to B times 125%, independent input terms or more;
  (0.2) a local SoP-producing gate that can produce a Boolean sum-of-products of one or more of the respective and local product term signals;
  (0.3) at least first through fifth PT steerers respectively coupled each to an output of a respective one of the product term generators, wherein each PT steerer can be programmably configured to either direct to the local SoP-producing gate or steer-away the respective one of the local product term signals;
  (0.4) a local SoS-producing gate that can produce a sums-of-sums signal (SoS) that represents a Boolean sum of one or more of the local SoP signal, of SoP signals of neighboring macrocell modules, and of SoS signals of neighboring macrocell modules;
  (0.5) a post-SoP steerer that can be programmably configured to direct to the local SoS-producing gate or steer-away to SoS-producing gates of neighboring macrocell modules, the local SoP signal; and
  (0.6) a local storage or local storage plus combinatorial-pass-through element having an IN terminal, internal storage, and a Q output terminal, where said IN terminal is operatively coupled to receive IN signals from one or more of said local SoS-producing gate and said PT steerers,
said method comprising two or more appropriate ones of the steps of:
  (a) using one or more of said at least first through fifth PT steerers to steer-away the respective ones of the local product term signals each to a corresponding local control terminal of the macrocell module;
  (b) using the local SoS-producing gate to produce a sums-of-sums signal (SoS) that represents a Boolean sum of one or more of the local SoP signal, of SoP signals of neighboring macrocell modules, and of SoS signals of neighboring macrocell modules; and
  (c) using the post-SoP steerer to steer-away to SoS-producing gates of neighboring macrocell modules, the local SoP signal.

15. The CPLD implementing method of claim 14 and further comprising the step of using each SLB to a produce complex, sum-of-products function signals that conforms to the expressive form:

$$f_{SoP/PoS} = Sgn \cdot \Sigma^{N=5++} Xi \cdot (PTi^{Ki/Kmax/L/\lceil Q \rceil}),$$

where $f_{SoP/PoS}$ can be either a Boolean sum-of-products (SoP) or a Product of Sums (PoS) depending on whether a polarity controlling value of the sign, Sgn, is positive or negative, where the N=5++ factor indicates that a minimal-delay, one-pass sum can be a sum of at least as many as five product terms (5 PT's), but such a sum can be a sum of a substantially larger number of PT's if the one-pass delay is larger than said minimal-delay, wherein Ki/Kmax indicates that each product term, PTi can be a Boolean AND of as many as Kmax independent input signals, where Kmax is equal to at least 80, where L represents a number of SSM longlines from which the up to Kmax input terms of each PTi can be obtained from, where Q represents a multiplexing factor that provides at least a 3-way routing flexibility.

16. The CPLD implementing method of claim 14 wherein said corresponding local control terminal of the macrocell module controls a locally-selectable function of the macrocell module and is selected from the group of functions consisting of:
  (a.1) resetting the local storage/pass-through element;
  (a.2) setting the local storage/pass-through element;
  (a.3) clocking the local storage/pass-through element;
  (a.4) enabling the clocking of the local storage/pass-through element;
  (a.5) establishing a polarity for a signal supplied from the post-SoS steerer to the IN terminal; and
  (a.6) defining an alternate signal for application to the IN terminal.

17. A monolithic, Complex Programmable Logic Device (CPLD) for programmably implementing designs which use parallel data words of at least a plurality of B bits each, said CPLD having a plurality of more than B I/O terminals for communicating with external circuitry, and said CPLD further comprising:
  a plurality of macrocell modules operatively coupled to at least a subset of said I/O terminals, wherein each macrocell module includes:
    (a) a local storage/pass-through element having an IN terminal, internal storage operatively coupled to the IN terminal for receiving and storing a signal applied to the IN terminal, and a Q output terminal that is programmably couplable to one or the other of the IN terminal and the internal storage, said Q output terminal outputting a corresponding macrocell output signal;
    (b) at least first through fifth, local product term generators for producing respective and local product term signals of the macrocell module, where each local product term signal can represent a Boolean product of up to a first maximum number of independent input terms of the macrocell module, said first maximum number being greater than B;

(c) a local SoP-producing gate, operatively coupled to receive a selected subset or all of the local product term signals of the local macrocell module and to produce therefrom a local SoP signal representing a Boolean sum-of-products of one or more of the respective and local product term signals;

(d) at least first through fifth PT steerers respectively coupled each to an output of a respective one of the product term generators of the macrocell module, wherein each PT steerer may be programmably configured to either direct to the local SoP-producing gate or steer-away the respective one of the local product term signals, (c.1) wherein, if so steered away, each steered-away one of the local product term signals can be used for defining a locally-selectable function of the corresponding macrocell module;

(d) a local SoS-producing gate that can produce a sums-of-sums signal (SoS) that represents a Boolean sum of one or more of the local SoP signal, of SoP signals of neighboring macrocell modules, and of SoS signals of neighboring macrocell modules;

(e) a post-SoP steerer that can be programmably configured to direct to the local SoS-producing gate or steer-away to SoS-producing gates of neighboring macrocell modules, the local SoP signal; and (f) a post-SoS steerer, operatively coupled to the IN terminal of the local storage/pass-through element and programmably configurable to direct toward said IN terminal or steer-away to SoS-producing gates of neighboring macrocell modules, the local SoS signal.

18. The CPLD of claim 17 wherein said locally-selectable functions of the corresponding macrocell module are selected from the group of functions consisting of:

(c.2a) resetting the local storage/pass-through element;

(c.2b) setting the local storage/pass-through element;

(c.2c) clocking the local storage/pass-through element;

(c.2d) enabling the clocking of the local storage/pass-through element;

(c.2e) establishing a polarity for a signal supplied from the post-SoS steerer to the IN terminal; and (c.2f) defining an alternate signal for application to the IN terminal.

19. A CPLD configuring method for implementing with a Complex Programmable Logic Device (CPLD), designs that have predefined function depth constraints, speed constraints and/or Pin-Retention constraints, said method comprising at least one of the following steps:

(a) using unidirectional or bidirectional super-allocation;

(b) using a path through an XOR gate to feed in external input signals without increasing delay of direct $SoS_j$ signals;

(c) selecting control clocks on a macrocell-by-macrocell basis;

(d) providing OE control for pad-driving tristate drivers on a pad-by-pad basis;

(e) inhibiting response to one or both of register SET and RST signals on a macrocell-by-macrocell basis;

(f) steering-away any one or more, up to all product terms of a given macrocell module; and (g) programmably routing MFB signals through an OSM so as to achieve PinOut-Consistency.

\* \* \* \* \*

UNITED STATES PATENT AND TRADEMARK OFFICE
CERTIFICATE OF CORRECTION

PATENT NO.   : 6,150,841
DATED        : November 21, 2000
INVENTOR(S)  : Om P. Agrawal et al.

It is certified that error appears in the above-identified patent and that said Letters Patent is hereby corrected as shown below:

Title page,
Under "*Attorney, Agent or Firm*", "Mayer" should be -- Meyer --.

Column 5,
Line 3, "Kmuax" should be -- Kmax --.

Column 26,
Line 7, "H32+V16" should be -- H32+/V16 --.

Column 35/36,
Replace TABLE 3 with the following TABLE 3:

TABLE 3
MACROCELL NUMBER

|    | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|----|---|---|---|---|---|---|---|---|---|---|----|----|----|----|----|----|----|----|----|----|----|----|----|----|----|----|----|----|----|----|----|----|
| 00 | A | B | C | D | A | B | C | D |   |   |    |    |    |    |    |    |    |    |    |    |    |    |    |    |    |    |    |    |    |    |    |    |
| 01 | A | B | C | D |   |   | C | D | A | B |    |    |    |    |    |    |    |    |    |    |    |    |    |    |    |    |    |    |    |    |    |    |
| 02 | A | B | C | D | A | B |   |   | C | D |    |    |    |    |    |    |    |    |    |    |    |    |    |    |    |    |    |    |    |    |    |    |
| 03 | A | B |   | A | B | C | D |   | C | D |    |    |    |    |    |    |    |    |    |    |    |    |    |    |    |    |    |    |    |    |    |    |
| 04 |   |   | C | D | A | B |   |   | C | D | A  | B  |    |    |    |    |    |    |    |    |    |    |    |    |    |    |    |    |    |    |    |    |
| 05 |   |   |   |   | C | D | A | B |   |   | A  | B  | C  | D  |    |    |    |    |    |    |    |    |    |    |    |    |    |    |    |    |    |    |
| 06 |   |   |   |   |   |   | A | B | C | D | A  | B  | C  | D  |    |    |    |    |    |    |    |    |    |    |    |    |    |    |    |    |    |    |
| 07 |   |   |   |   |   |   | A | B |   |   |    |    | C  | D  | A  | B  | C  | D  |    |    |    |    |    |    |    |    |    |    |    |    |    |    |
| 08 |   |   |   |   |   |   |   |   |   |   | A  | B  | C  | D  | A  | B  |    |    | C  | D  |    |    |    |    |    |    |    |    |    |    |    |    |
| 09 |   |   |   |   |   |   |   |   |   |   |    |    |    |    | A  | B  | C  | D  | A  | B  | C  | D  |    |    |    |    |    |    |    |    |    |    |
| 10 |   |   |   |   |   |   |   |   |   |   |    |    |    |    | A  | B  | C  | D  |    |    | C  | D  | A  | B  |    |    |    |    |    |    |    |    |
| 11 |   |   |   |   |   |   |   |   |   |   |    |    |    |    |    |    | C  | D  | A  | B  |    |    |    |    | C  | D  | A  | B  |    |    |    |    |

UNITED STATES PATENT AND TRADEMARK OFFICE
CERTIFICATE OF CORRECTION

PATENT NO.   : 6,150,841
DATED        : November 21, 2000
INVENTOR(S)  : Om P. Agrawal et al.

It is certified that error appears in the above-identified patent and that said Letters Patent is hereby corrected as shown below:

TABLE 3 (cont.)
MACROCELL NUMBER

| | 0 | 1 | 2 | 3 | 4 | 5 | 6 | 7 | 8 | 9 | | | | | | | | | | | | | | | | | | | | 29 | 30 | 31 |
|---|---|---|---|---|---|---|---|---|---|---|---|---|---|---|---|---|---|---|---|---|---|---|---|---|---|---|---|---|---|---|---|---|
| 12 | | | | | | | | | | | | | | | | | | | | A | B | | | A | B | C | D | | | | C | D |
| 13 | | | | | | | | | | | | | | | | | | | | A | B | | | | | C | D | A | B | C | D |
| 14 | | | | | | | | | | | | | | | | | | | | | | C | D | A | B | | | A | B | C | D |
| 15 | | | | | | | | | | | | | | | | | | | | | | | | | | | | A | B | C | D | A | B | C | D |

Column 45/46,
Please replace TABLE 4.5 with the following TABLE 4.5:

```
                  TABLE 4.5 (Cluster-Delay/Distance )
J= |               Added Delay to get contribution from
   |                      Cluster number Gxx
================================================================================
    G G G G G G G G G G G G G G G G G G G G G G G G G G G G G G G G
    0 0 0 0 0 0 0 0 0 0 1 1 1 1 1 1 1 1 1 1 2 2 2 2 2 2 2 2 2 2 3 3  Max  Max
    0 1 2 3 4 5 6 7 8 9 0 1 2 3 4 5 6 7 8 9 0 1 2 3 4 5 6 7 8 9 0 1  Pts  Adders
================================================================================
M00 0 0 0 1 1 1 2 2 2 3 3 3 4 4 4 5 5 5 6 6 6 7 7 7 -                155   7
M01 0 0 0 0 1 1 1 2 2 2 3 3 3 4 4 4 5 5 5 6 6 6 7 7 7 7              160   7
M02 - 0 0 0 0 1 1 1 2 2 2 3 3 3 4 4 4 5 5 5 6 6 6 7 7 7              155   7
M03 - - 0 0 0 0 1 1 1 2 2 2 3 3 3 4 4 4 5 5 5 6 6 6 7 7              150   7
M04 1 1 1 0 0 0 0 1 1 1 2 2 2 3 3 3 4 4 4 5 5 5 6 6 6 6 -            155   6
M05 1 1 1 1 0 0 0 0 1 1 1 2 2 2 3 3 3 4 4 4 5 5 5 6 6 6 6            160   6
M06 - 1 1 1 1 0 0 0 0 1 1 1 2 2 2 3 3 3 4 4 4 5 5 5 6 6 6            155   6
M07 - - 1 1 1 1 0 0 0 0 1 1 1 2 2 2 3 3 3 4 4 4 5 5 5 6 6            150   6
M08 2 2 2 1 1 1 1 0 0 0 0 1 1 1 2 2 2 3 3 3 4 4 4 5 5 5 -            155   5
M09 2 2 2 2 1 1 1 1 0 0 0 0 1 1 1 2 2 2 3 3 3 4 4 4 5 5 5            160   5
M10 - 2 2 2 2 1 1 1 1 0 0 0 0 1 1 1 2 2 2 3 3 3 4 4 4 5 5            155   5
M11 - - 2 2 2 2 1 1 1 1 0 0 0 0 1 1 1 2 2 2 3 3 3 4 4 4 5 5          150   5
```

UNITED STATES PATENT AND TRADEMARK OFFICE
CERTIFICATE OF CORRECTION

PATENT NO.    : 6,150,841
DATED         : November 21, 2000
INVENTOR(S)   : Om P. Agrawal et al.

It is certified that error appears in the above-identified patent and that said Letters Patent is hereby corrected as shown below:

```
M12  3 3 3 2 2 2 2 1 1 1 1 0 0 0 0 1 1 1 1 2 2 2 2 3 3 3 3 4 4 4 4 - 155  4
M13  3 3 3 3 2 2 2 2 1 1 1 1 0 0 0 0 1 1 1 1 2 2 2 2 3 3 3 3 4 4 4 4 160  4
M14  - 3 3 3 3 2 2 2 2 1 1 1 1 0 0 0 0 1 1 1 1 2 2 2 2 3 3 3 3 4 4 4 155  4
M15  - - 3 3 3 3 2 2 2 2 1 1 1 1 0 0 0 0 1 1 1 1 2 2 2 2 3 3 3 3 4 4 150  4
M16  4 4 4 3 3 3 3 2 2 2 2 1 1 1 1 0 0 0 0 1 1 1 1 2 2 2 2 3 3 3 3 - 155  4
M17  4 4 4 4 3 3 3 3 2 2 2 2 1 1 1 1 0 0 0 0 1 1 1 1 2 2 2 2 3 3 3 3 160  4
M18  - 4 4 4 4 3 3 3 3 2 2 2 2 1 1 1 1 0 0 0 0 1 1 1 1 2 2 2 2 3 3 3 155  4
M19  - - 4 4 4 4 3 3 3 3 2 2 2 2 1 1 1 1 0 0 0 0 1 1 1 1 2 2 2 2 3 3 150  4
M20  5 5 5 4 4 4 4 3 3 3 3 2 2 2 2 1 1 1 1 0 0 0 0 1 1 1 1 2 2 2 2 - 155  5
M21  5 5 5 5 4 4 4 4 3 3 3 3 2 2 2 2 1 1 1 1 0 0 0 0 1 1 1 1 2 2 2 2 160  5
M22  - 5 5 5 5 4 4 4 4 3 3 3 3 2 2 2 2 1 1 1 1 0 0 0 0 1 1 1 1 2 2 2 155  5
M23  - - 5 5 5 5 4 4 4 4 3 3 3 3 2 2 2 2 1 1 1 1 0 0 0 0 1 1 1 1 2 2 150  5
M24  6 6 6 5 5 5 5 4 4 4 4 3 3 3 3 2 2 2 2 1 1 1 1 0 0 0 0 1 1 1 1 - 155  6
M25  6 6 6 6 5 5 5 5 4 4 4 4 3 3 3 3 2 2 2 2 1 1 1 1 0 0 0 0 1 1 1 1 160  6
M26  - 6 6 6 6 5 5 5 5 4 4 4 4 3 3 3 3 2 2 2 2 1 1 1 1 0 0 0 0 1 1 1 155  6
M27  - - 6 6 6 6 5 5 5 5 4 4 4 4 3 3 3 3 2 2 2 2 1 1 1 1 0 0 0 0 1 1 150  6
M28  7 7 7 6 6 6 6 5 5 5 5 4 4 4 4 3 3 3 3 2 2 2 2 1 1 1 1 0 0 0 0 - 155  7
M29  7 7 7 7 6 6 6 6 5 5 5 5 4 4 4 4 3 3 3 3 2 2 2 2 1 1 1 1 0 0 0 0 160  7
M30  - 7 7 7 7 6 6 6 6 5 5 5 5 4 4 4 4 3 3 3 3 2 2 2 2 1 1 1 1 0 0 0 155  7
M31  - - 7 7 7 7 6 6 6 6 5 5 5 5 4 4 4 4 3 3 3 3 2 2 2 2 1 1 1 1 0 0 150  7
```

Signed and Sealed this

Fifth Day of February, 2002

*Attest:*

*Attesting Officer*

JAMES E. ROGAN
*Director of the United States Patent and Trademark Office*